(12) United States Patent
Kususe et al.

(10) Patent No.: US 7,511,311 B2
(45) Date of Patent: Mar. 31, 2009

(54) SEMICONDUCTOR LIGHT-EMITTING DEVICE, METHOD FOR MANUFACTURING THE SAME, AND LIGHT-EMITTING APPARATUS INCLUDING THE SAME

(75) Inventors: Takeshi Kususe, Tokushima (JP); Takahiko Sakamoto, Anan (JP)

(73) Assignee: Nichia Corporation, Anan-shi (JP)

(*) Notice: Subject to any disclaimer, the term of this patent is extended or adjusted under 35 U.S.C. 154(b) by 183 days.

(21) Appl. No.: 10/522,887

(22) PCT Filed: Aug. 1, 2003

(86) PCT No.: PCT/JP03/09836

§ 371 (c)(1),
(2), (4) Date: Dec. 22, 2005

(87) PCT Pub. No.: WO2004/013916

PCT Pub. Date: Feb. 12, 2004

(65) Prior Publication Data

US 2006/0231852 A1    Oct. 19, 2006

(30) Foreign Application Priority Data

Aug. 1, 2002   (JP)   ............... 2002-225043
Sep. 2, 2002   (JP)   ............... 2002-256884

(51) Int. Cl.
*H01L 21/00* (2006.01)
(52) U.S. Cl. .......................... 257/95; 257/94; 438/29; 438/39; 438/40

(58) Field of Classification Search .............. 257/90, 257/91, 94, 95, 96, 97, 98, 81, 99, 88, 79; 438/22, 26, 28, 29, 33–40, 42, 43, 45–47; 362/612, 545, 800
See application file for complete search history.

(56) References Cited

U.S. PATENT DOCUMENTS 3,813,587 A    5/1974    Umeda et al.
3,900,863 A    8/1975    Kim (Continued)

FOREIGN PATENT DOCUMENTS

EP            0 042 484 A    12/1981

(Continued)

OTHER PUBLICATIONS

Stath, N., "Nano Technology Drives Led Advancements", Frontiers in Materials Science & Technology, International Materials Forum 2005, Aug. 2005, 25 pages, Osram Opto Semiconductors GmbH, Regensburg.

*Primary Examiner*—Zandra Smith
*Assistant Examiner*—Paul E Patton
(74) *Attorney, Agent, or Firm*—Smith Patent Office

(57) ABSTRACT

A nitride semiconductor light-emitting device includes a layered portion emitting light on a substrate. The layered portion includes an n-type semiconductor layer, an active layer, and a p-type semiconductor layer. The periphery of the layered portion is inclined, and the surface of the n-type semiconductor layer is exposed at the periphery. An n electrode is disposed on the exposed surface of the n-type semiconductor layer. This device structure can enhance the emission efficiency and the light extraction efficiency.

22 Claims, 45 Drawing Sheets

U.S. PATENT DOCUMENTS

| | | | | |
|---|---|---|---|---|
| 5,593,917 | A | * | 1/1997 | Nuyen .................... 438/28 |
| 5,670,797 | A | * | 9/1997 | Okazaki .................. 257/91 |
| 5,998,925 | A | | 12/1999 | Shimizu et al. |
| 6,229,160 | B1 | * | 5/2001 | Krames et al. ............ 257/94 |
| 6,307,218 | B1 | | 10/2001 | Steigerwald et al. |
| 6,346,771 | B1 | | 2/2002 | Salam |
| 6,410,942 | B1 | * | 6/2002 | Thibeault et al. ........... 257/88 |
| 6,459,130 | B1 | * | 10/2002 | Arndt et al. .............. 257/432 |
| 6,552,487 | B1 | | 4/2003 | Ellens et al. |
| 6,649,946 | B2 | | 11/2003 | Bogner et al. |
| 6,677,173 | B2 | | 1/2004 | Ota |
| 7,258,816 | B2 | | 8/2007 | Tamaki et al. |
| 2001/0033135 | A1 | * | 10/2001 | Duggal et al. ............ 313/506 |
| 2001/0042860 | A1 | * | 11/2001 | Hata et al. ............... 257/21 |
| 2002/0017651 | A1 | * | 2/2002 | Kato et al. ............... 257/89 |
| 2002/0017652 | A1 | | 2/2002 | Illek et al. |
| 2002/0117677 | A1 | * | 8/2002 | Okuyama et al. ........... 257/94 |
| 2003/0141506 | A1 | * | 7/2003 | Sano et al. ............... 257/78 |
| 2003/0230754 | A1 | * | 12/2003 | Steigerwald et al. ......... 257/91 |
| 2004/0072383 | A1 | | 4/2004 | Nagahama et al. |
| 2004/0084682 | A1 | | 5/2004 | Illek et al. |
| 2004/0113167 | A1 | | 6/2004 | Bader et al. |
| 2005/0205845 | A1 | | 9/2005 | Delsing et al. |
| 2005/0258444 | A1 | | 11/2005 | Windisch et al. |
| 2006/0076883 | A1 | | 4/2006 | Himaki et al. |

FOREIGN PATENT DOCUMENTS

| | | |
|---|---|---|
| GB | 1 553 783 A | 10/1979 |
| JP | 49-5585 A | 1/1974 |
| JP | 52-124885 A | 10/1977 |
| JP | 56-115534 A | 9/1981 |
| JP | 57-028380 A | 2/1982 |
| JP | 62-005674 A | 1/1987 |
| JP | 5-275738 | 10/1993 |
| JP | 6-112527 A | 4/1994 |
| JP | 8-330629 A | 12/1996 |
| JP | 9-008266 A | 1/1997 |
| JP | 11-330559 A | 11/1999 |
| JP | 2001-274507 A | 10/2001 |
| JP | 2001-313422 A | 11/2001 |
| JP | 2003-68109 A | 3/2003 |
| WO | WO 2004-017430 A | 2/2004 |

* cited by examiner

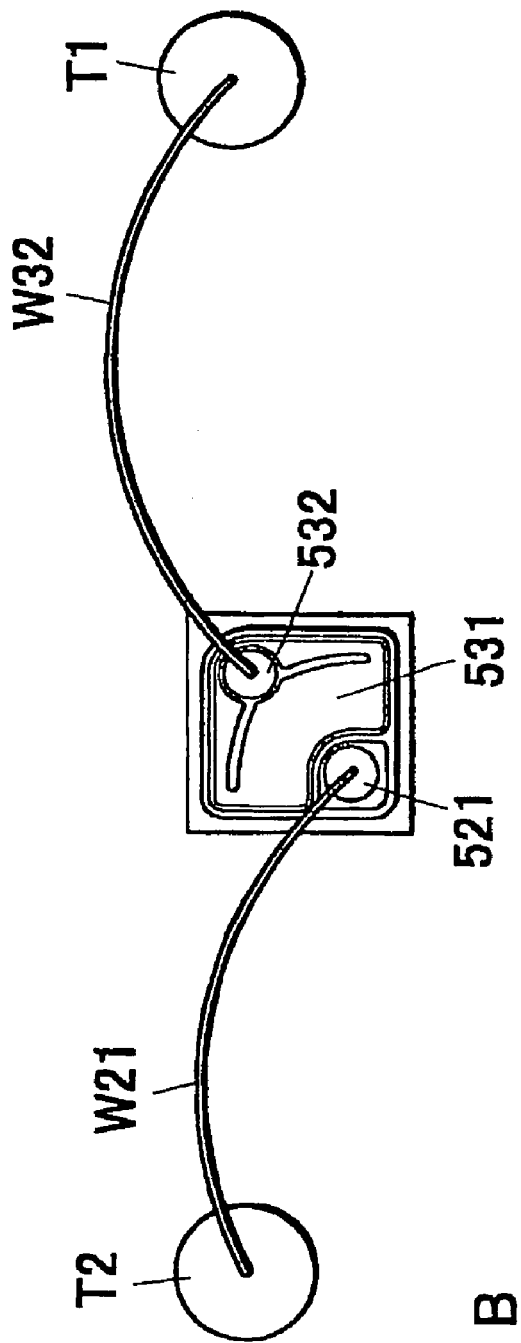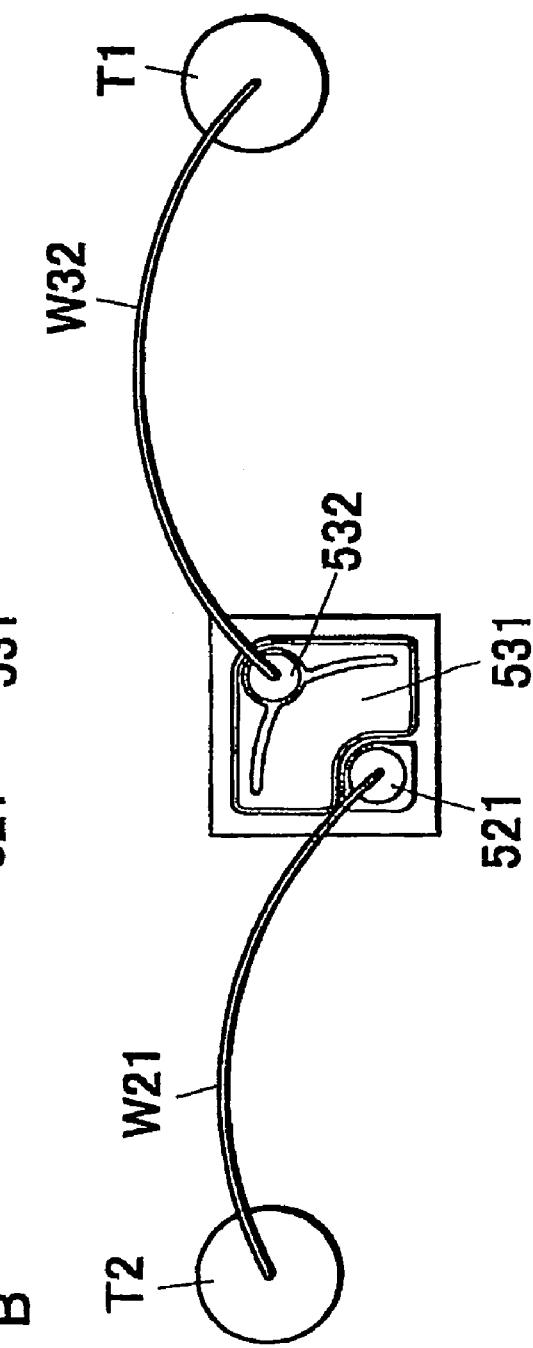
FIG. 29 A
FIG. 29 B

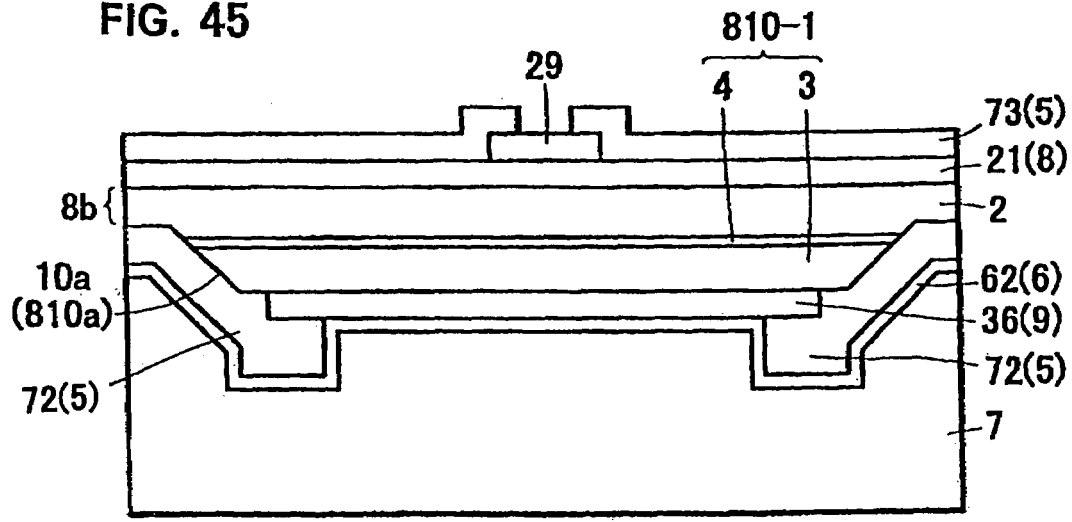
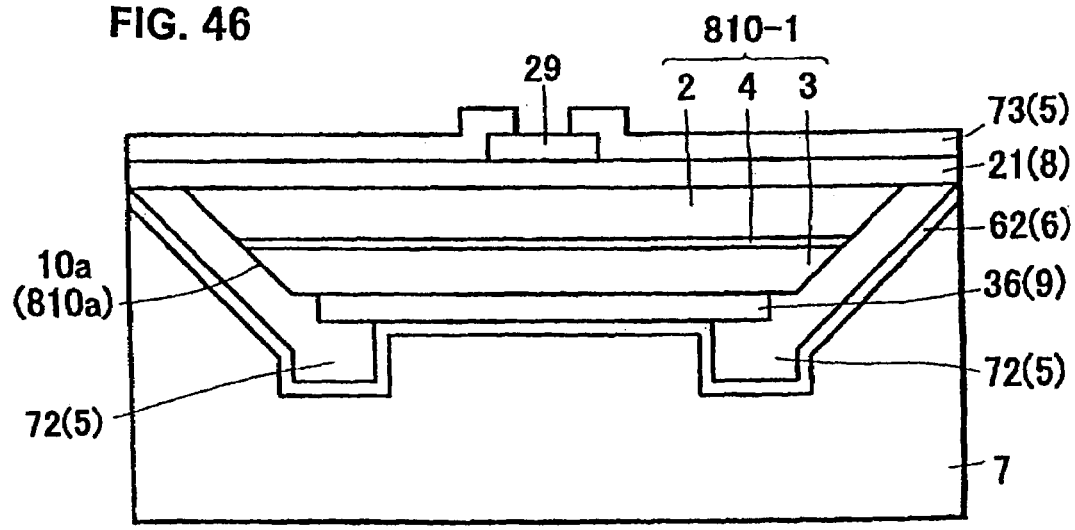

FIG. 58
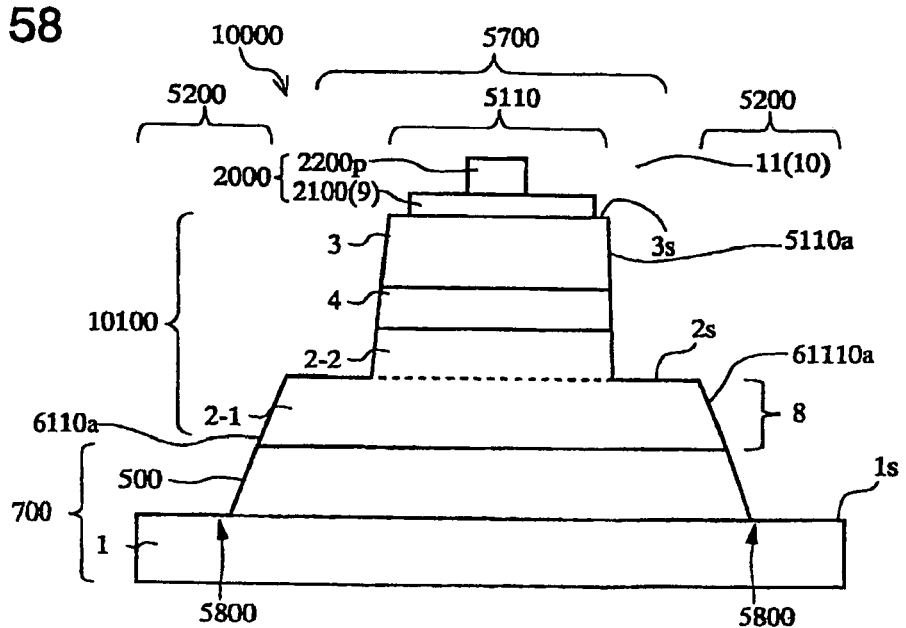
FIG. 59A
FIG. 59B
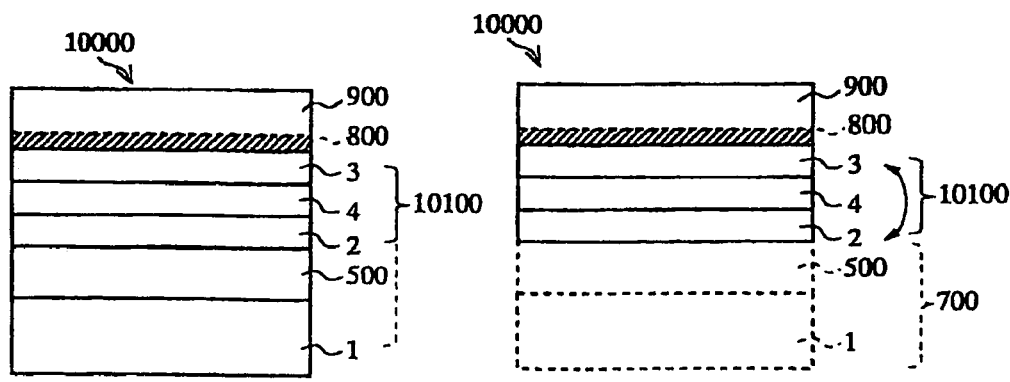

SEMICONDUCTOR LIGHT-EMITTING DEVICE, METHOD FOR MANUFACTURING THE SAME, AND LIGHT-EMITTING APPARATUS INCLUDING THE SAME

TECHNICAL FIELD

The present invention relates to semiconductor light-emitting devices, and particularly to a light-emitting device including a nitride semiconductor containing nitrogen, and to a method for manufacturing the same. Specifically, the nitride semiconductor light emitting device includes GaN, AlN, InN, and their mixed crystals, group III-V nitride semiconductors ($In_b Al_c Ga_{1-b-c} N$, $0 \leq b$, $0 \leq d$, $b+d<1$), and is used in light-emitting apparatuses, projectors, cluster lamps, illuminations, optical coupling devices, optical detectors, optical communication devices, light sources of optical fiber modules, and so forth.

BACKGROUND ART

Light-emitting diodes including gallium nitride compound semiconductors are increasingly used particularly for relatively short wavelength regions, such as ultraviolet region and the blue region, in recent years. Since the gallium nitride semiconductor is of direct transition and has a high luminous efficiency, the range of its applications is expanding, accordingly.

For such light-emitting devices, various structures have been proposed, particularly in the shape of the semiconductor composite and the structure and arrangement of electrodes.

DISCLOSURE OF INVENTION (First Aspect)

The object of the present invention is to provide a high-power, reliable light-emitting device including a semiconductor composite or layered portion having a shape ensuring high luminous efficiency and, particularly, superior light extraction efficiency and heat radiation characteristics. For example, the light-emitting device includes a structured composite, or layered structure, including a luminescent layer disposed between a first conductivity type layer and a second conductivity type layer. The structured composite includes a structured portion including the luminescent layer, and has an inclined periphery at a junction (p-n junction) of the first and second conductivity type layers, the surface of the substrate, and an electrode-forming surface. The lower surface of the inclined structured portion is formed in a square or polygonal shape. The inclined periphery includes inclined side surfaces so that the corners of the lower surface of the structured portion are curved or cut off in such a manner that the width of the side surfaces gradually increase upward from the lower surface. In a light-emitting device having a luminescent portion close to the upper surface rather than the lower surface, this structure helps the light emitted from the luminescent portion to reflect and diffuse at the inclined side surfaces in the corners close to the luminescent portion, thus efficiently extracting the light outward.

Specifically, the light-emitting device has the following structure.

The semiconductor light-emitting device 10000 has a structure including a luminescent layer 4 disposed between a first conductivity type layer 2 and a second conductivity type layer 3. At least part of the structure defines a structured portion 10 which has a lower surface 10g with a width and an upper surface 10f with a smaller width than that of the lower surface 10f in sectional view, and inclined opposing side surfaces: first side surfaces 10x; and second side surfaces 10y. The width of the first side surfaces 10x increases from the lower surface 10g side toward the upper surface 10f; the width of the second side surfaces 10y increases from the upper surface 10f side toward the lower surface 10g. More specifically, the structured portion 10 of the device has the lower surface 10a and the upper surface 10f with a smaller area than that of the lower surface 10g, and the side surfaces 10x between the dotted chain lines 10x-1 and 10x-2 define the corners 10g-x and 10f-x of the structured portion 10 of the device and have a width increasing toward the upper surface 10f from the lower surface 10g, as shown in FIGS. 53A and 53C. On the other hand, the side surfaces 10y are formed so as to have a width decreasing toward the upper surface. Thus, the widths of the side surfaces 10x and 10y are varied in reverse to each other in the height direction (toward the upper surface) of the structured portion, that is, the width of the side surfaces 10x is increased; the width of the side surfaces 10y is reduced. Accordingly, the proportion of lengths of the sides defining a plane at a certain height (a plane parallel to the upper surface of the structured portion or a plane having a normal in the height direction) varies, and the proportion of occupancies of the side surfaces above the plane also varies. Consequently, reflection of light emitted from the light-emitting device, designated by the arrows in FIG. 53B, from the side surfaces to the lower surface is diffused, as shown in FIG. 53B. Thus, the light-emitting device exhibits superior uniformity and light extraction though, in light-emitting devices, light is generally liable to be concentrated.

In the semiconductor light-emitting device, the first side surfaces 10x are formed in the corners defined by the sides 10g-1 and 10g-2 of the lower surface 10g. For example, as shown in FIG. 53A showing a structured portion 10, FIG. 53B being a fragmentally enlarged view of FIG. 53A, and FIG. 53C showing another form of the structured portion 10, the structured portion 10 is defined by a lower surface 10g in a square or polygonal shape, an upper surface, and an inclined periphery such that the width in sectional view of the structured portion 10 decreases toward the upper surface from the lower surface 10g, and the first side surfaces 10x are each formed such that the corners of the lower surface or upper surface are curved or cut off. The side surfaces 10x can reflect light propagated in the light-emitting device effectively toward the lower surface, or allow the light to be extracted from the upper surface side.

In the semiconductor light-emitting device, the luminescent layer is disposed inside the structured portion. As designated by the dotted lines 4 in FIGS. 53A to 53D, the luminescent layer functioning as the light source of the light-emitting device is provided between the upper surface and the lower surface of the structured portion having the above-described shape. Consequently, light can be reflected at the side surfaces and extracted at a short distance from the light source, reducing undesirable propagation inside the device. Thus, the light-emitting device can exhibit high light-extraction efficiency.

In the semiconductor light-emitting device, the lower surface may have a square or polygonal shape, the second side surfaces are formed on the sides of the lower surface, and the first side surfaces are formed in the corners of the lower surface. The corners 10x or first side surfaces 10x are formed in divergent shapes whose width increases toward the upper surface, while the second side surfaces 10y are formed in another divergent shape whose width increases toward the lower surface and the bases of the second surfaces 10y define the sides 10g-1 and 10g-2 of the lower surface. Thus, the lower surface can be formed in a desired shape, and the shape of the corners can be diverged upward. Thus, the light-emitting device of the present invention can be achieved in various shapes.

The structured portion of the semiconductor light-emitting device may be of frustum. By forming the structured portion in frustum, as in the below-described second and third aspects, the degree of in-plane integration is increased, and the resulting light-emitting device can exhibit a high processing precision, advantageously.

In the semiconductor light-emitting device, the first side surfaces may be curved to be convex outward. As shown in FIG. 53B, by curving the first side surfaces and the second side surfaces at different curvature radiuses, or by curving the first side surfaces and forming the second side surfaces flat, light can be diffused in various directions to be reflected or extracted. Thus, the concentration of light is reduced.

In the semiconductor light-emitting device, the first side surfaces may define rounded sides of the lower surface and the upper surface, and the curvature radius of the rounded sides of the upper surface may be larger than that of the lower surface. For example, as shown in FIG. 53B, by increasing the curvature radius upward, light propagation characteristics in the direction of the normal of the upper surface vary from those of the inclined surface (region where the inclined surface is projected in the direction of the normal), and light propagation in the in-plane direction can be promoted. In addition, the curved surface whose curvature radius increasing toward the upper surface, as shown in FIG. 53B, leads to a high precision in forming a mask. Accordingly, the precision in forming electrodes and a protective layer on the inclined surfaces can be increased. Thus, a precise device structure can be provided and the resulting device can exhibit superior characteristics.

The light-emitting device may have a plurality of the structured portion, and an electrode structure is provided so that the structured portions substantially simultaneously emit light.

The light-emitting device may have a pair of a positive electrode and a negative electrode on the same surface side over the upper surface of the structured portion. This structure can lead to the same structure as in a second aspect described later.

In the light-emitting device, one of the pair of the electrodes may cover part of the periphery of the structured portion.

In the light-emitting device, the structured portions may be disposed separately on a substrate, and electrodes are provided so that the structured portions substantially simultaneously emit light.

The upper surface of the structured portion defines a mounting surface which opposes a mounting base when the light-emitting device is disposed on the mounting base. One of the pair of the electrodes is disposed on the surface of a substrate, and the other comprises a wiring structure disposed on the mounting base side so as to be connected to the upper surfaces of the separately disposed plurality of the structured portions. Specifically, as shown in FIG. 16B, one of the electrodes is disposed on the semiconductor multilayer board side; the other, on the mounting surface side. Thus, this structure makes efficient use of space. For example, various devices, such as a reflection film, a light-extraction film, and a light-transforming member, can be disposed in the spaces between the structured portions. In addition, if the positive and negative electrodes are disposed in a solid intersection separated by an insulating layer, on the board side, leakage resulting from the solid intersection can be overcome.

The light-emitting device according may have a pair of electrodes disposed separately on the upper surface side of the structured portion and on the lower surface side. The pair of the electrodes are respectively disposed on the surface of the first conductivity type layer and the surface of the second conductivity type layer. This structure can be applied to a light-emitting device in which electrodes oppose each other, according to a third aspect described later.

The light-emitting device may further include a light-transmissive insulating layer covering the periphery of the structured portion, and a filling member around the periphery with the light-transmissive insulating layer therebetween. When the periphery of the structured portion acts as a reflector from which light reflect inward, as described above, light leaked outward can be reflected at the light-transmissive layer covering the periphery and the surface at the structured portion side of, for example, a metal reflection film. Thus, light-emitting device has several reflection structures in the outer region to enhance the light control and emission efficiency.

The light-emitting device may have a plurality of the structured portion, and the structured portions are separated from one another by a protruding filling member. As in the third aspect described later, the filling member, a metal member 7 may be used as the filling member. Thus, the resulting device can exhibit superior heat radiation, light reflection, and mechanical strength.

The luminescent layer may be disposed inside the structured portion, and the filling member protrudes below the luminescent layer toward the lower surface side of the structured portion. Thus, the filling member is positioned close to the light-emitting device being a heat and light source to provide an improved structure.

(Second Aspect)

Gallium nitride compound semiconductors are generally deposited on an insulating sapphire substrate, and this causes the following problems: First, both the n electrode and the p electrode must be formed above a gallium nitride semiconductor on the sapphire substrate, and particularly the n electrode is disposed in the non-luminescent region. The n electrode repeatedly reflects and absorbs light generated from the luminescent region while the light is propagating in the GaN layer in the lateral direction. Thus, the extraction efficiency is undesirably reduced. Second, although emitted light is generally extracted in the direction perpendicular to the surface of the substrate, relatively high proportion of light is emitted through the periphery of the light-emitting diode. Consequently, emitted light cannot be efficiently used, disadvantageously.

Accordingly, an object in the second aspect of the present invention is to provide a nitride semiconductor light-emitting device which prevents repetitive reflection under the n electrode to reduce the absorption by the n electrode, and thus exhibits a high extraction efficiency. Another object is to provide a nitride semiconductor light-emitting device in which emitted light is efficiently used.

In view of the above-describe problems, the second aspect of the present invention is directed to a nitride semiconductor light-emitting device including: a substrate; a layered portion emitting light disposed on the substrate; and an n electrode. The layered portion includes an n-type semiconductor layer, an active layer, and a p-type semiconductor layer, and has an inclined periphery at which the surface of the n-type semiconductor layer is exposed. The n electrode is disposed on the surface of the n-type semiconductor layer. The nitride semiconductor light-emitting device having such a structure can increase the light extraction efficiency.

Preferably, the n electrode is formed so as to surround the layered portion. Thus, current is efficiently injected into the structured composite of the device even if the surface in contact with the electrode (surface for current injection into the semiconductor composite) has a small area.

In the nitride semiconductor light-emitting device, the n electrode may continuously extend to the lower surface of the substrate through the side surfaces of the substrate. When light is emitted through a light-transmissive p ohmic electrode, the above-described structure allows light reflected from the side surfaces and the lower surface of the substrate to be emitted through the light-transmissive electrode. Thus, the light extraction efficiency can be increased.

The nitride semiconductor light-emitting device may have a plurality of the layered portion emitting light. Thus, a large-area nitride semiconductor light-emitting device having a high emission efficiency can be provided.

In the nitride semiconductor light-emitting device having the plurality of layered portions, the respective n-electrodes for the layered portions may be connected to each other to define a common electrode. Thus, the layered portions being luminescent regions can be readily connected in parallel.

In the nitride semiconductor light-emitting device having the plurality of layered portions, the layered portions may have respective p ohmic electrodes in ohmic contact with the respective p-type semiconductor layers, and the p ohmic electrodes are connected to each other, in addition to connecting the respective n-electrodes to each other to define a common electrode. Thus, the resulting nitride semiconductor light-emitting device has the layered portions being the luminescent regions connected in parallel. Both positive and negative wiring electrodes electrically connecting the layered portions may be provided on the substrate side. Alternatively, one (n-type layer being the first conductivity type layer lying on the substrate side) of the electrodes may be disposed on the substrate side, for example, on the surface of the substrate or on the exposed surface (electrode-forming surface) of the first conductivity type layer exposed at the layered portion, and the other electrode (p-type layer being the second conductivity type layer lying more distant from the substrate than the first conductivity type layer) may be disposed on the mounting side, that is, the side opposing a mounting base on which the device is mounted, such as a heat sink or a submount, or opposing a device-mounting portion or a mounting lead of a light-emitting apparatus so that the electrodes disposed above the plurality of layered portions are connected to each other. Also, the electrode may be disposed on the mounting base (mounting device) side or mounting portion of the light-emitting apparatus, outside the light-emitting device. This arrangement allows the plurality of layered portions to be precisely connected to each other even if the protruding layered portions have rough upper surfaces and are difficult to wire precisely. Also, other structures, such as a reflection layer, insulating layer, or a protective layer can easily be formed, and thus an appropriate device structure can be provided.

If light is emitted through the substrate in the nitride semiconductor light-emitting device, it is preferable that the layered portion is covered with a reflection layer to increase the light-extraction efficiency. In this instance, the substrate is preferably transparent. The transparent substrate is advantageous because of high transmission of light and electromagnetic waves emitted from the light-emitting device, and less self-reduction.

In the nitride semiconductor light-emitting device, the metal layer serves as a connecting electrode for connecting the p ohmic electrodes of the p-type semiconductor layers of the layered portions.

In the nitride semiconductor light-emitting device, the reflection layer may be of a metal layer covering the layered portion with an insulating layer therebetween, or of a dielectric multilayer film. Alternatively, by appropriately adjusting the refractive index of the semiconductor materials of the light-emitting layered portion, a light and electromagnetic wave-transmissive insulating film whose refractive index is also adjusted may be used as the reflection layer. This layer may be of a multilayer film. For example, a dielectric multilayer film made of a distributed Bragg reflector (DBR), a light-reflection film, and an insulating film may be used in combination.

In the nitride semiconductor light-emitting device, the inclined periphery may have a convex surface protuberating outward. By giving the periphery a convex surface, a curved convex surface, protruding surfaces, a curved surface, or polyhedral surfaces, and by combining the periphery structure with the convex corners of the structured portion in the first aspect, light reflection control, increase of the light-extraction efficiency, and control of the light density (particularly in the luminescent portion) can be achieved more effectively.

According to the second aspect of the present invention, the nitride semiconductor light-emitting device has the inclined periphery, and the n electrode is disposed on the surface of the n-type nitride semiconductor layer exposed at the periphery, so that light absorption by the n electrode can be prevented to increase the light-extraction efficiency. In particular, since the substrate and the layered portion have different refractive indexes, and the electrode of the first conductivity type layer (n electrode) is disposed on the inclined periphery of the layered portion, light in the light-emitting layered portion can be propagated to the optically connected by the periphery. In since the electrode extends from the periphery of the layered portion to the substrate, the area of the electrode in contact with the device can be reduced.

(Third Aspect)

Japanese Unexamined Patent Application Publication No. 2001-313422 (page 6, right column, line 8 to page 7, left column, line 42, FIGS. 8 and 9) has disclosed a method is liable to result in a short circuit between the p layer and the n layer at the cross-section between the devices (side surfaces of the device after cutting), disadvantageously. Accordingly, a second object (first and second light-emitting devices) of the present invention is to provide a nitride semiconductor light-emitting device having a structure capable of preventing a short circuit at the side surfaces, and a method for manufacturing the same. Japanese Unexamined Patent Application Publication No. 8-330629 (FIGS. 1 to 3) has been known.

In view of this object (second object), a first nitride semiconductor light-emitting device is provided according to the third aspect of the present invention. The nitride semiconductor light-emitting device includes: an n-type nitride semiconductor layer; p-type nitride semiconductor layer; and a luminescent layer formed of a nitride semiconductor between the n-type nitride semiconductor layer and the p-type nitride semiconductor layer. At least the p-type nitride semiconductor layer and the luminescent layer define a frustum layered composite, and the layered composite is embedded in a metal member so that the periphery of the layered composite is isolated. By use of the metal member being a filling member, the strength of the epitaxial layer (growth layer) can be enhanced in a device having a plurality of protruding layered composites on a wafer. Also, by embedding the filling portion between the protruding layered composites (luminescent structured portions) or recesses formed around the layered composites, the filling member can be disposed relatively close to the operational portion (luminescent portion) of the device to contribute to radiation of heat generated from the operational portions (composites). Thus, heat radiation of the device can be enhanced, and the light-emitting device can exhibit high power and large-current operation. By disposing the filling member in the vicinity of the luminescent portion, it can function as a reflection film or reflector, or the base of the resulting structure.

A second nitride semiconductor light-emitting device according to the third aspect of the present invention includes: an n-type nitride semiconductor layer; p-type nitride semiconductor layer; and a luminescent layer formed of a nitride semiconductor between the n-type nitride semiconductor layer and the p-type nitride semiconductor layer, wherein at least the p-type nitride semiconductor layer and the luminescent layer define a frustum layered composite, and the layered composite is supported by a metal member opposing the surface of the layered composite.

In the nitride semiconductor light-emitting device having such a structure, the layered composite is embedded in the metal member so that the periphery of the layered composite is isolated, and the periphery does not damaged during or after cutting. The reliability is therefore increased.

The nitride semiconductor light-emitting device according to the present aspect can have electrodes on both sides. Thus, the luminescent region can be increased in comparison with the nitride semiconductor light-emitting device having positive and negative electrodes on one side.

In the first and the second nitride semiconductor light-emitting device, preferably, the surface of the metal member opposite to the surface opposing to the layered composite is flat.

Thus, the device can be readily mounted on a mounting base in such a manner that the flat surface opposes the mounting base.

The first and the second nitride semiconductor light-emitting device may further include a transparent electrode on one of two opposing surfaces of the n-type nitride semiconductor layer, and the other surface has the layered composite, so that light is emitted through the transparent electrode. The transparent electrode transmits light and electromagnetic waves in the device and diffuse injected current in a plane of the device, thus functioning as a transmissive current-diffusing conductor. The transparent electrode may comprise a transparent conductive film or a metal film having an opening or window for transmitting light and electromagnetic waves, and is formed, for example, in a grid, branch, or radial manner.

This structure allows uniform current injection to the entire luminescent layer, and thus light can be uniformly emitted. Preferably, the transparent electrode is made of ITO because ITO is highly light-transmissive and can reduce the resistance. In addition, an oxide conductive film, an oxide semiconductor, and a transparent conductive film may be used as the transparent electrode.

Preferably, the first and the second nitride semiconductor light-emitting device further includes a p electrode containing Rh, and the p electrode is disposed between the layered composite and the metal member to establish an ohmic contact with the p-type nitride semiconductor layer. Thus, peel of the electrode can be prevented. The p electrode may be formed of materials suitable as the electrode, such as noble metals and elements of the platinum group, and Rh is the most suitable from the viewpoint of reflectivity and adhesion.

In the first and the second nitride semiconductor light-emitting device, the layered composite may include a part or the entirety of the n-type nitride semiconductor layer.

In the first and the second nitride semiconductor light-emitting device, preferably, the metal member has a thickness of 50 μm or more from the viewpoint of maintaining the shape of the luminescent region with reliability.

The first and the second nitride semiconductor light-emitting device may have a plurality of the layered composite. Thus, a large-area light-emitting device can be provided.

In the light-emitting device having the plurality of layered composites, the n-type nitride semiconductor layer may be common to the plurality of the layered composites and the plurality of the layered composites are disposed on the common n-type nitride semiconductor layer.

According to the third aspect of the present invention, the nitride semiconductor light-emitting device, which includes an n-type nitride semiconductor layer, p-type nitride semiconductor layer, and a luminescent layer formed of a nitride semiconductor between the n-type nitride semiconductor layer and the p-type nitride semiconductor layer, has a frustum layered composite including at least the p-type nitride semiconductor layer and the luminescent layer, and the layered composite is embedded in a metal member so that the periphery of the layered portion is isolated. Therefore, the periphery of the layered composite can be prevented from being damaged during and after cutting. Thus, the reliability of the nitride semiconductor light-emitting device of the present invention can be increased.

(Fourth Aspect)

According to a fourth aspect of the present invention, a light-emitting apparatus is provided which includes the light-emitting device according to any one of the first to third aspects. The structure of the apparatus is as follows:

The light-emitting apparatus includes the light-emitting device and a mounting portion on which the light-emitting device is placed. The light emitting device is mounted on a support and then placed on the mounting portion.

In another form, the light-emitting apparatus includes the light-emitting device and a light-transforming member for transforming part of light emitted from the light-emitting device into light having a different wavelength.

Preferably, the light-transforming member comprises an aluminum garnet phosphor containing Al; at least one element selected from the group consisting of Y, Lu, Sc, La, Gd, Tb, Eu, and Sm; one of Ga and In, and at least one element selected from the rare earth elements.

Preferably, the light-transforming member comprises a phosphor expressed by $(Re_{1-x}R_x)_3(Al_{1-y}Ga_y)_5O_{12}$ ($0<x<1$ and $0 \leq y \leq 1$, wherein Re represents at least one element selected from the group consisting of Y, Gd, La, Lu, Tb, and Sm; and R represents Ce or Ce and Pr).

Alternatively, the light-transforming member may comprise a nitride phosphor containing N; at least one element selected from the group consisting of Be, Mg, Ca, Sr, Ba, and Zn; and at least one element selected from the group consisting of C, Si, Ge, Sn, Ti, Zr, and Hf, and is activated by at least one element selected from the rear earth elements.

The nitride phosphor may be expressed by the general formula $L_XSi_YN_{(2/3X+4/3Y)}$:Eu or $L_XSi_YO_ZN_{(2/3X+4/3Y-2/3Z)}$:Eu (L represents Sr, Ca, or Sr and Ca).

The features according to the first aspect include those of the second and the third aspect, and can be applied to them. For example, the second aspect leads to an embodiment according to the first aspect which has a pair of a positive electrode and a negative electrode, for example, the electrode (p electrode) of the first conductivity type layer (p-type layer) and the electrode (n electrode) of the second conductivity type layer (n-type layer), on the same side of the substrate. The third aspect leads to an embodiment according to the first aspect in which a pair of a positive electrode and a negative electrode, for example, the electrode (p electrode) of the first conductivity type layer (p-type layer) and the electrode (n electrode) of the second conductivity type layer (n-type layer), oppose each other with the structured composite of the light-emitting device therebetween. In the second and the third aspect, light-emitting devices using nitride semiconductors will be described as the light-emitting device according to the first aspect. However, the invention (according to the first, the second, and the third aspect) is not limited to the nitride semiconductor device. In the second and the third aspect, the first conductivity type layer is the n-type nitride semiconductor layer; the second conductivity type layer is the p-type nitride semiconductor layer. However, the conductivity type layers may be reversed. The same goes for the electrodes disposed for the respective conductivity type layers (the first and the second conductivity type player). The last two digits of the reference numerals shown in the drawings and the specification represent components used in the invention, embodiments, examples, and the corresponding figures, and the components having the same numeral in the last two digits correspond to each other. For numerals whose last two digits are "00", the last three or four digits represent the same as in the above-described last two digits. The second digit from the right may represent a modification having the similar structure. For example, for the layered structure 10 of the light-emitting device, tens in the layered structure represent specific layers; twenties, the electrode (n electrode) of the first conductivity type layer (n-type layer); thirties, the electrode (p electrode) of the second conductivity type layer (p-type layer); and sixties, the connecting electrode (wiring electrode). The figures are each a schematic illustration, and may partially be exaggerated.

BRIEF DESCRIPTION OF THE DRAWINGS

FIGS. 29A and 29B are a plan view of a light-emitting device used as a reference in the comparative examples of Embodiment 6 of the present invention.

FIG. 45 is a sectional view of a nitride semiconductor light-emitting device according to a modification of Embodiment 9.

FIG. 46 is a sectional view of a nitride semiconductor light-emitting device according to a modification of Embodiment 9, different from the device shown in FIG. 45.

FIG. 58 is a schematic sectional view of a device structure of the light-emitting device according to the present invention.

FIGS. 59A and 59B are schematic sectional views for describing the removal of the substrate of the light-emitting device according to the present invention.

BEST MODE FOR CARRYING OUT THE INVENTION (First Aspect)

In view of a first aspect of the present invention, the light-emitting device of the present invention has a protruding structured portion disposed in at least part of the device, and more preferably in an operational portion (current injection area of the device) of the device. The structured portion may be used for a non-operational portion (current non-injection area) of a device layered structure or other members, such as a light-transmissive member in the light-emitting device. Examples of the structured portion 10 are shown in FIGS. 53A to 53D: A and C are schematic perspective views of the examples, and the other figures are a fragmentary enlarged view of FIG. 53A and a plane view showing the upper surface of the structured portion shown in FIG. 53A.

Figure 52A:
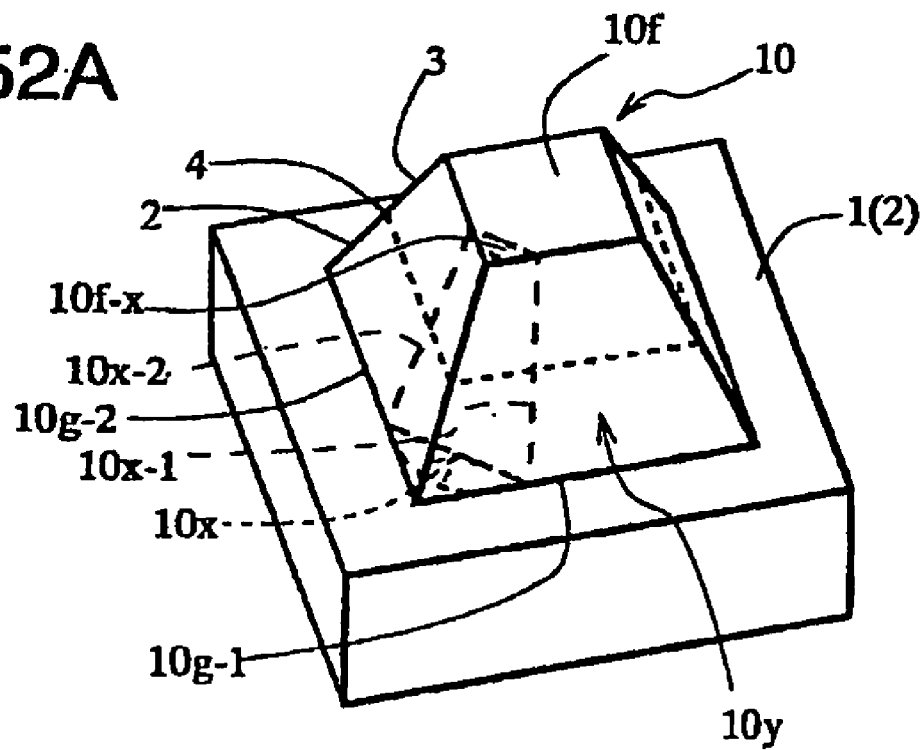
FIGS. 52A and 52B are schematic perspective views of the shape of a structured composite 10 according to the first aspect.
Figure 52B:
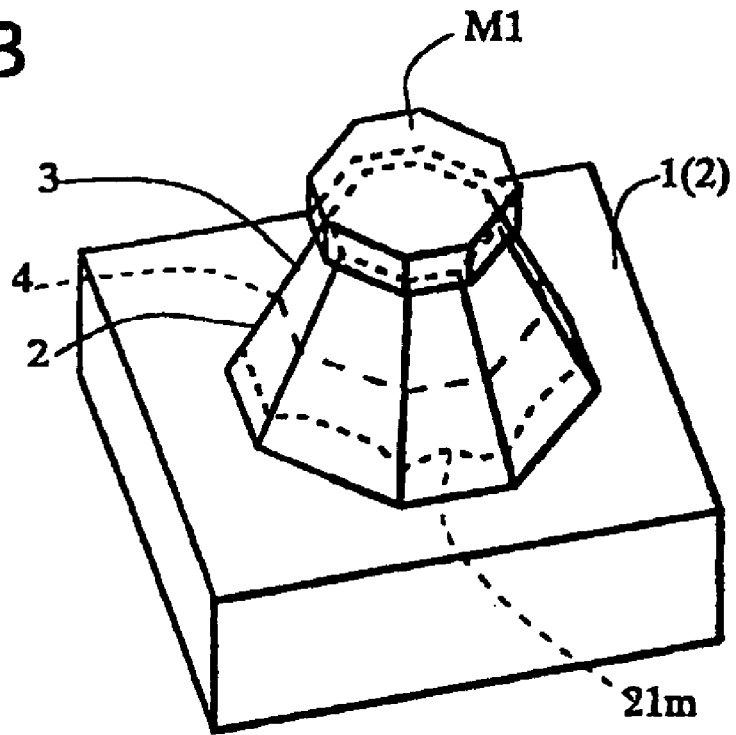

For comparison with the first aspect, FIGS. 52A and 52B show another form of the structured portion 10. In FIG. 52A, the structured portion is formed in a frustum of a pyramid having a square lower surface 10g. The corners of the structured portion are cut off along dotted lines 10x-1 and 10x-2 to form a frustum of polygonal, as shown in FIG. 52B. Consequently, each side surface defining the periphery of the structured portion has a width decreasing toward the upper surface from the lower surface 10g. Also, the sides defined by the periphery and a cross section at a height of the structured portion, having a normal in the height direction of the structured portion have a constant length proportion at any height. If such a protruding structured portion includes a luminescent layer 4 inside, light reflects large from the periphery at the sides of the luminescent layer and the other area of the periphery slightly reflect the light. In addition, the upper surface cannot control the reflection sufficiently, and the intensity of the light is reduced in the direction of the normal of the upper surface, accordingly. Also, the strength of reflection from the vicinity of the luminescent layer 4 is increased in comparison with the reflection from the other areas of the periphery. Consequently, light is disproportionately emitted in a ring shape.

In addition, when an electrode is provided according to a second aspect described later in a manufacturing process, the precision of the electrode shape tends to be degraded, as designated by the dotted line 21m in FIG. 52B. This is because if the width of the chamfers of the protrusion 10 is small on the upper surface side, a mask or other resist does not sufficiently reach the side surfaces, and consequently the mask often protrudes in the lateral direction at the shoulders of the chamfers, as shown in the figure illustrating a state where a mask M1 is formed on the protrusion 10. In particular, if the length of the sides of the upper surface 10f is small, the mask protrudes notably, and the electrode 21m is formed in an unstable shape accordingly. The unstable shape of the electrode often brings about a serious problem in the case where the second aspect is applied, where the structure cannot ensure an area sufficient to form the electrode.

Furthermore, if an electrode is formed on the upper surface 10f, as shown in FIG. 52A, and current is injected to the electrode, the current is liable to be nonuniform in the regions around the corners and shorter sides of the upper surface.

The present invention is intended to overcome the above-described problems. Specifically, the invention provides a protruding structured portion 10 having an inclined periphery which includes first side surfaces 10x, each having a width or a curvature radius increasing upward. Thus, the shape of the cross section at a height of the structured portion, for example, the proportion of the lengths of the sides defining the cross section, is varied large depending on the height to exhibit a variety of shapes of the periphery viewed from above. As a result, nonuniformity in directivity of light can be reduced in the regions in the periphery from which light is reflected or extracted. Also, since the upper surface has large areas sufficient for current injection in the corners, nonuniformity of current can be reduced. Furthermore, since the upper base of the side surface is longer or curved, the protrusion of the resist can be reduced and a structured portion suitable for processing of devices or elements, such as electrodes, can be provided. Thus, the resulting light-emitting device can exhibit superior reliability and mass-productivity.

The structured portion according to the first aspect can be formed by appropriately selecting the shape or thickness of the mask M1, for example, by varying the thickness of the mask M1 or layering masks having different shapes, as shown in FIGS. 20A to 20C and 44A to 44C.

Figure 53A:
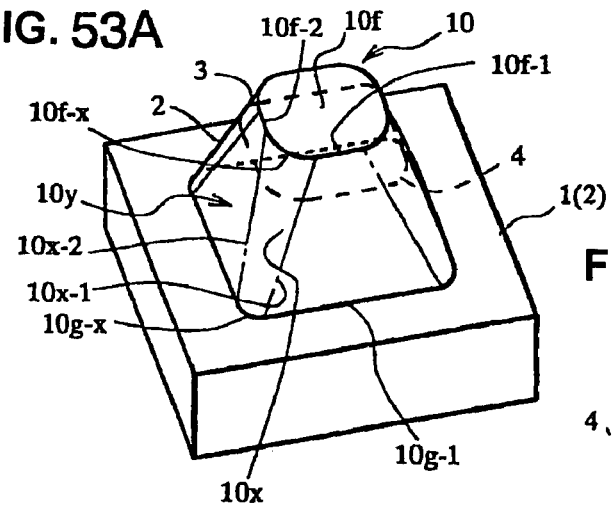
FIGS. 53A and 53C are schematic perspective views of the shape of the structured composite 10 according to the first aspect.
Figure 53B:
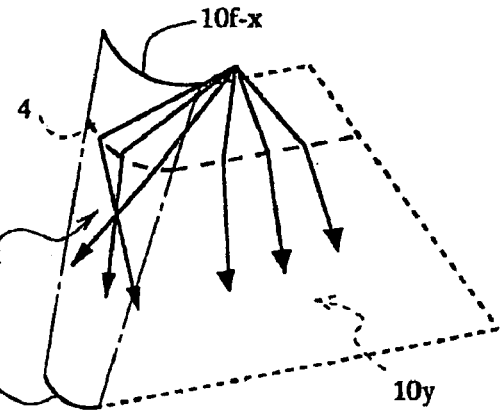
FIG. 53B is an enlarged perspective view of part (side surfaces 10x and 10y) of FIG. 53A.
Figure 53C:
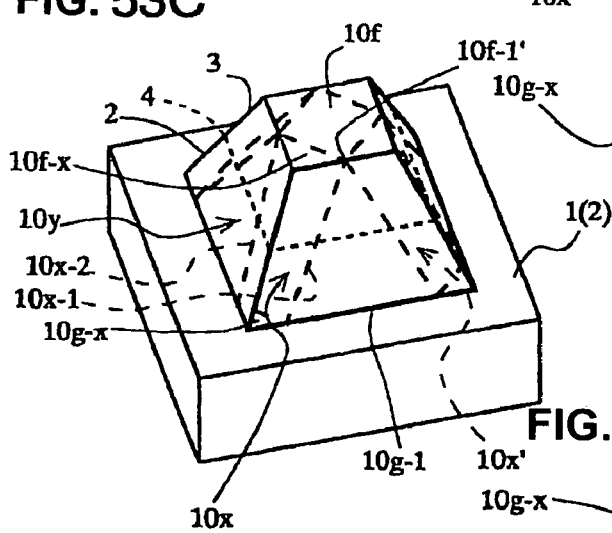

Preferably, the periphery includes second side surfaces 10y having a width decreasing from the lower surface 10g toward the upper surface 10f, and the first side surfaces 10x having a width decreasing in the opposite direction. In this instance, according to the shape of the upper surface, the side surface 10y with a longer base (side 10g-1) on the lower surface 10g side may be changed into such a shape as the sides 10x-1 and 10x-2 being the boundaries between the first and the second side surfaces disappear on the way from the lower base to the upper base, as shown in FIG. 53C; hence, the second side surface does not necessarily reach to the upper surface. Thus, the upper surface 10f and the lower surface 10g may have different shape, as defined by the dotted line 10f and 10g in FIG. 53C. The side surfaces may be sufficiently curved at the upper surface side to be circular. The upper surface 10f and the lower surface 10g are provided in desired vertical positions of the structured portion. Preferably, the entirety of a protrusion corresponding to the layered structure of a device defines the structured portion of the present invention. More preferably, the divergent first side surface having a width increasing toward the upper surface may be curved outward to have a convex surface, thereby ensuring superior reflection and diffusion of light and precision of mask formation. The proportion of the lengths of the upper bases 10f-x and 10f-1 or lower bases 10g-x and 10g-1 of the first side surface 10x to the second side surface 10y is not particularly limited. For forming a suitable shape of the protrusion, however, it is preferable that both the upper base 10f-x and the lower base 10g-x of the first side surface be shorter than the upper base 10f-1 and the lower base 10g1 of the second side surface.

Figure 53D:
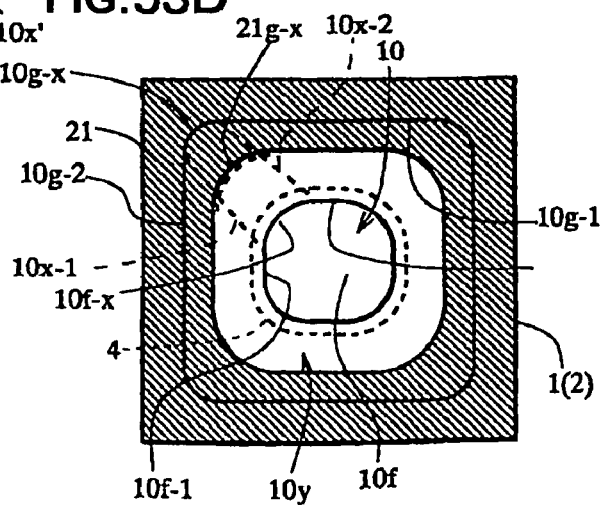
FIG. 53D is a schematic top view of FIG. 53A provided with a second electrode (n electrode) 21.

FIG. 53D is a plan view of an electrode, which is designated by the hatched area (electrode 21). The electrode is formed such that the corners of the upper surface of the electrode are curved larger than the curvature radius or the width of the corners (first side surfaces) of the structured portion, as designated by a dotted line (21g-x); Hence, the surrounding electrode is curved larger than the corners 10f-x at the lower side of the structured portion 10. Thus, current concentration, which tends to occur in the corners of, for example, the structured portion shown in FIG. 53C, can be reduced.

In the light-emitting device of the present invention (according to the first aspect, and the second and third aspects based on the first aspect), the luminescent layer 4 is preferably disposed inside the structured portion 10, as shown in FIGS. 53A to 53D, so that light is well controlled. More preferably, the luminescent layer 4 is disposed between part of the first conductivity type layer 2 and the second conductivity type layer 3. Still more preferably, a second electrode (an electrode of the second conductivity type layer 3 or p electrode of the p-type layer) is provided on the upper surface. The periphery of the structured portion in sectional view is not necessarily defined by straight lines as shown in FIGS. 53A to 53D, and may be defined by a curved line. Also, the periphery may have a step or terrace 2s, as shown in FIG. 58. The upper surface 2S of the jut of the periphery may be provided with an electrode extending over the periphery below the upper surface.

(Second Aspect)

Embodiments of a nitride semiconductor light-emitting device according to the present invention (first aspect) will now be described with reference to the drawings.

Embodiment 1 (Second Aspect)

Figure 1:
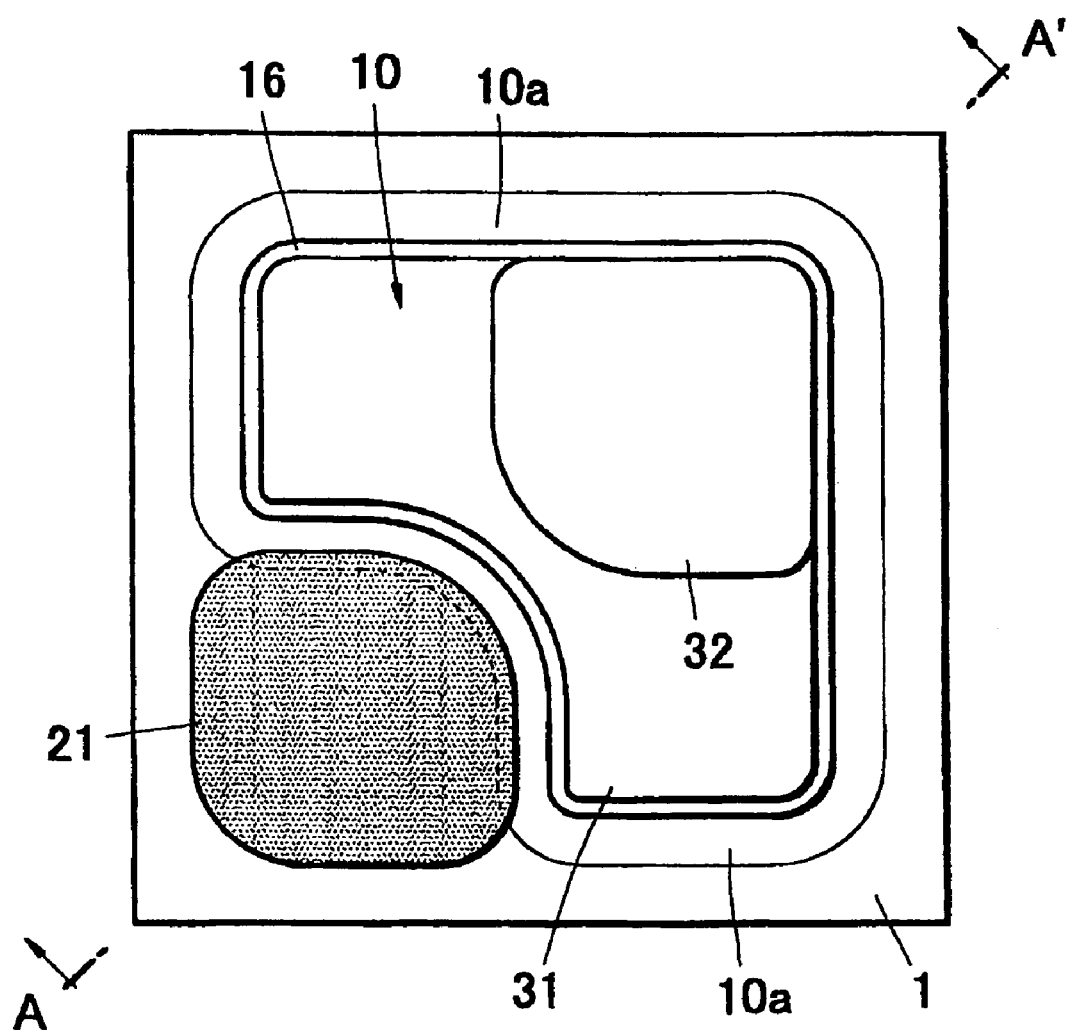
FIG. 1 is a plan view of a light-emitting device according to Embodiment 1 of the present invention.
Figure 2:
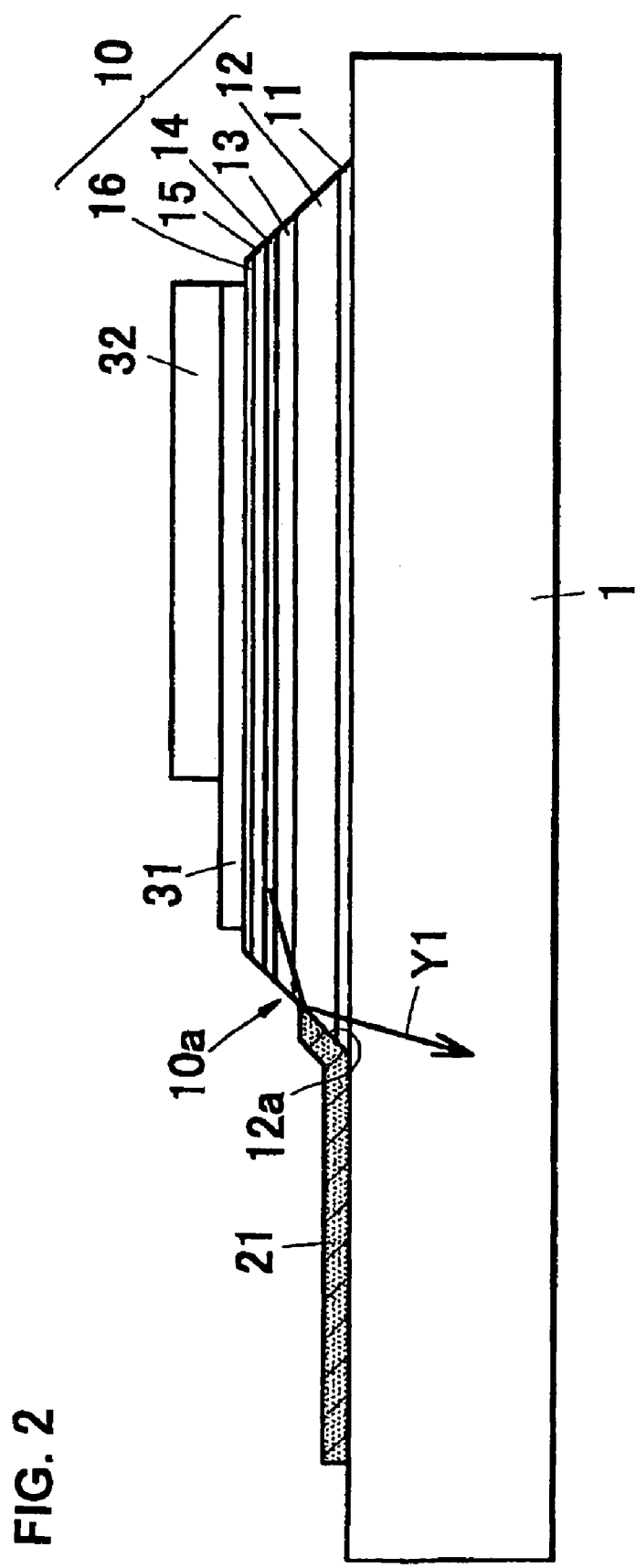
FIG. 2 is a sectional view taken along line A-A' in FIG. 1.

An nitride semiconductor light-emitting device according to Embodiment 1 of the present invention includes: a layered portion 10 defining a luminescent region and having a periphery 10a inclined inward; and n electrode 21 in ohmic contact with an n-type contact layer 12 exposed at the inclined periphery 10a, as shown in FIGS. 1 and 2.

The layered portion 10 of the nitride semiconductor light-emitting device according to Embodiment 1 is formed by depositing a buffer layer 11, an n-type contact layer 12, an n-type cladding layer 13, a luminescent layer 14, a p-type cladding layer 15, and a p-type contact layer 16, in that order, on a sapphire substrate 1, to form a layered structure, as shown in FIG. 2, and subsequently by etching the layered structure to a shape (substantially square whose one corner is cut to an arc shape) in sectional view shown in FIG. 1.

The layers constituted of the layered portion 10 are formed of, for example:

Buffer layer 11: GaN or AlGaN layer deposited at a low temperature of 400 to 600° C.

N-type contact layer 12: Si-doped GaN (having a thickness of, for example, 6 μm)

n-type cladding layer 13: n-type AlGaN

Luminescent layer 14: single- or multi-quantum well structure including an undoped InGaN well layer (having a thickness of, for example, about 30 Å)

P-type cladding layer 15: p-type AlGaN

P-type contact layer 16: Mg-doped GaN (having a thickness of, for example, about 1,200 Å)

The etching for forming the layered portion 10 is performed until the surface of the sapphire is exposed at the arc-shaped corner, in order to form an n electrode 21 on the exposed surface of the sapphire at the arc-shaped corner. In the present Embodiment 1, the surface of the sapphire substrate is exposed so as to surround the layered portion 10 continuously with the sapphire surface exposed at the arc-shaped corner for the n-type electrode 21.

In Embodiment 1, the n electrode 21 is continuously formed from the surface of the sapphire substrate 1 exposed at the corner of the layered portion 10 to the periphery 10a of the layered portion 10, and thus establishes an ohmic contact with the n-type contact layer 12 exposed at the periphery 10a, as shown in FIGS. 1 and 2.

On the other hand, the p electrode includes an over-surface electrode 31 and a p pad electrode 32. The over-surface electrode 31 is provided over substantially the entire surface of the p-type contact layer 16, which is the uppermost layer of the layered portion 10, and the p pad electrode 32 is disposed on the over-surface electrode 31 in a region opposing the n electrode 21 (opposing corner).

The n electrode 21 of the nitride semiconductor light-emitting device of Embodiment 1 having the above-described structure can extremely reduce light absorption. Accordingly, the nitride semiconductor light-emitting device can efficiently emit light.

Figure 21:
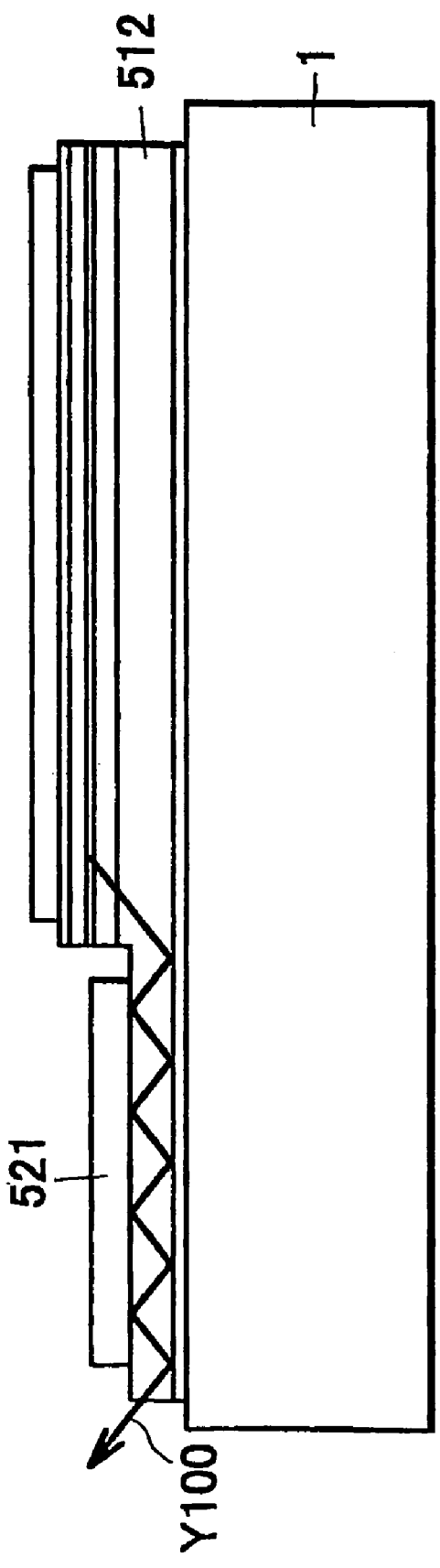
FIG. 21 is a sectional view of a known light-emitting device.

In a known structure shown in FIG. 21, light emitted from the luminescent region leaks to an n type contact layer 512 between the substrate 1 and an n electrode 521, and the light repeatedly reflect from the upper surface of the substrate 1 and the rear surface of the n electrode 121 (as schematically shown with reference numeral Y100 in FIG. 21). Thus, most of the light is absorbed by the n electrode 121 and cannot be extracted to the outside. On the other hand, in the present invention, the ohmic contact of the n electrode is established on the surface 12a of the n-type contact layer 12 exposed at the inclined periphery 10a, thus preventing the n-type contact layer 12 from transmitting light (as schematically shown with reference numeral Y1 in FIG. 2). Thus, the conventional problem is overcome.

If emitted light is emitted through the substrate, light reflected from the inclined periphery 10a of the layered portion 10 can also be emitted through the substrate. Thus, the light-emission efficiency can be increased.

In order to reflect light efficiently at the inclined periphery 10a for extraction of the light from the substrate, the inclination angle α of the periphery 10a is, preferably, set at 60° or less, more preferably 45° or less, taking it into account that the inclined periphery 10a is generally covered with a SiO$_2$ protective layer.

Figure 22:
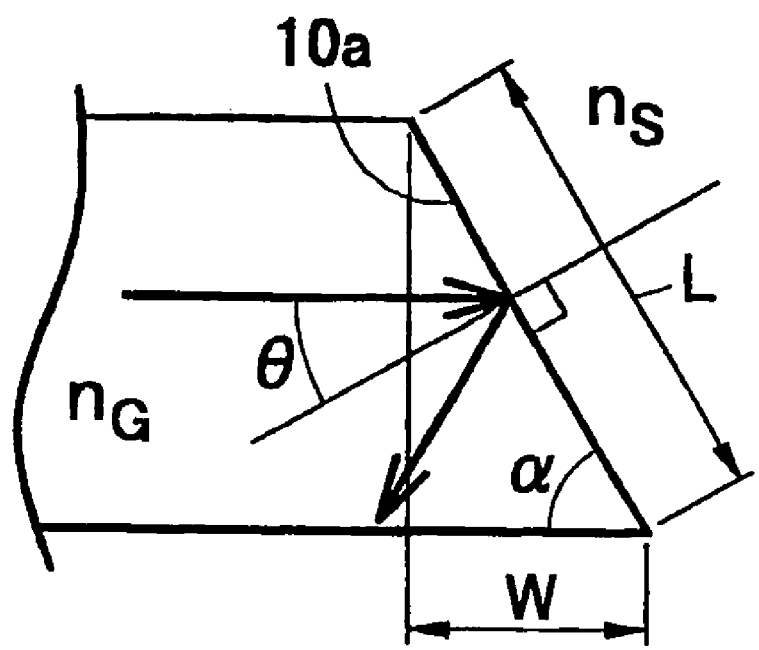
FIG. 22 is a schematic representation of a preferred inclination angle of the inclined periphery of a nitride semiconductor light-emitting device according to the present invention.

The inclination angle α herein is defined as shown in FIG. 22, and is preferably set so that the critical angle θc satisfies Sin θc=n$_S$/n$_G$ (n$_G$: refractive index of the active layer; n$_S$: reflective index of the SiO$_2$ protective layer).

For example, in a light-emitting device emitting light having a wavelength of 380 nm, the refractive index of Al$_x$Ga$_{1-x}$N for the light having the wavelength of 380 nm is 2.15 to 2.80 when X lies in the range of 1 to 0. In this instance, when the refractive index is 2.80, the critical angle θc comes to a minimum of about 30°.

By setting the critical angle θc at 30° or more, that is, by setting the inclination angle α at 60° or less, at least the strongest light propagated parallel to the semiconductor layers can be reflected totally.

As described above, by setting the inclination angle α at 60° or less, the strongest light propagated parallel to the semiconductor layers is reflected totally, and consequently, the light extraction efficiency can be increased. However, some rays of the light propagating in the semiconductor layers do not run parallel to the layers. In order to totally reflect light, including these rays, it is more preferable that the inclination angle α be set at 45° or less.

In addition, the projected length W being the inclination length L of the inclined periphery 10a viewed from above is preferably 10 μm or more from the viewpoint of the formation of the n electrode on the inclined periphery 10a.

Figure 3:
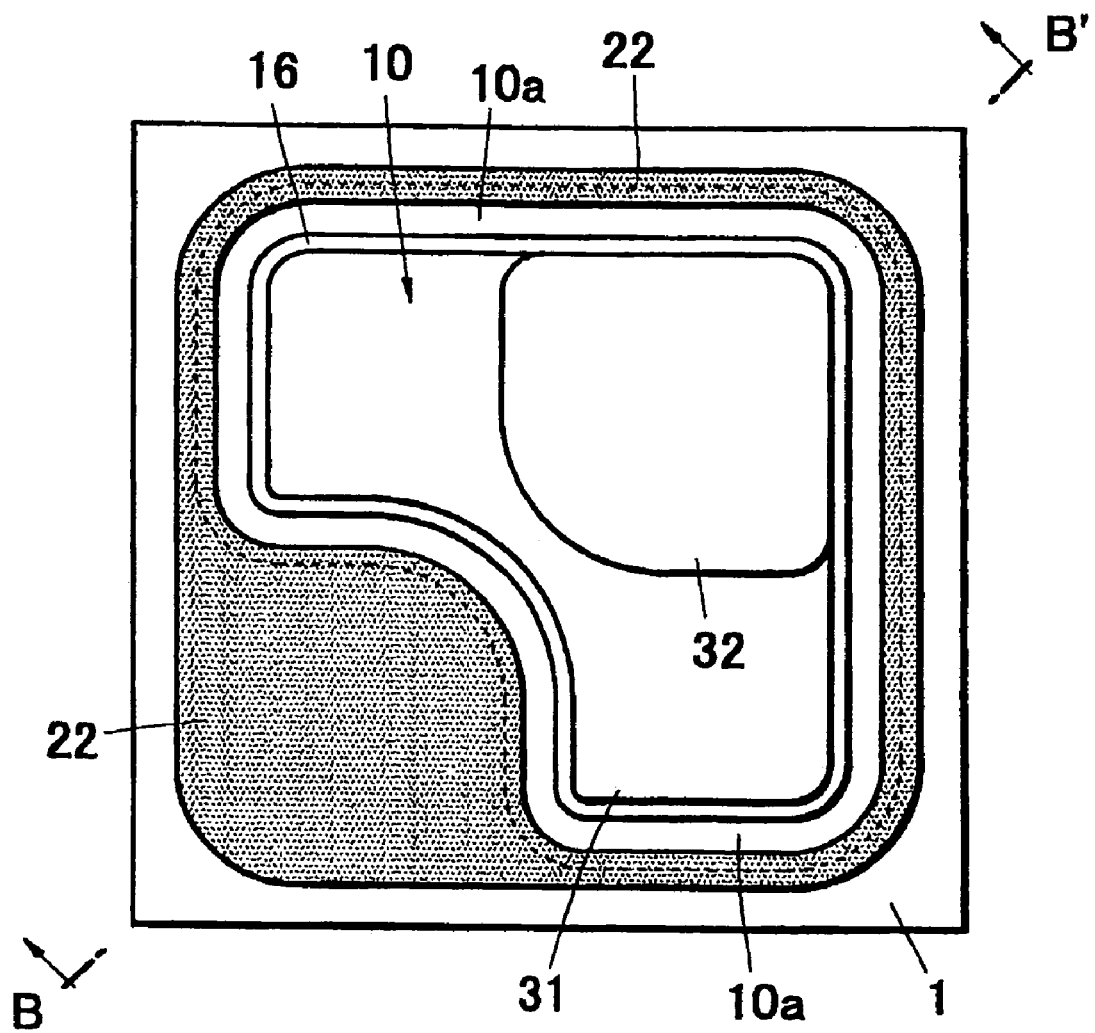
FIG. 3 is a plan view of a light-emitting device of a modification according to Embodiment 1 of the present invention.
Figure 4:
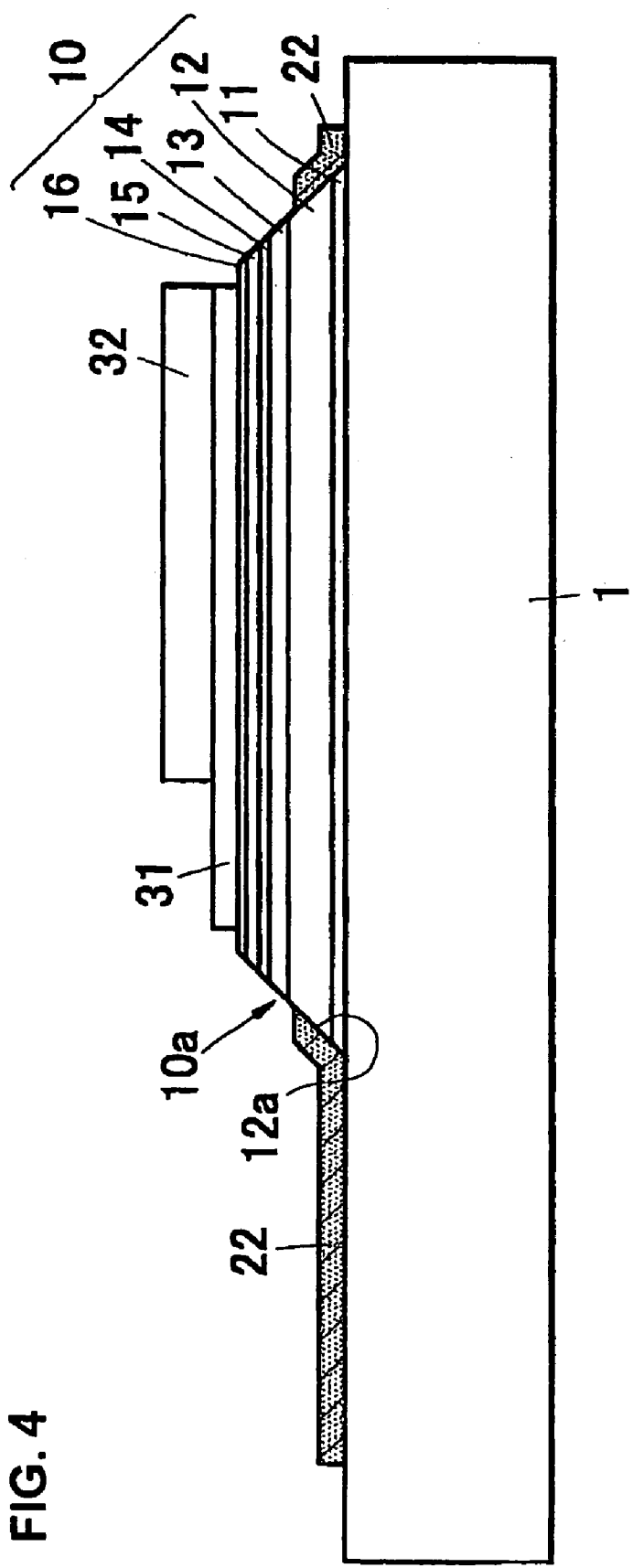
FIG. 4 is a sectional view taken along line B-B' in FIG. 3.

Embodiment 1 has described the structure in which the ohmic contact of the n electrode 21 with the n-type contact layer 12 is established at a corner of the layered portion. However, the n electrode preferably formed so as to surround the layered portion 10, as shown in FIGS. 3 and 4, in which the n electrode is designated by reference numeral 22. This structure allows uniform current injection to the entire luminescent region, and thus light can be efficiently emitted.

Embodiment 2 (Second Aspect)

Figure 5:
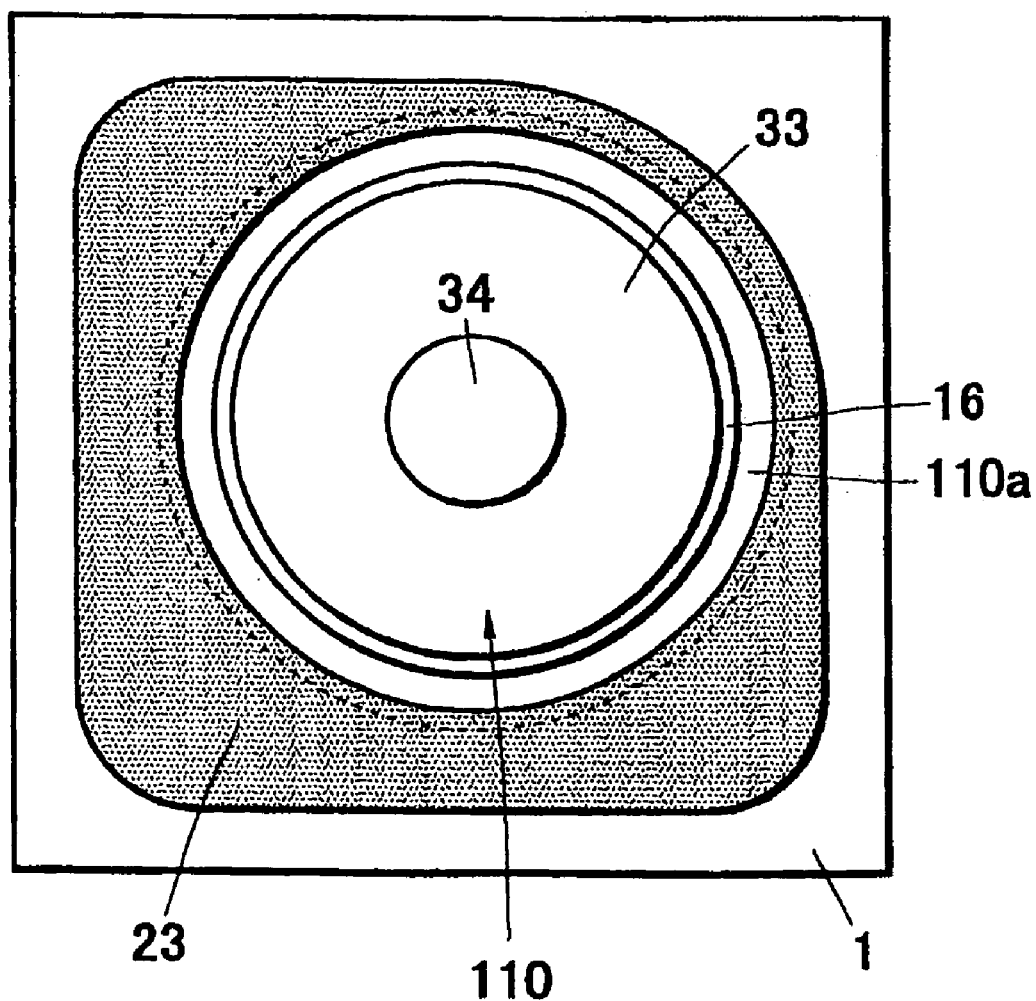
FIG. 5 is a plan view of a light-emitting device according to Embodiment 2 of the present invention.

A nitride semiconductor light-emitting device according to Embodiment 2 of the present invention has a circular layered portion 110 defining a luminescent region, as shown in FIG. 5. In the nitride semiconductor light-emitting device of Embodiment 2, the n electrode 23 is brought into ohmic contact with the n-type contact layer 12 exposed at the periphery 110a inclined inward of the layered portion 110, as in Embodiment 1.

In the nitride semiconductor light-emitting device according to Embodiment 2, the layered structure (semiconductor layers) of layered portion 110 is formed in the same manner as the light-emitting device of Embodiment 1, and the etching for forming the layered portion 110 is performed until the sapphire surface is exposed.

The p electrode in Embodiment 2 includes an over-surface electrode 33 and a p pad electrode 34. The over-surface electrode 33 is provided over substantially the entire circular surface of the p-type contact layer 16, which is the uppermost layer of the layered portion 110, and the p pad electrode 34 is disposed in the center of the over-surface electrode 33.

The over-surface electrode 33, the p pad electrode 34, and the circular layered portion 110 are concentrically disposed.

The nitride semiconductor light-emitting device of Embodiment 2 having the above-described structure produces the same effect as the light-emitting device of Embodiment 1.

Specifically, light absorption by the n electrode 23 can be extremely reduced, and accordingly, the device can efficiently emit light. In addition, light reflected from the inclined periphery 110a of the layered portion 110 can also be emitted through the substrate, and thus the light-emission efficiency can be increased.

Furthermore, since the n electrode 23 of Embodiment 2 surrounds the layered portion 110, as shown in FIG. 5, current can be uniformly injected into the entire luminescent region, and thus light can be efficiently emitted.

Embodiment 3 (Second Aspect)

Figure 6:
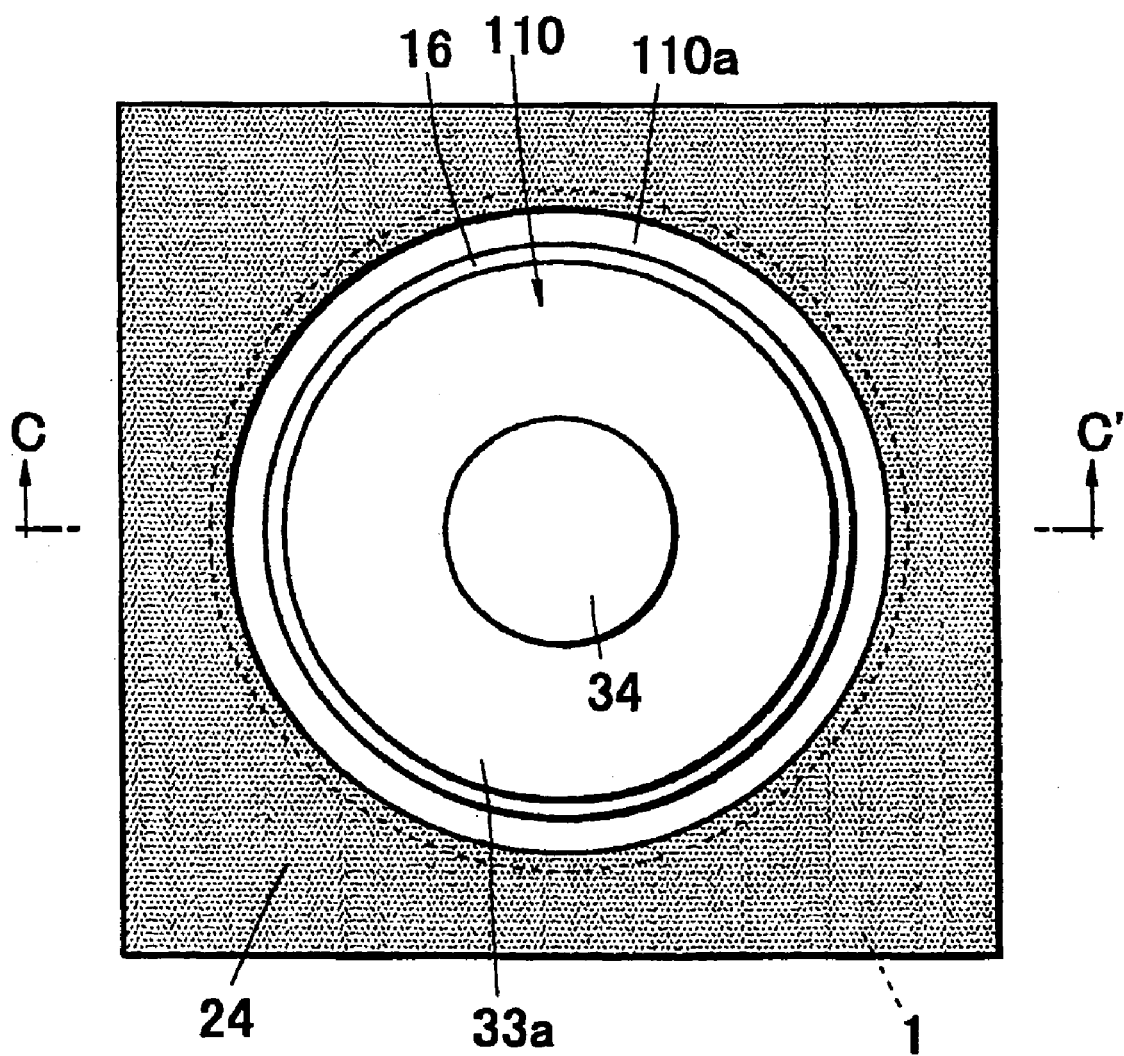
FIG. 6 is a plan view of a light-emitting device according to Embodiment 3 of the present invention.
Figure 7:
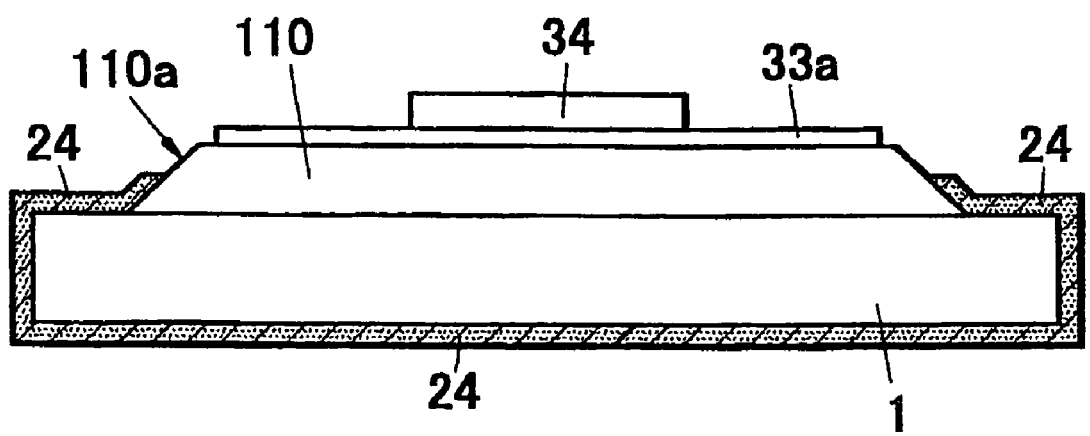
FIG. 7 is a sectional view taken along line C-C' in FIG. 6.

A nitride semiconductor light-emitting device according to Embodiment 3 of the present invention also has a layered portion 110 formed in a circular shape, but is different from that of the nitride semiconductor light-emitting device of Embodiment 2 in the following respects, as shown in FIGS. 6 and 7.

Specifically, the p-type contact layer of the nitride semiconductor light-emitting device of Embodiment 3 is provided with a transparent light-transmissive ohmic electrode 33a on its surface, and a p pad electrode 34 is formed on the ohmic electrode 33a.

Also, in the nitride semiconductor light-emitting device of Embodiment 3, an n electrode 24, which is to be brought into ohmic contact with an n-type contact layer at an inclined periphery 110a, is continuously formed on the side surfaces and the rear surface of the substrate 1, as shown in FIG. 7.

Other components than the light-transmissive ohmic electrode 33a and the n electrode 24 are formed in the same manner as in Embodiment 2.

The nitride semiconductor light-emitting device of Embodiment 3 can transmit light emitted from the layered portion 110 to the outside through the light-transmissive electrode 33a, consequently producing the following effects.

Specifically, light absorption by the n electrode 24 can be extremely reduced, and accordingly, the nitride semiconductor light-emitting device can efficiently emit light. The light is reflected from the n electrode 24 formed on the side surfaces and rear surfaces of the substrate and emitted through the light-transmissive ohmic electrode 33a. Thus, the light-emission efficiency can be increased.

Furthermore, since the n electrode 24 of Embodiment 3 surrounds the layered portion 110, as shown in FIG. 6, current can be uniformly injected into the entire luminescent region, and thus light can be efficiently emitted.

Figure 8:
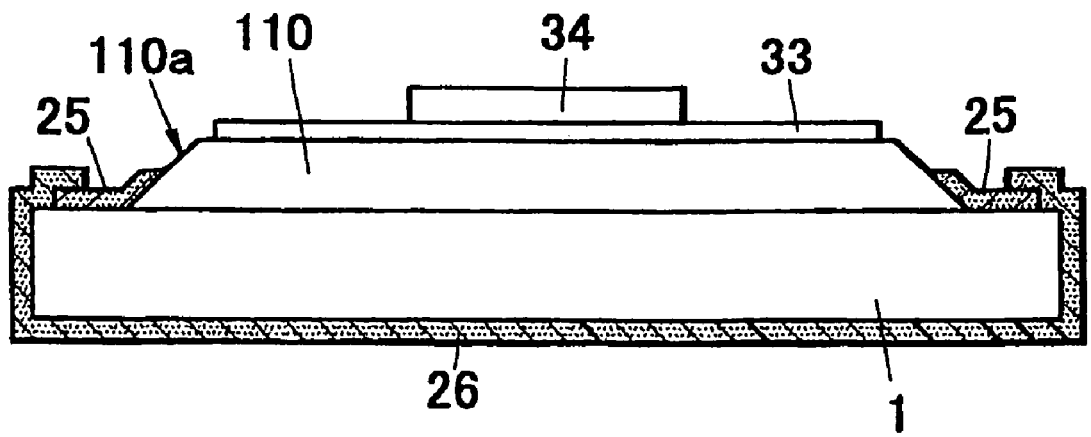
FIG. 8 is a sectional view of a light-emitting device according to a modification of Embodiment 3.

Although, in the nitride semiconductor light-emitting device of Embodiment 3, the entire substrate is covered with the n electrode 24, the form of the present invention is not limited to this. For example, as shown in FIG. 8, the substrate 1 may be covered with another electrode 26 formed of a different metal from the n electrode 25.

Such a structure also produces the same effects as Embodiment 3, and further produces the following effects.

Specifically, the n electrode 25 is made of a metal capable of establishing a good ohmic contact with the n-type contact layer, and the electrode 26 covering the substrate 1 is made of a suitable metal for desired functions.

For example, if the device is mounted by soldering the rear surface of the substrate 1, the material of the electrode 26 is selected from heat-resistant materials, or if good light reflection is particularly required, a metal having a high reflectance is selected.

Embodiment 4 (Second Aspect)

Figure 9:
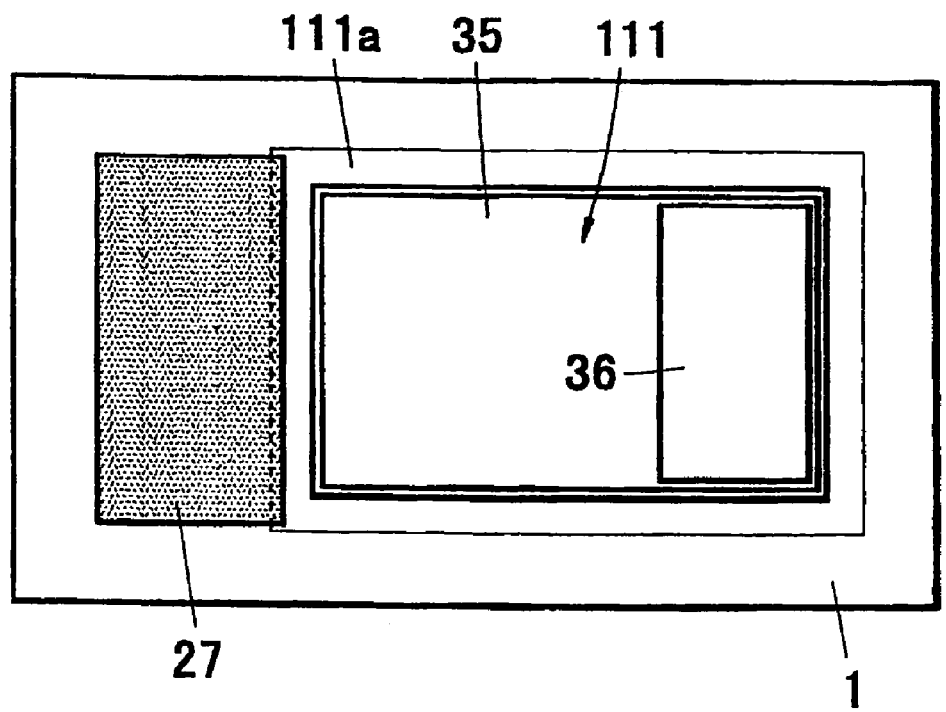
FIG. 9 is a plan view of a light-emitting device according to Embodiment 4 of the present invention.

A nitride semiconductor light-emitting device according to Embodiment 4 of the present invention has a rectangular layered portion 111 defining a luminescent region, as shown in FIG. 9.

Specifically, in the nitride semiconductor light-emitting device of Embodiment 3, an over-surface electrode 35 and a p pad electrode 36 are formed in that order on the surface of the p-type contact layer.

As shown in FIG. 9, an n electrode 27 brought into ohmic contact with the n-type contact layer at the inclined periphery 111a of the rectangular layered portion 111 extends from the surface of the substrate to the n-type contact layer (exposed at the inclined periphery 111a).

The layered portion in Embodiment 4 has the same layered structure as that in Embodiments 1 to 3.

The nitride semiconductor light-emitting device of Embodiment 4 having the above-described structure produces the same effect as the light-emitting devices of Embodiments 1 to 3.

Figure 10:
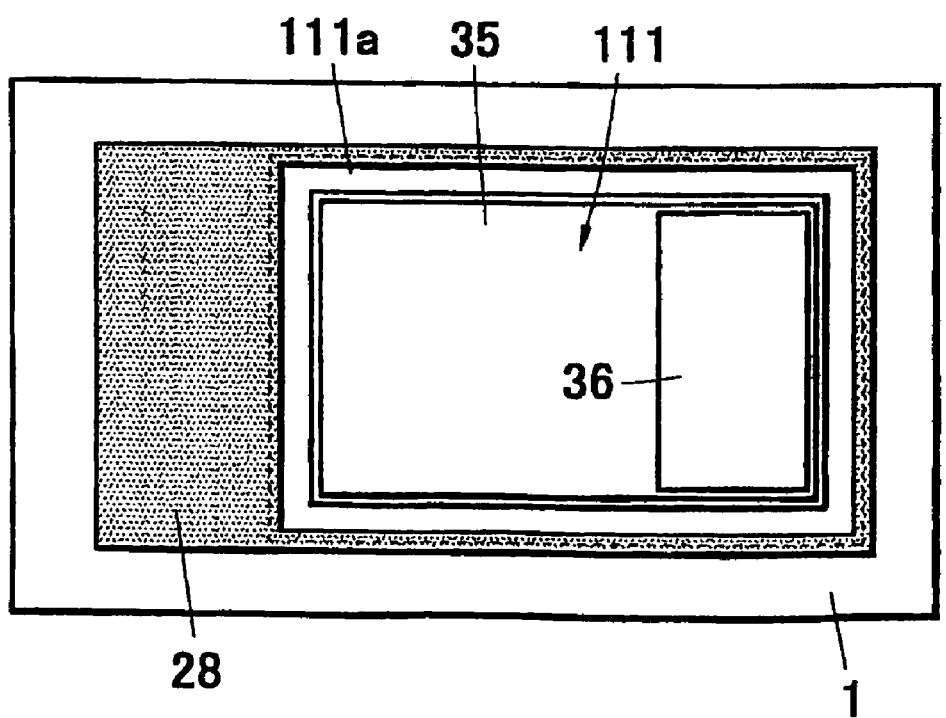
FIG. 10 is a plan view of a light-emitting device according to a modification of Embodiment 4.

Although, the n electrode 27 of the nitride semiconductor light-emitting device shown in FIG. 9 is disposed so as to establish an ohmic contact with the n contact layer at a side of the layered portion 111, Embodiment 4 may provide another form in which the n electrode, which is designated by reference numeral 28 in FIG. 10, is disposed so as to establish an ohmic contact with the n contact layer at all the sides of the layered portion 111. Consequently, current can be uniformly injected into the entire luminescent region, and thus light can be efficiently emitted.

Embodiment 5 (Second Aspect)

Figure 11:
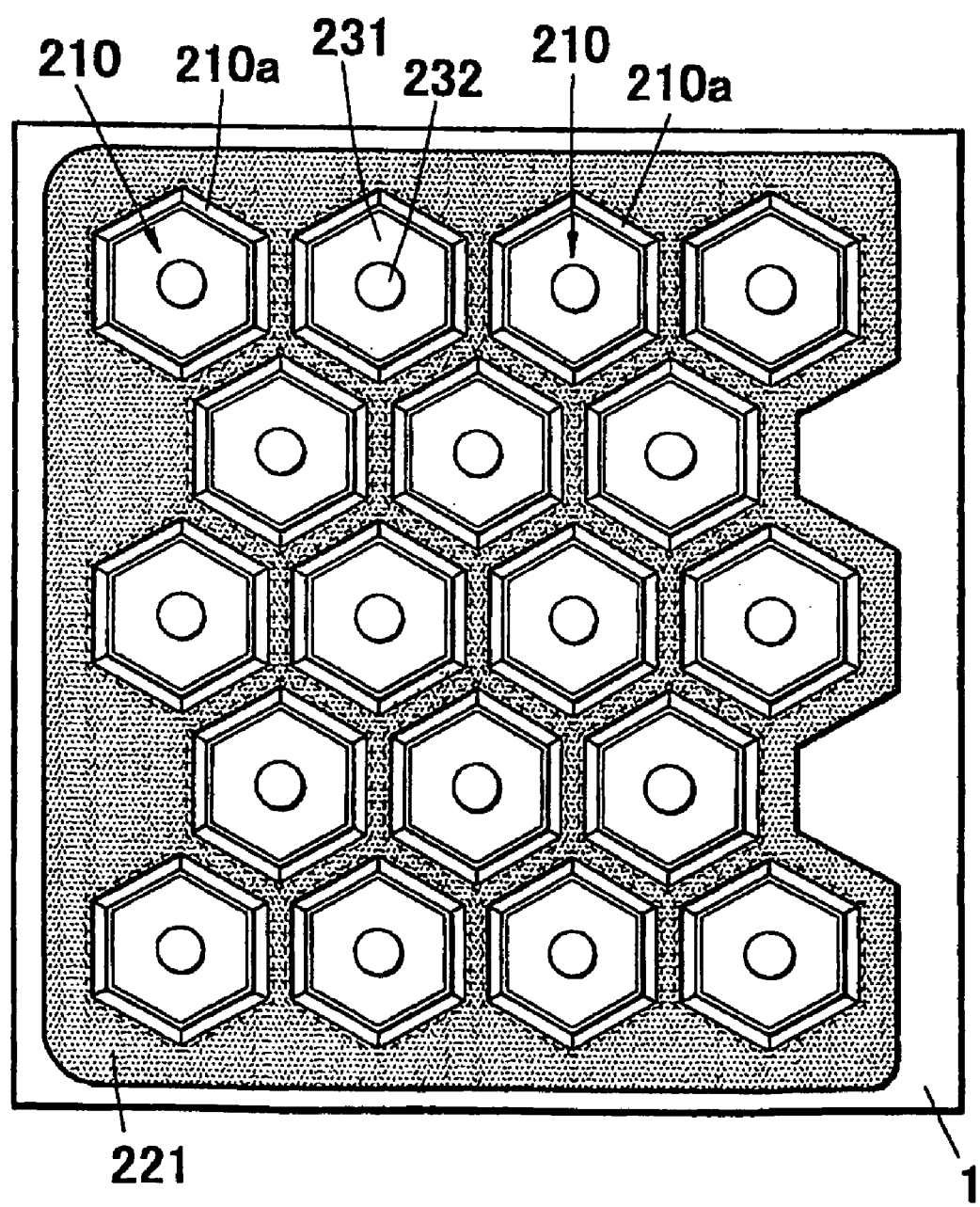
FIG. 11 is a plan view of a light-emitting device according to Embodiment 5 of the present invention, omitting a p electrode.
Figure 12:
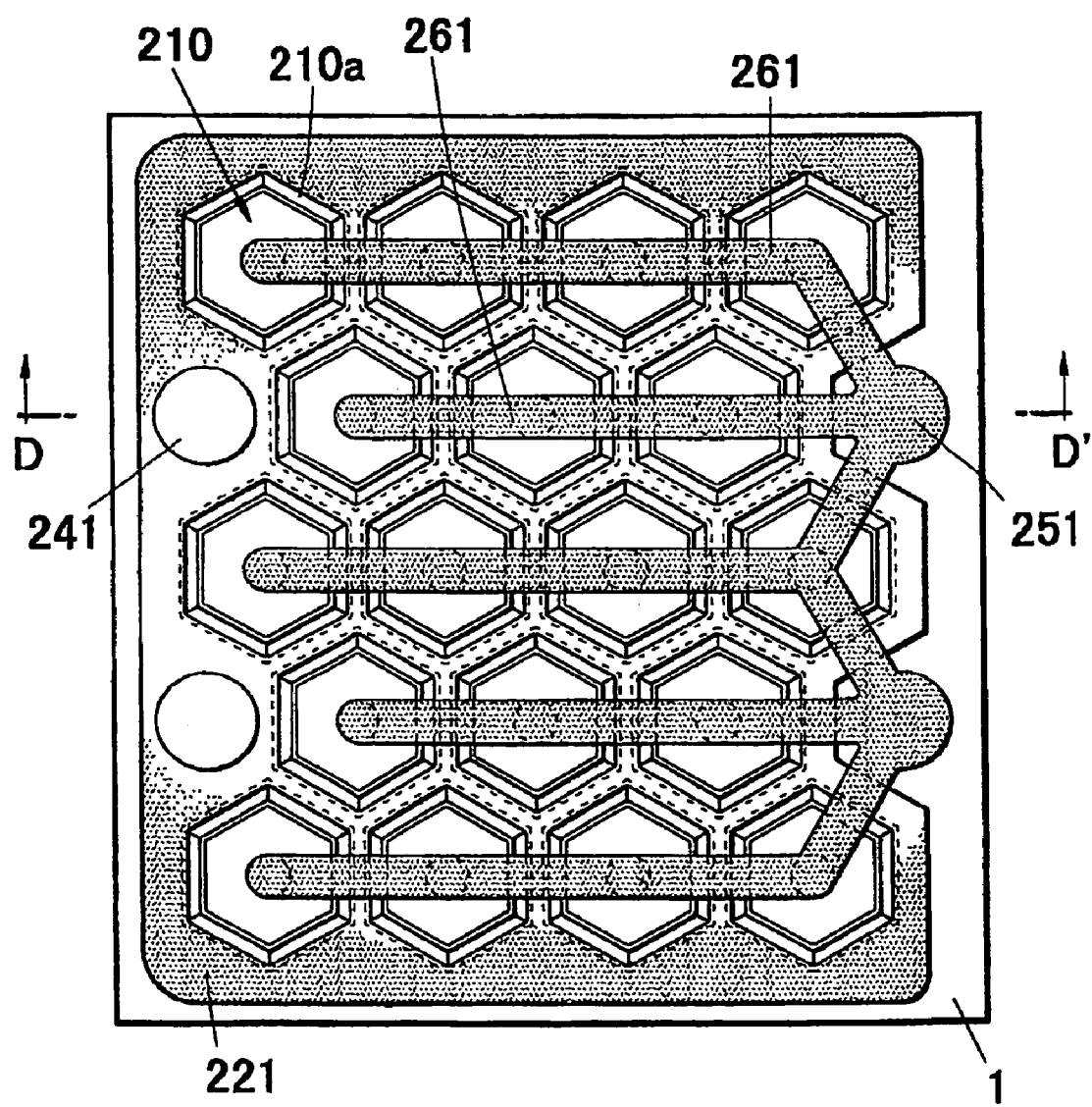
FIG. 12 is a plan view (including the p electrode) of the light-emitting device according to Embodiment 5 of the present invention.

A nitride semiconductor light-emitting device according to Embodiment 5 includes a plurality of layered portions 210 (18 layered portions in FIGS. 11 and 12), as shown in FIGS. 11 and 12, to have a large luminescent area. This structure can increase the occupancy of the luminescent region in the entire area of the device, and thus light can be uniformly emitted over entire area of the luminescent layer.

Figure 13:
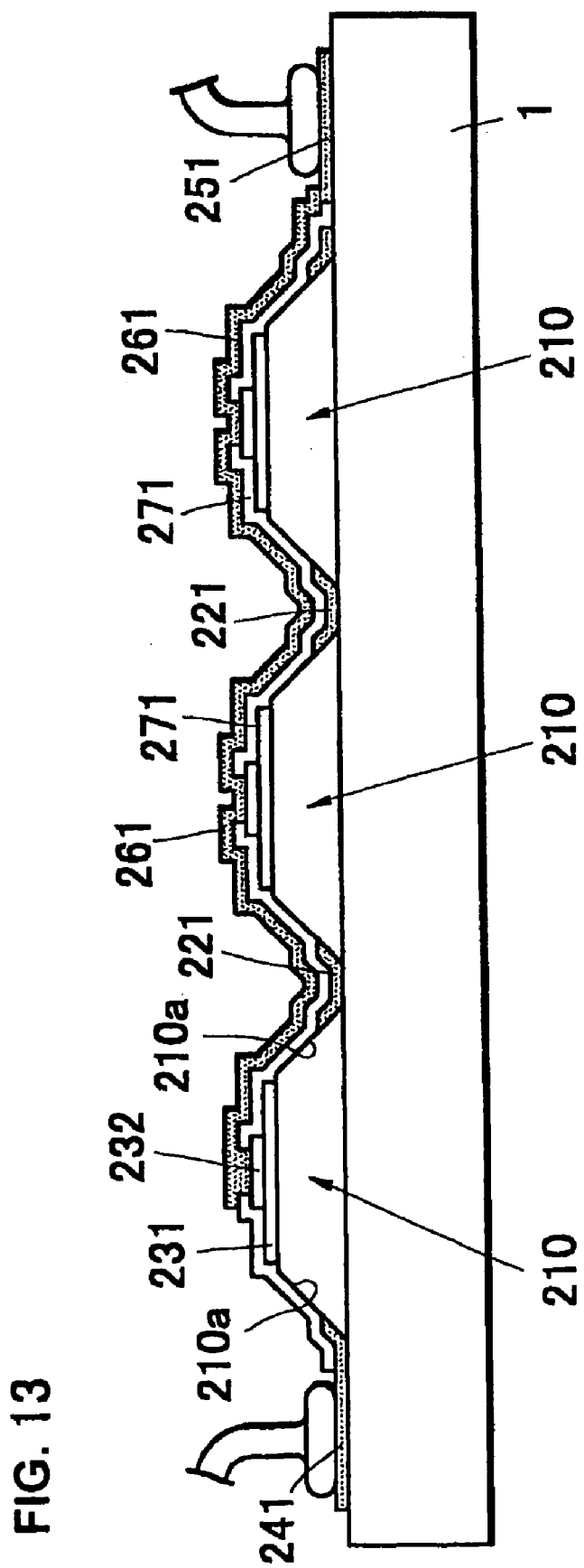
FIG. 13 is a sectional view taken along line D-D' in FIG. 12.

FIG. 11 is a plan view mainly showing a form of the n electrode 221, omitting p bonding electrodes 251 and p connecting electrodes 261; FIG. 12 is a plan view showing another form of the n electrode, including the p bonding electrodes 251 and the p connecting electrodes 261. FIG. 13 is a sectional view taken along line D-D' in FIG. 12.

The purpose in forming the luminescent region with a plurality of portions is to eliminate the disadvantage that a luminescent region constituted of a non-separated portion with a large area reduces current in a region distant from the electrode and degrades the luminous efficiency. However, if the luminescent region is constituted of a plurality of portions, the area of the electrodes connecting the portions of the luminescent region is increased, and it becomes difficult to secure the area required for the luminescent region. Also, if a plurality of the known devices having the structure shown in FIG. 21 are arranged, light is repeatedly reflected to be absorbed by the n electrode while traveling through the n-type contact layer, and the luminous efficiency is reduced. On the other hand, the nitride semiconductor light-emitting device of Embodiment 5 has the n electrodes in ohmic contact with the n-type contact layers, on the inclined peripheries. Thus, the area which the n electrode requires can be reduced to secure the area of the luminescent region, and the n electrode is prevented from absorbing light.

The nitride semiconductor light-emitting device of Embodiment 5 can more reduce the absorption by the over-surface electrode on the p side than the known device.

Figure 23:
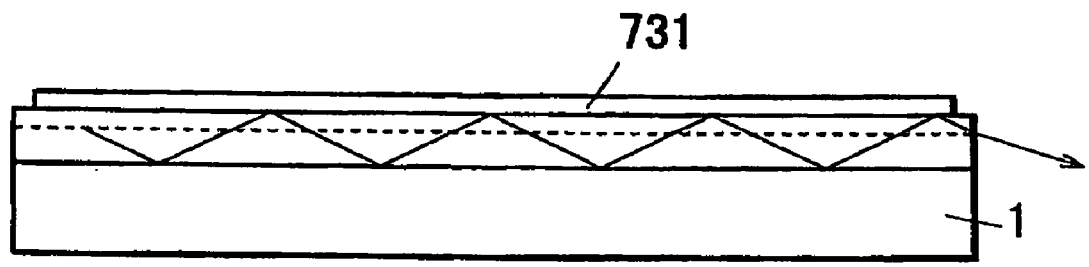
FIGS. 23A to 23C show that layered portions and their arrangement in a nitride semiconductor light-emitting device according to the present invention prevent a (p) electrode 731 from absorbing light.
Figure 23:
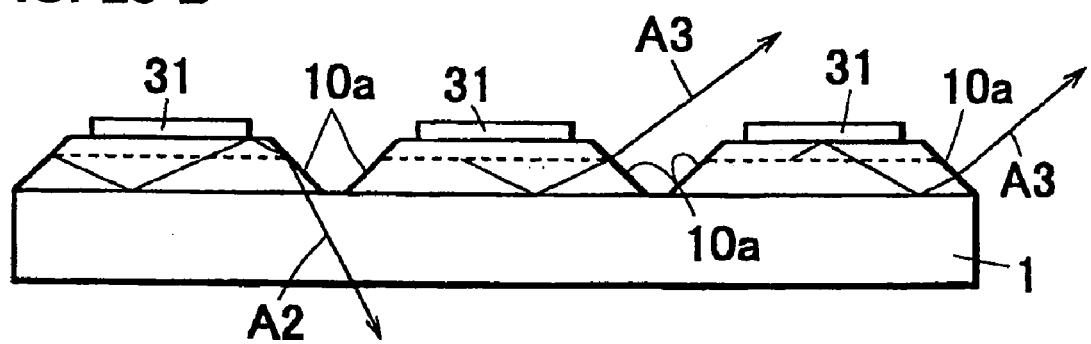
Figure 23:
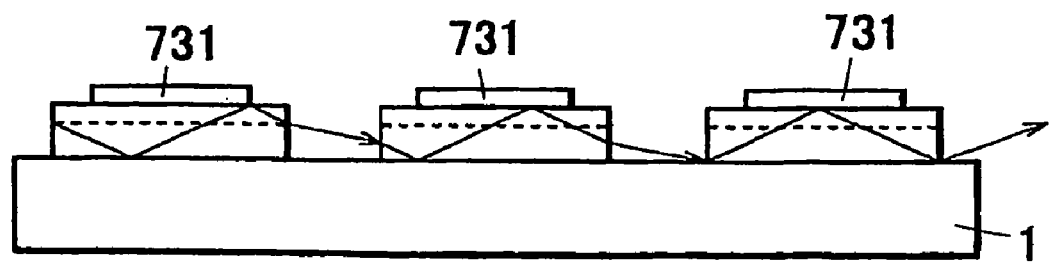

Specifically, in the known device having a large-area luminescent region constituted of a single portion, as shown in FIG. 23B, light coming into the p over-surface electrode at the critical angle or more is repeatedly reflected at the p over-surface electrode and the boundaries between the semiconductor layer and the substrate, so that considerable part of the light is absorbed by the p over-surface electrode.

If the luminescent region is composed of a plurality of portions but the peripheries of the portions are not inclined, the light coming into the p over-surface electrode at the critical angle or more is emitted from the peripheries substantially perpendicular to the substrate to reenter the adjacent portions of the luminescent region at a high probability, as shown in FIG. 23C. Consequently, the percentage of absorption by the p over-surface electrode is increased.

In contrast, the portions of the luminescent region of the nitride semiconductor light-emitting device of Embodiment 5 each have the incline periphery. Therefore, light can be emitted to the outside without reentering the adjacent portions of the luminescent region (the probability that the light reenters the adjacent portions can be reduced), as designated by arrow A2 in FIG. 23B if light is emitted through the substrate, or as designated by arrow A3 if light comes out from the electrode side. Thus, the percentage of absorption by the p over-surface electrode 31 can be reduced.

In addition, the layered portions 210 constituting the luminescent region, in the nitride semiconductor light-emitting device of Embodiment 5, have a hexagonal shape, and they are arranged such that the area between the layered portions is a minimum (FIGS. 11 and 12). In Embodiment 5, the spaces between the adjacent layered portions 210 are etched to such a depth as to reach the surface of the substrate (FIG. 13), and thus the plurality of the layered portions 210 are completely separated from each other. The intervals between the adjacent layered portions 210 are set at, for example, 10 μm.

Furthermore, in Embodiment 5, an n electrode 221 is provided so as to come into ohmic contact with n-type contact layers exposed at the peripheries of the layered portions 210, each of which has the same inclined periphery 210*a* as that of Embodiment 1 and other embodiments.

In Embodiment 5, the n electrode 221 is integrally formed so as to surround each layered portion 210, as shown in FIG. 11.

In Embodiment 5, the over-surface electrode 231 is formed over substantially the entire surface of the p-type contact layer of each layered portion 210, and the pad electrode 232 is disposed in the center of the over-surface electrode 231. Then, an insulating layer 271 having openings over the p pad electrodes 232 covers the entire device. Connecting electrodes 261 (whose one end is connected to a p bonding portion) for connecting the p pad electrodes 232 are formed on the insulating layer 271. The insulating layer 271 also has openings for exposing the bonding portions 241 of the n electrode 221.

As described above, the nitride semiconductor light-emitting device of Embodiment 5 includes the hexagonal layered portions 210 constituting the luminescent region, arranged so that the area between the layered portions 210 comes to a minimum, and the n electrode on the inclined peripheries of the layered portions 210. Thus, the area of the luminescent region can be increased.

This structure allows the luminescent region to be divided into a suitable number of portions to emit light efficiently while suppressing the increase of the area for forming the n electrode. Consequently, the portions of the luminescent region can emit light efficiently without reducing the area of the luminescent region, and thus a large-area light-emitting device exhibiting a high luminance can be achieved.

The nitride semiconductor light-emitting device of Embodiment 5 may emit light through the substrate. Alternatively, a transparent electrode may be used as the over-surface electrode to emit light through the semiconductor. In either case, since the light emitted from the luminescent layer propagates to both the substrate and the p-type semiconductor, it is preferable that a reflection layer be provided on the side opposite to the light-emitting side. Thus, the luminous efficiency can be increased.

Figure 14:
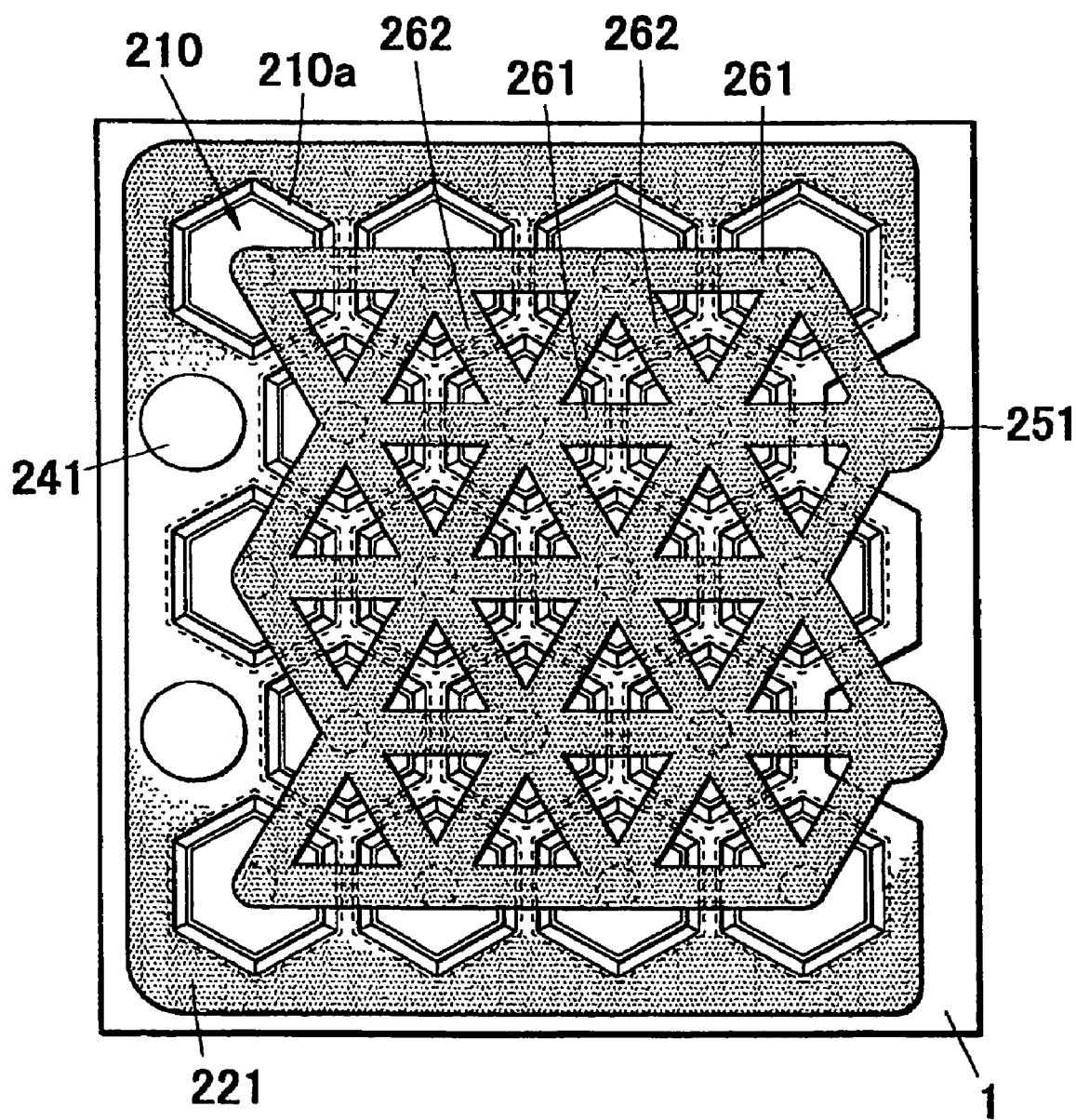
FIG. 14 is a plan view of a light-emitting device according to a first modification of Embodiment 5.

FIG. 14 shows another nitride semiconductor light-emitting device according to Embodiment 5, which further includes a second connecting electrode 262 for connecting the connecting electrodes 261. The second connecting electrodes 262 are intended to prevent current injection from decreasing in the layered portions 210 distant from the p bonding electrodes 251, and to make the emission intensities of the layered portions uniform.

If light is emitted through the semiconductor layers, however, the second connecting electrodes 262 block the light. Therefore, the second electrodes are particularly suitable for devices emitting light through the substrate.

Figure 15:
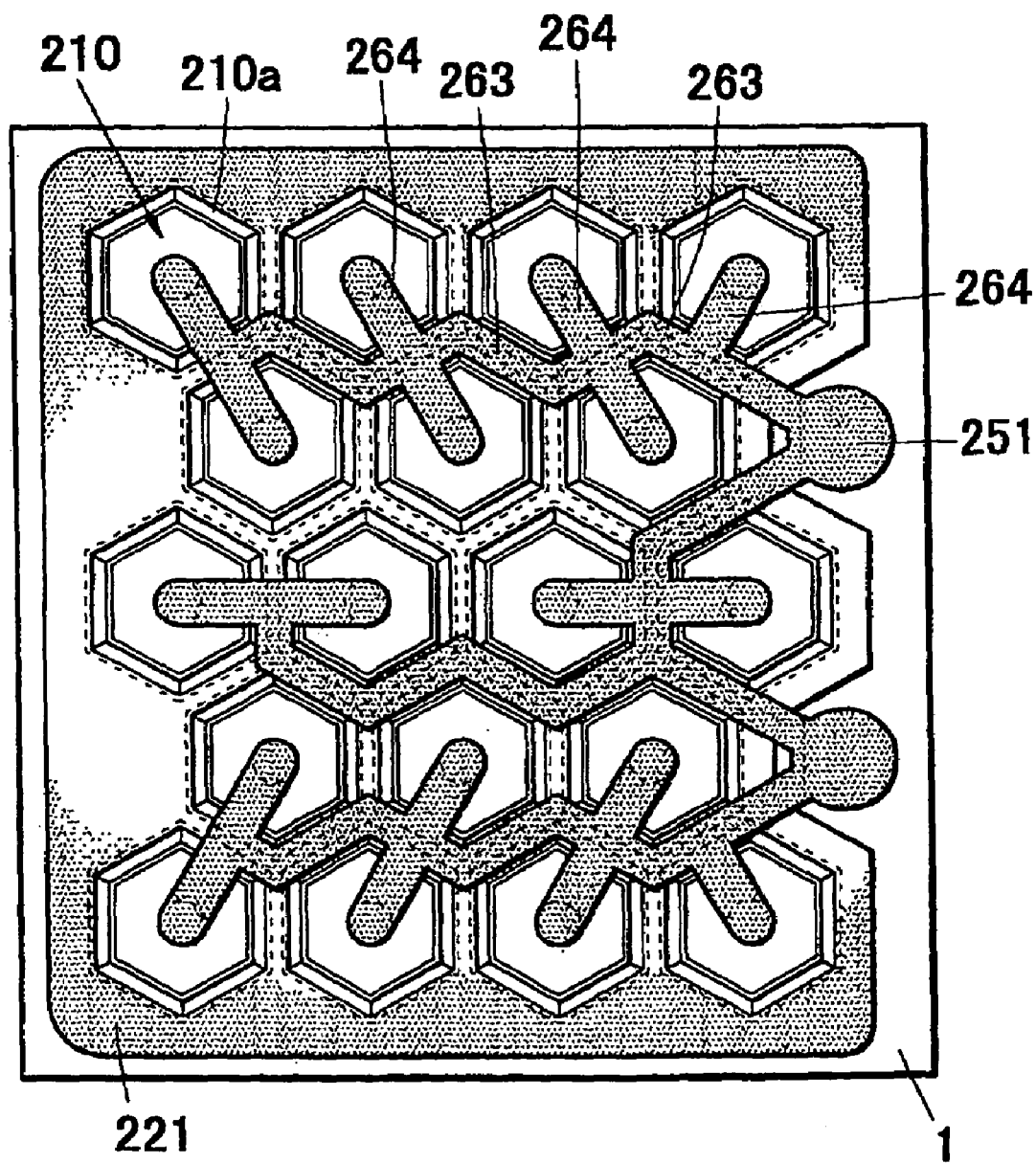
FIG. 15 is a plan view of a light-emitting device according to a second modification of Embodiment 5.

FIG. 15 shows a modification of the connecting electrodes suitable for the device emitting light through the semiconductor layer side. In this modification, the first connecting electrodes 263 connecting to the p bonding electrodes 251 are disposed between the layered portions 210, on the n electrode with an insulating layer therebetween, preventing continuity with the n electrode. Since the first connecting electrodes 263 are not disposed over the layered portions, light is not blocked by the layered portions. The first connecting electrodes 263 are connected to the p pad electrodes of the layered portions 210 with second connecting electrodes 264. In this instance, each p pad electrode 232 is connected to the first connecting electrode 263 with one second connecting electrode 264.

Figure 16A:
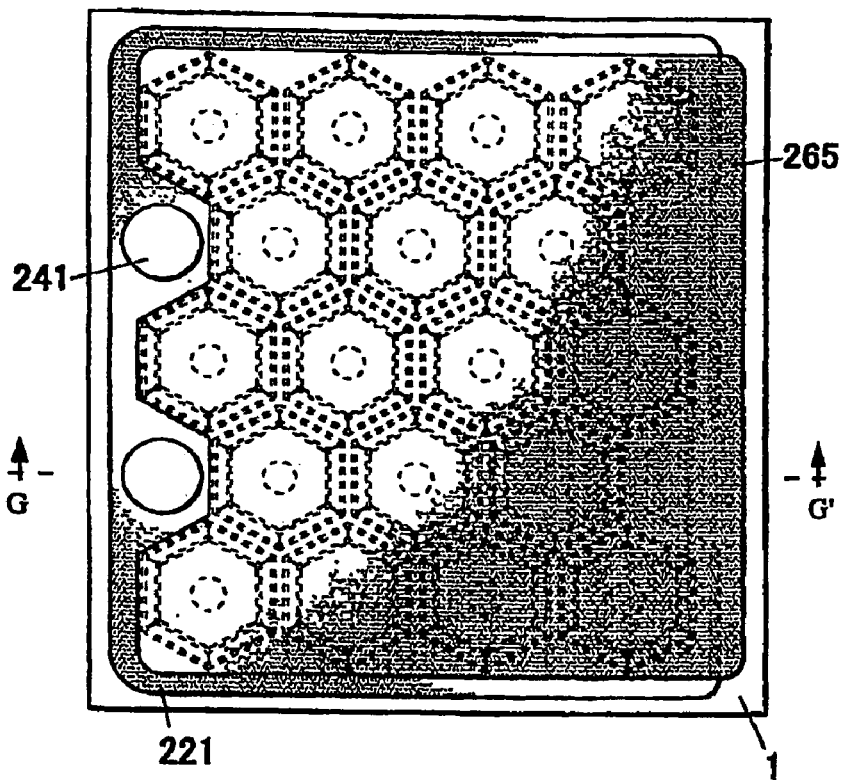
FIG. 16A is a plan view of a light-emitting device according to a third embodiment of Embodiment 5.
Figure 16B:
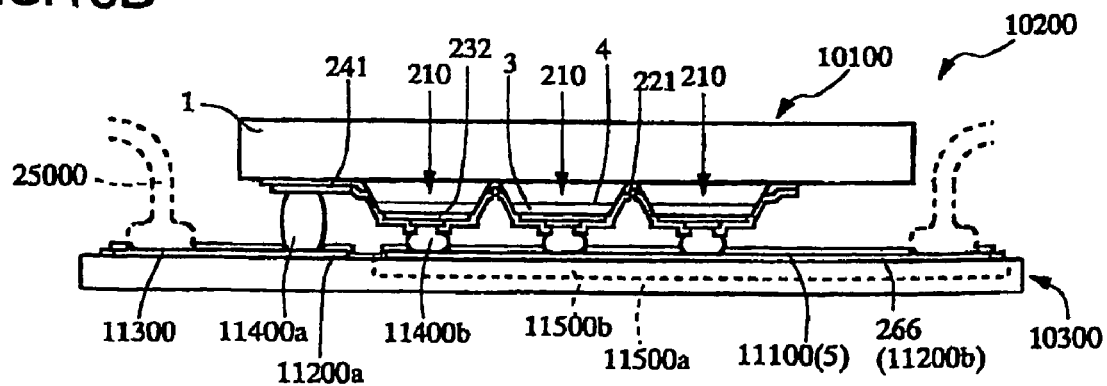
FIG. 16B is a sectional view of the light-emitting device mounted on a mounting base, taken along line G-G' in FIG. 16A.

FIGS. 16A and 16B show preferred structures of the electrodes when light is emitted through the substrate.

The nitride semiconductor light-emitting device shown in FIG. 16A has an electrode layer 265 covering the plurality of layered portions, separated by the insulating layer 271, instead of the connecting electrodes 261 (including the p bonding electrodes) used in Embodiment 5 (FIG. 12).

The electrode layer prevents the leakage of light from the upper surfaces and inclined peripheries of the layered portions (reflects light at the upper surface and inclined peripheries), so that light can be efficiently emitted. Alternatively, a connecting electrode 265 may be provided on a mounting surface or mounting base 10300, so that the plurality of structured portions 210 (10) can simultaneously emit light without solid intersection of the positive and negative electrodes. Also, in this structure, a protective layer, a reflection layer, a transmissive layer, a light-transforming member, and so forth can be provided around the structured portions to make efficient use of space. Furthermore, leakage resulting from the solid intersection of the wiring can be overcome. Thus, a highly reliable light-emitting device can be achieved.

Although the nitride semiconductor light-emitting device of Embodiment 5 has hexagonal layered portions 210, the layered portions may be of rectangular, square, circular, or other shape.

Figure 24:
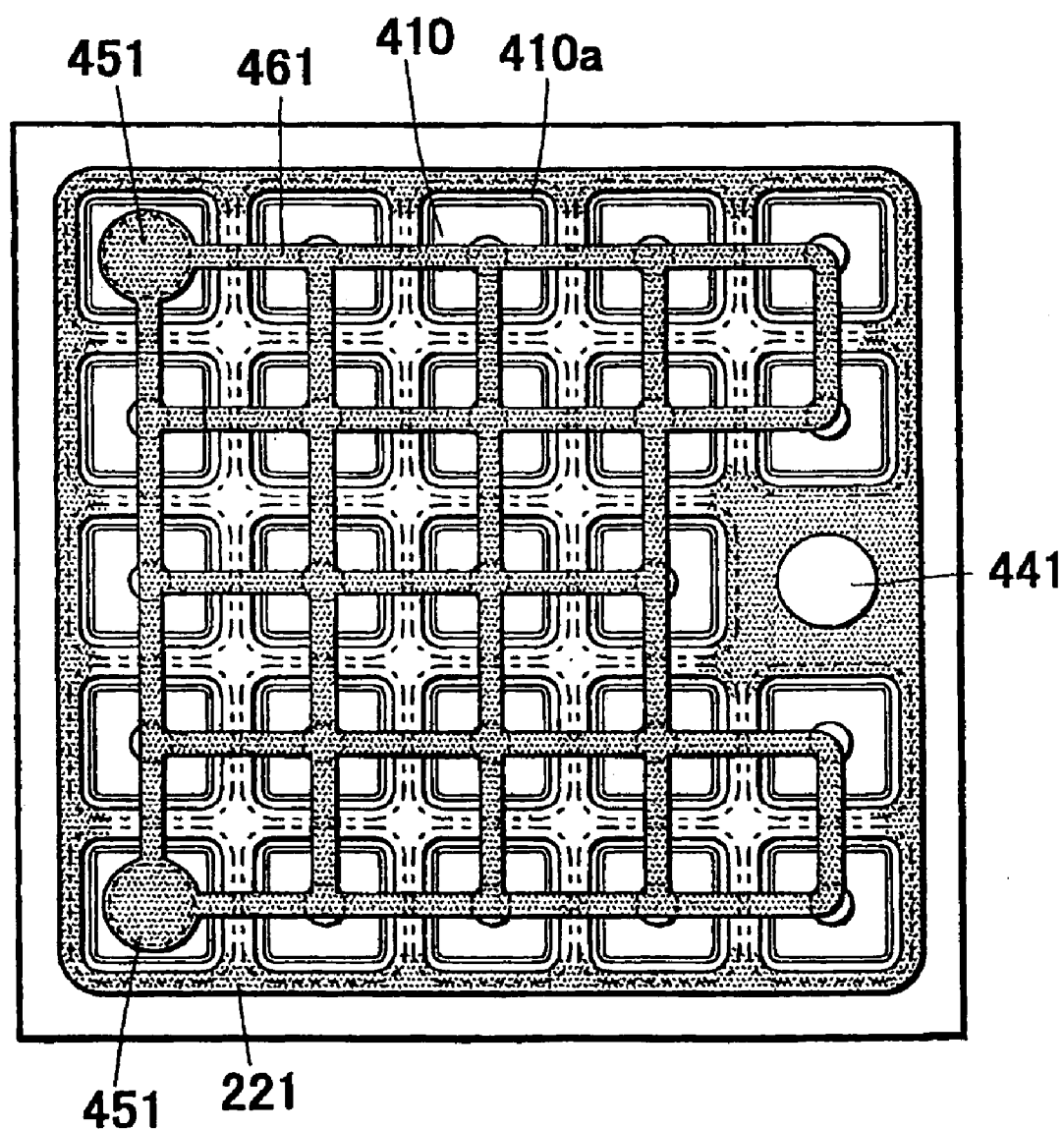
FIG. 24 is a plan view of a light-emitting device according to a fourth modification of Embodiment 5.

FIG. 24 is a plan view of a modification in which the layered portions 410 are of square. In this modification, the p bonding portions 451 are disposed on the layered portions 410 in two corners of the device, and the connecting electrodes 461 connected to the p bonding portions 451 connect the p pad electrodes of the layered portions 410. In order to prevent the continuity between the n electrode and the connecting electrodes 461, an insulating layer is provided on the n electrode between the layered portions 410.

Also, the n electrode 421 is integrally formed so as to surround each layered portion 410 and to come into ohmic contact with the n-type contact layers exposed at the inclined peripheries 410*a* of the layered portions 410. Part of the n electrode 421 serves as an n pad electrode 441.

Figure 33A:
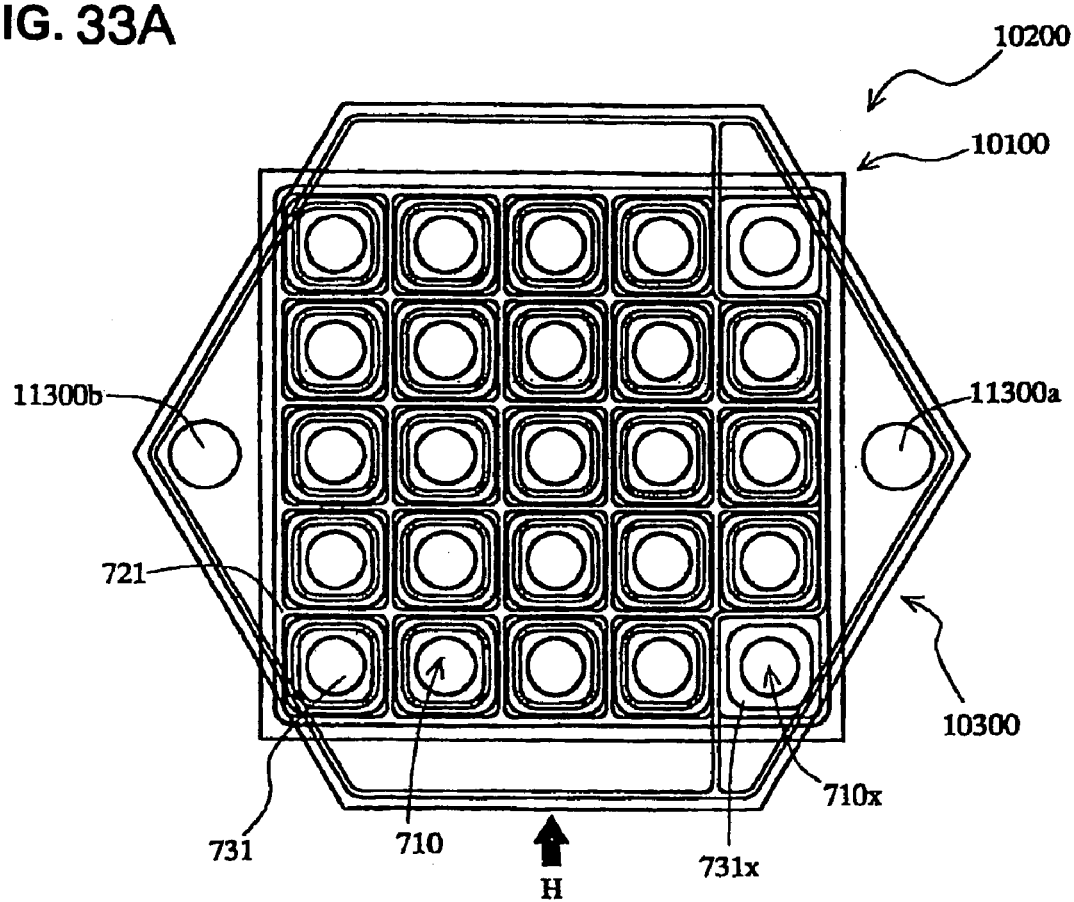
FIG. 33A is a plan view (transparent view of the device structure) of a light-emitting device mounted on a mounting base according to Embodiment 8 of the present invention.
Figure 33B:
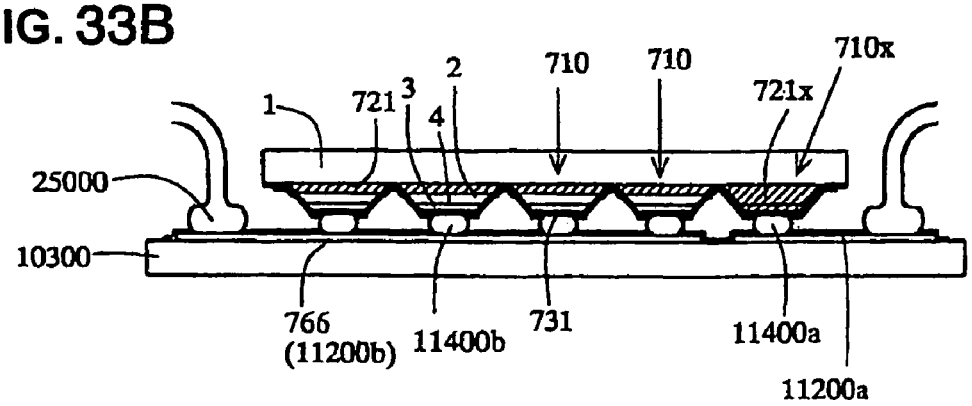
FIG. 33B is a side view of FIG. 33A viewed from the H direction.
Figure 34:
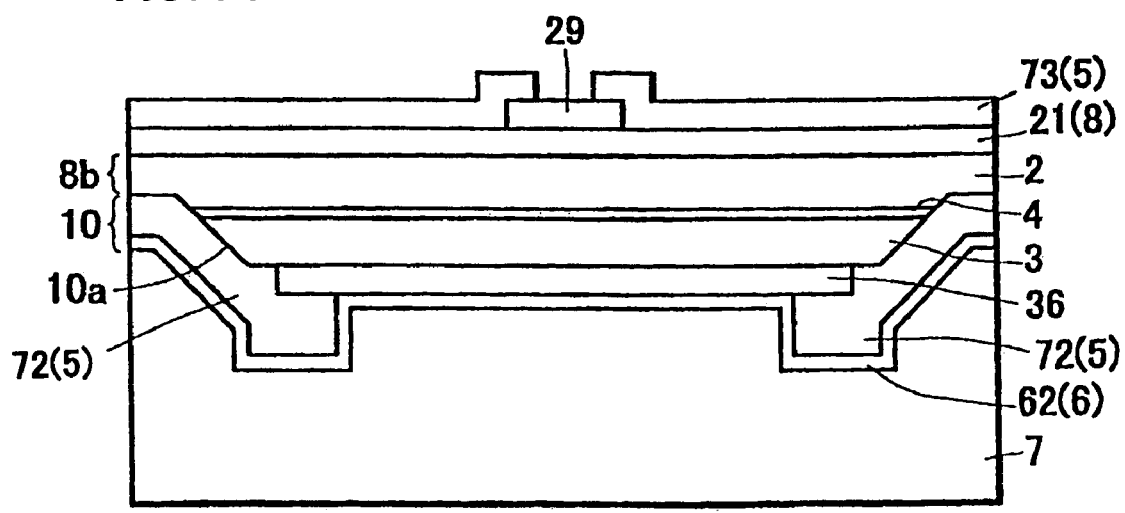
FIG. 34 is a sectional view of a nitride semiconductor light-emitting device according to Embodiment 9 of the present invention.

The device may be mounted on a mounting base (protection element) 10300 by flip chip bonding in such a manner that the electrode side of the device opposes the board, as shown in FIGS. 33A and 33B showing a modification of FIG. 24. In FIG. 33A, the region of the mounting base hidden by the substrate, as well as the exposed regions is designated by solid lines. In this figure, the first side surface and the second side surface of the structured portion in the first aspect of the present invention described above are provided. Specifically, the curvature radius of the corners of the lower surface of the layered portion is smaller than that of the upper surface (the surface of the p-type layer), and the n electrode is formed so as to have larger curves around the structured portions than the curvature radius of the corners of the structured portions. The n electrode 721 (21) covers some 710*x* of the plurality of structured portions 710 (10) up to the upper surfaces to serve as bonding surfaces for bonding 11400*a*, as shown in FIG. 33B. Thus, the device can be mounted on a mounting base or the like in such a manner that the vertical position of the bonding surfaces is aligned with the vertical position of the p electrodes of the other structured portions. The structured portion 710*x* can serve for a non-operational portion which does not work as the device.

Embodiment 6 (Second Aspect)

Figure 17:
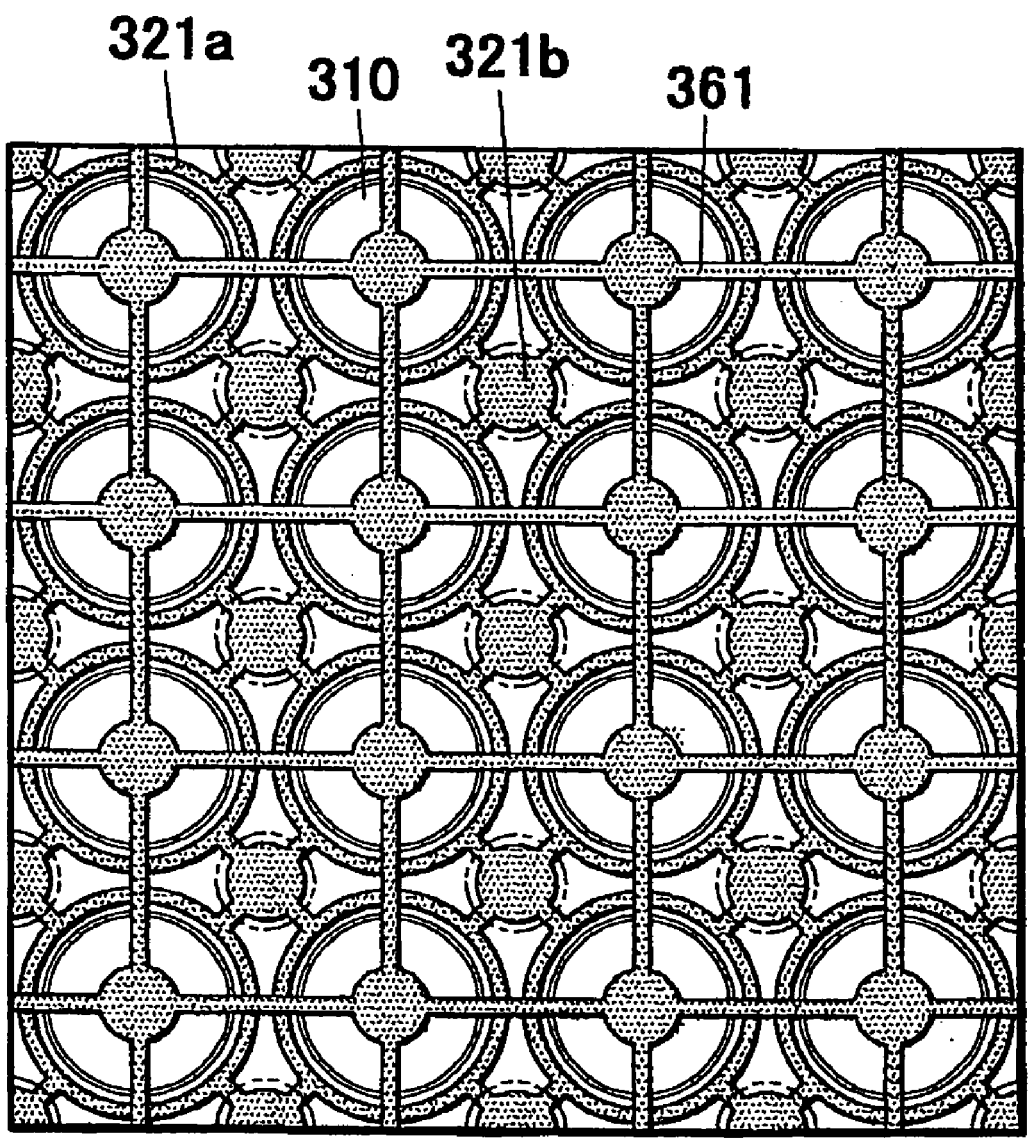
FIG. 17 is a plan view of a light-emitting device according to Embodiment 6 of the present invention.
Figure 18:
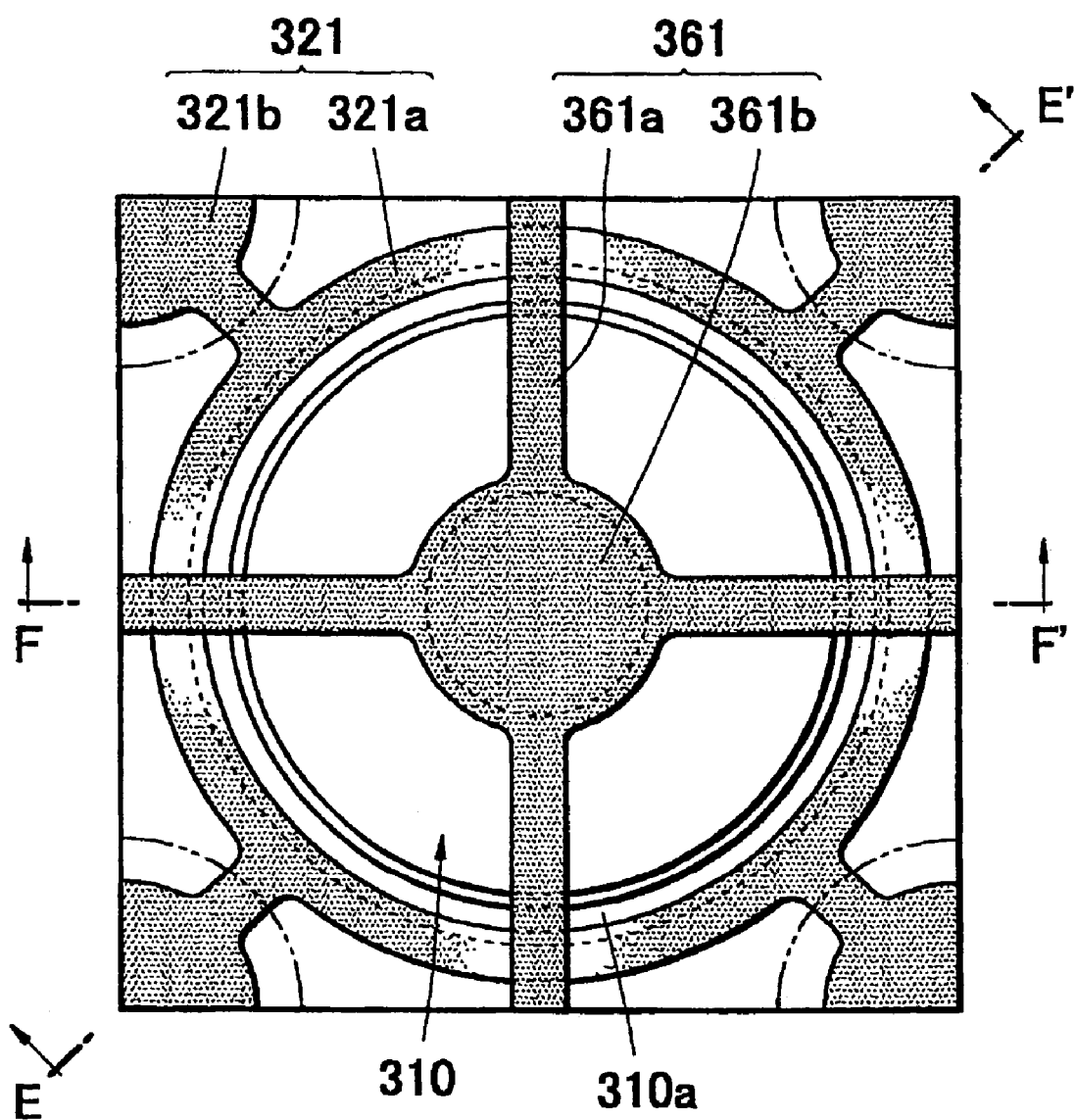
FIG. 18 is an fragmentary enlarged plan view of FIG. 17.
Figure 19:
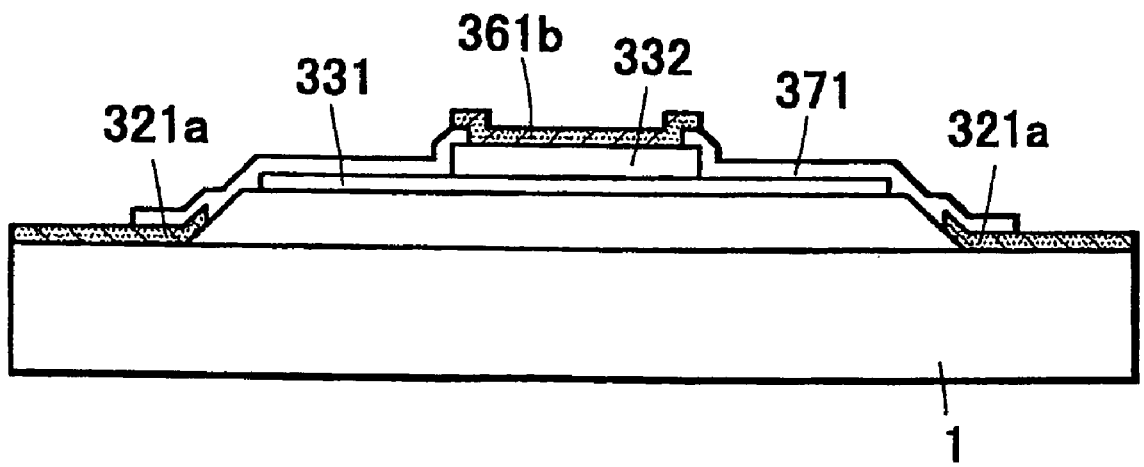
FIG. 19A is a sectional view taken along line E-E' in FIG. 18.
FIG. 19B is a sectional view taken along line F-F' in FIG. 18.
Figure 19:
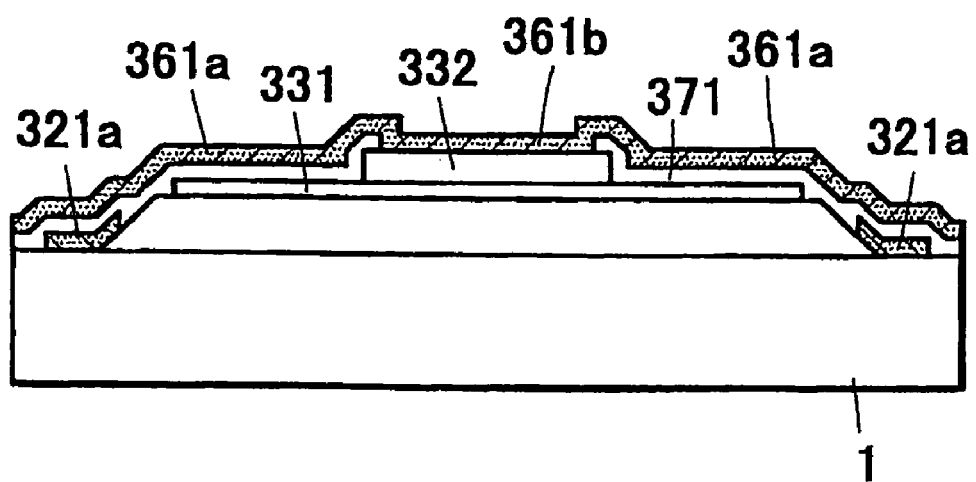

FIG. 17 is a plan view of the arrangement of a nitride semiconductor light-emitting device according to Embodiment 6, and FIG. 18 is a plan view of one of the layered portions 310. FIG. 19A is a sectional view taken along line E-E' in FIG. 18; FIG. 19B is a sectional view taken along line F-F' in FIG. 18.

In the nitride semiconductor light-emitting device of embodiment 6, the layered portions 310 are formed in a circular shape, and arranged such that their centers are aligned in a matrix manner. The layered structure of each layered portion 310 is the same as that of other embodiments, and its periphery is inclined inward (inclined periphery 310a), and the section of the layered portion has a trapezoidal shape whose upper side is defined as the upper base, as shown in FIGS. 19A and 19B.

The n ohmic electrode 321a of each layered portion 310 is formed on the entire circumference of the inclined periphery 310a so as to come into ohmic contact with the n contact layer exposed at the surface of the inclined periphery 310a. In addition, n connecting pad electrodes 321b are disposed on the substrate between the layered portions 310, and the n ohmic electrode 321a of each layered portion 310 is connected to four adjacent n connecting pad electrodes 321b.

Specifically, in the nitride semiconductor light-emitting device of Embodiment 6, the n electrode 321 includes the n ohmic electrodes 321a and the n connecting pad electrodes 321b.

Also, the over-surface electrode 331 is provided over substantially the entire upper surface (upper surface of the p contact layer) of each layered portion 310, and a circular p pad electrode 332 is formed in the center of the over-surface electrode 331.

After forming the n ohmic electrodes 321a, n connecting pad electrodes 321b, over-surface electrodes 331, and p pad electrodes 332 as described above, an insulating layer 371 is formed to cover the entire device except the upper surfaces of the connecting pad electrodes 321b, their surroundings, and the p pad electrodes 332. Then, p connecting electrodes 361 are formed to connect the p pad electrodes 332 of the layered portions 310 to each other. The p connecting electrode 361 includes a pad connecting portion 361b connected to the upper surface of the p pad electrode 332 and a connecting portion 361a connecting the pad connecting portion 361b to another pad connecting portion.

The nitride semiconductor light-emitting device having the above-described structure according to Embodiment 6 can prevent the electrodes from absorbing light and exhibit increased light extraction efficiency, as in Embodiment 1.

In order to examine the light extraction efficiency of the nitride semiconductor light-emitting device of Embodiment 6, the following comparative examinations were conducted.

Figure 25:
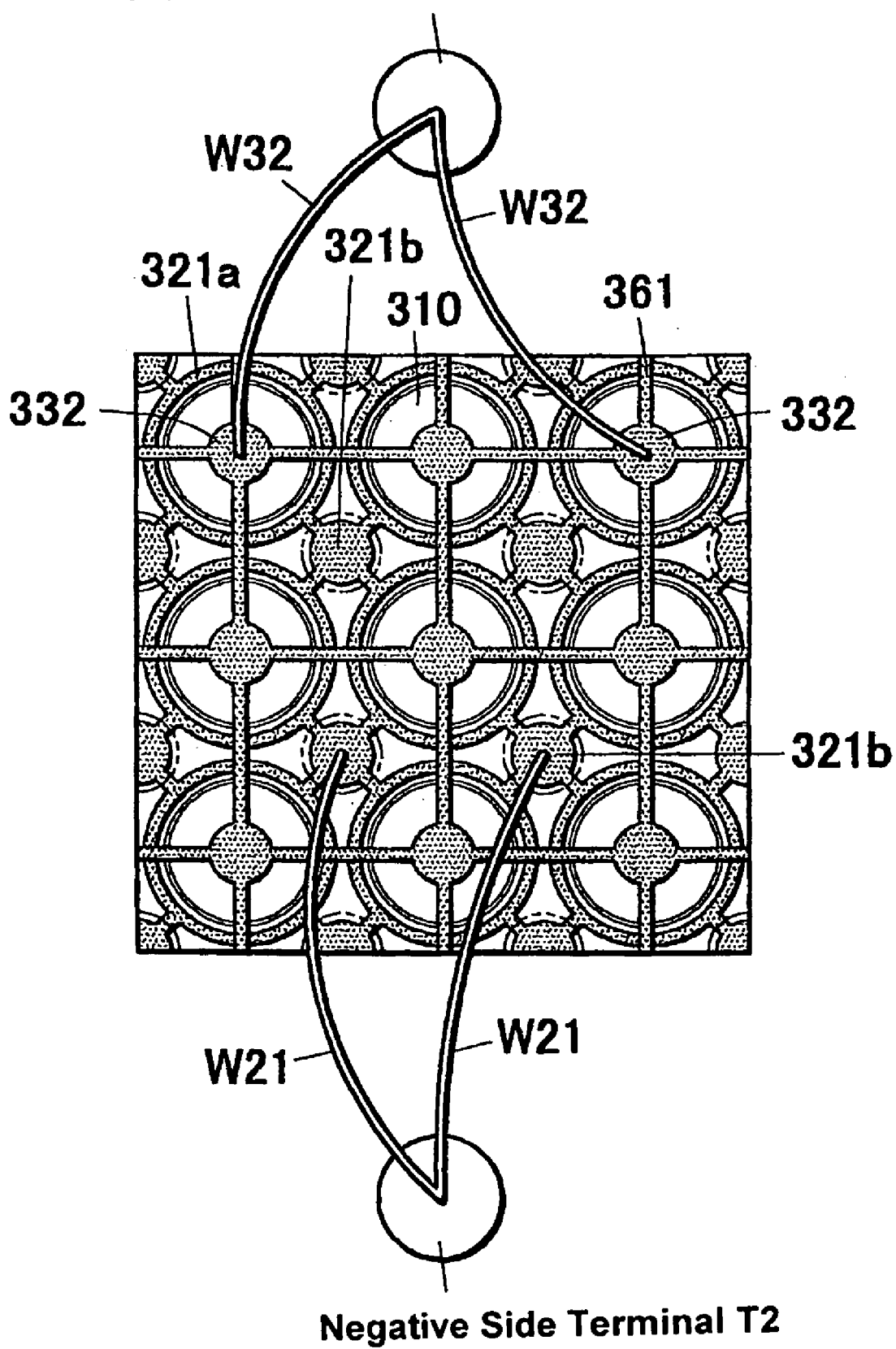
FIG. 25 is a plan view of a light-emitting device used in the measurement of light-extraction efficiency in Embodiment 6 of the present invention.
Figure 28:
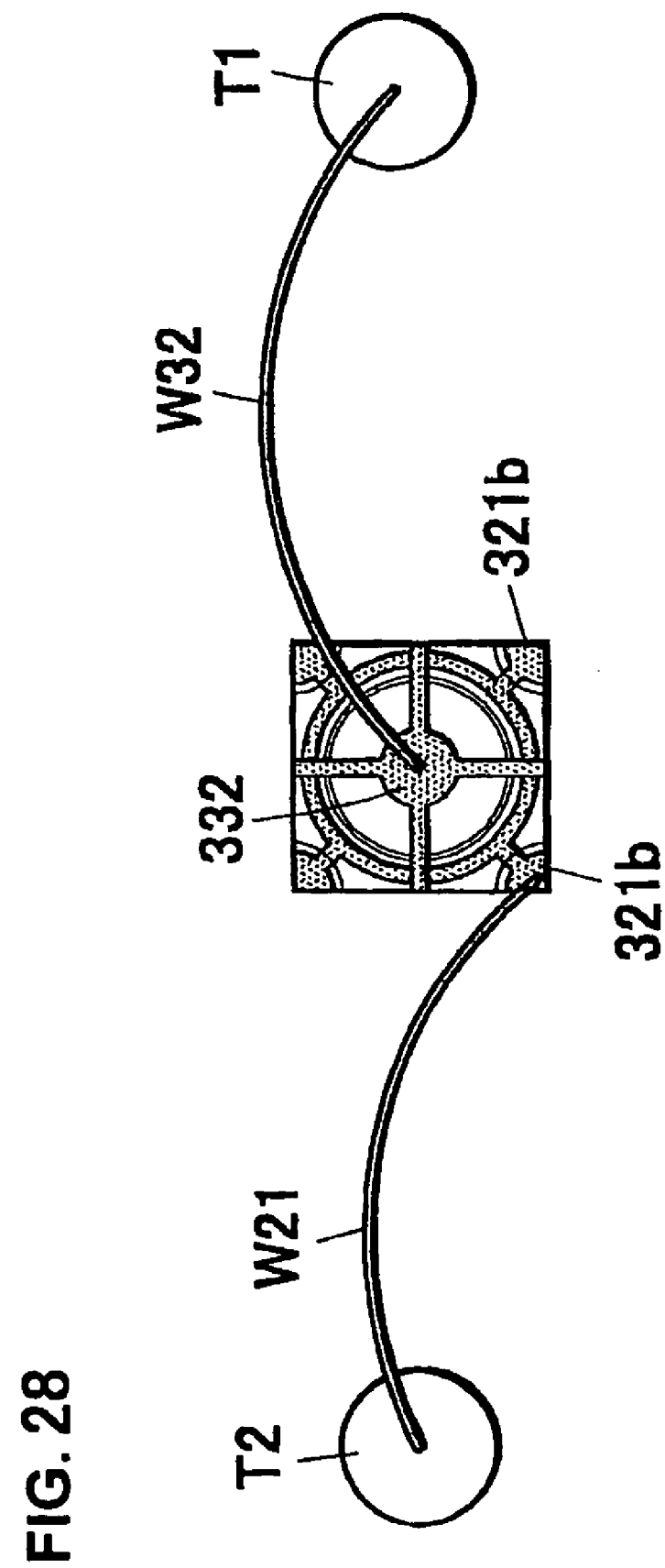
FIG. 28 is a plan view of a light-emitting device used as a reference in the measurement of light-extraction efficiency in Embodiment 6 of the present invention.
Figure 30:
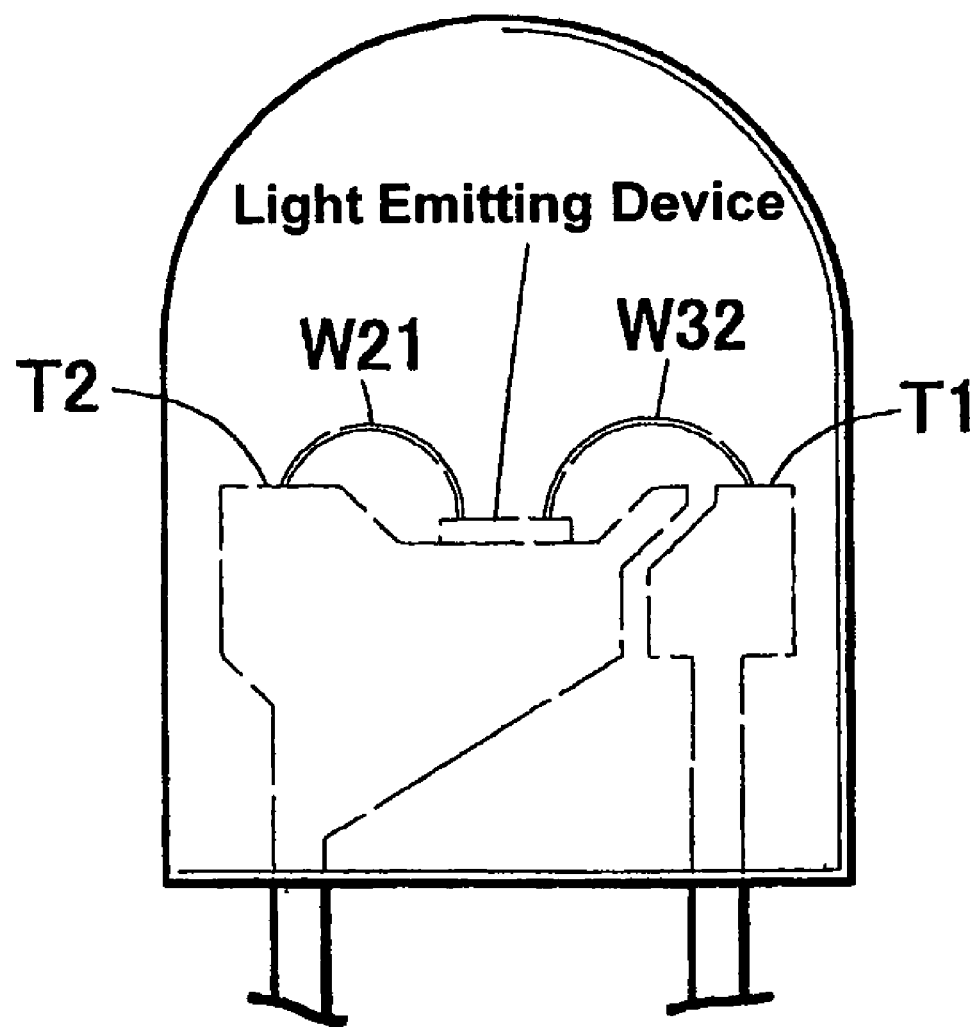
FIG. 30 is a schematic illustration showing the method for measuring the extraction efficiency in Embodiment 6 of the present invention.

Nine (3×3) layered portions 310 were formed to constitute a nitride semiconductor light-emitting device of Embodiment 6, as shown in a plan view FIG. 25, and the extraction efficiency of the nitride semiconductor light-emitting device was compared with that of a light-emitting device having a single layered portion 310 (shown in a plan view FIG. 28).

For the measurement of extraction efficiency, a test piece of the light-emitting device was die-bonded in a cup integrally having a negative terminal. The n pad electrode was connected to the negative terminal T2 with a bonding wire W21, and the p pad electrode was connected to a positive terminal T1 with a bonding wire W32. Then, the quantity of extracted light was measured relative to the quantity of emitted light.

As a result, the device having the nine layered portions 310 of Embodiment 6 (FIG. 25) exhibited an extraction efficiency of 86% when the extraction efficiency of the light-emitting device having the single layered portion 310 (FIG. 28) was assumed to be 100.

Figure 26:
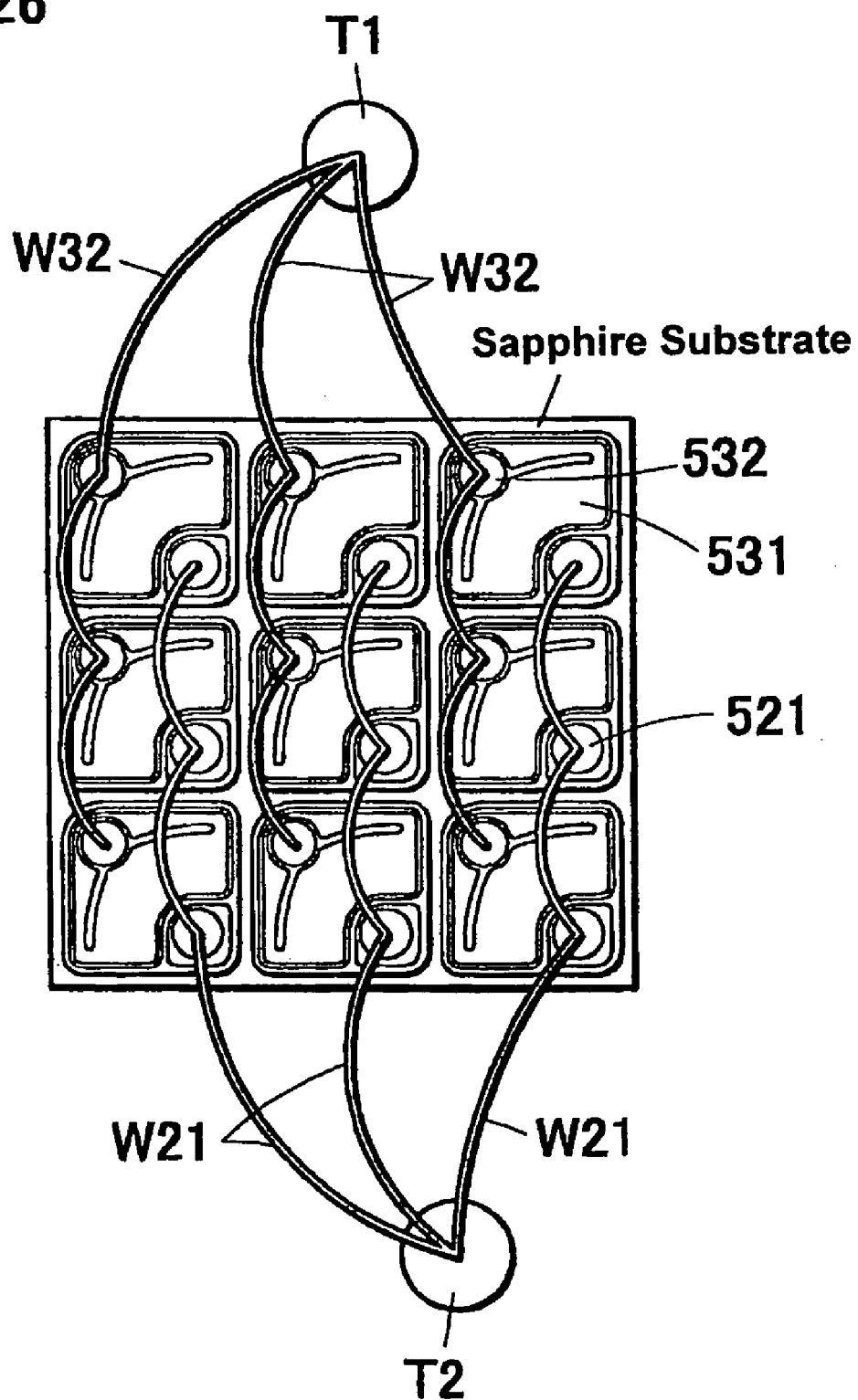
FIG. 26 is a plan view of a light-emitting device used in the measurement of light-extraction efficiency in Comparative Example (1) of Embodiment 6 of the present invention.

On the other hand, a light-emitting device (having nine layered portions) shown in FIG. 26 prepared as a comparative example exhibited a extraction efficiency of 71% when the extraction efficiency of a light-emitting device having a single layered portion shown in FIG. 29A was assumed to be 100.

In the measurements, the extraction efficiencies of the light-emitting device having the single layered portion 310 (FIG. 28) and the light-emitting device having the single layered portion shown in FIG. 29A were substantially the same.

The layered portions of the light-emitting device of the comparative example have the same layered structure as in Embodiment 6, and are formed in a substantially square shape in plan view. In each layered portion, the n electrode 521 is provided on the surface of the n-type contact layer exposed at one corner of the layered portion. The p ohmic electrode 531 is provided over substantially the entire surface of the p-type contact layer, and the p pad electrode 532 is formed on the p ohmic electrode 531 in the corner opposing the n electrode 521. In the device shown in FIG. 26, the spaces between the adjacent layered portions are etched until the sapphire substrate is exposed so that the layered portions are completely separated from each other. The periphery of each layered portion is substantially perpendicular to the upper surface of the sapphire substrate.

As described above, it has been confirmed that the nitride semiconductor light-emitting device having the plurality of layered portions according to Embodiment 6 has a higher extraction efficiency than the nitride semiconductor light-emitting device of the comparative example, which is also of cluster type.

Figure 27:
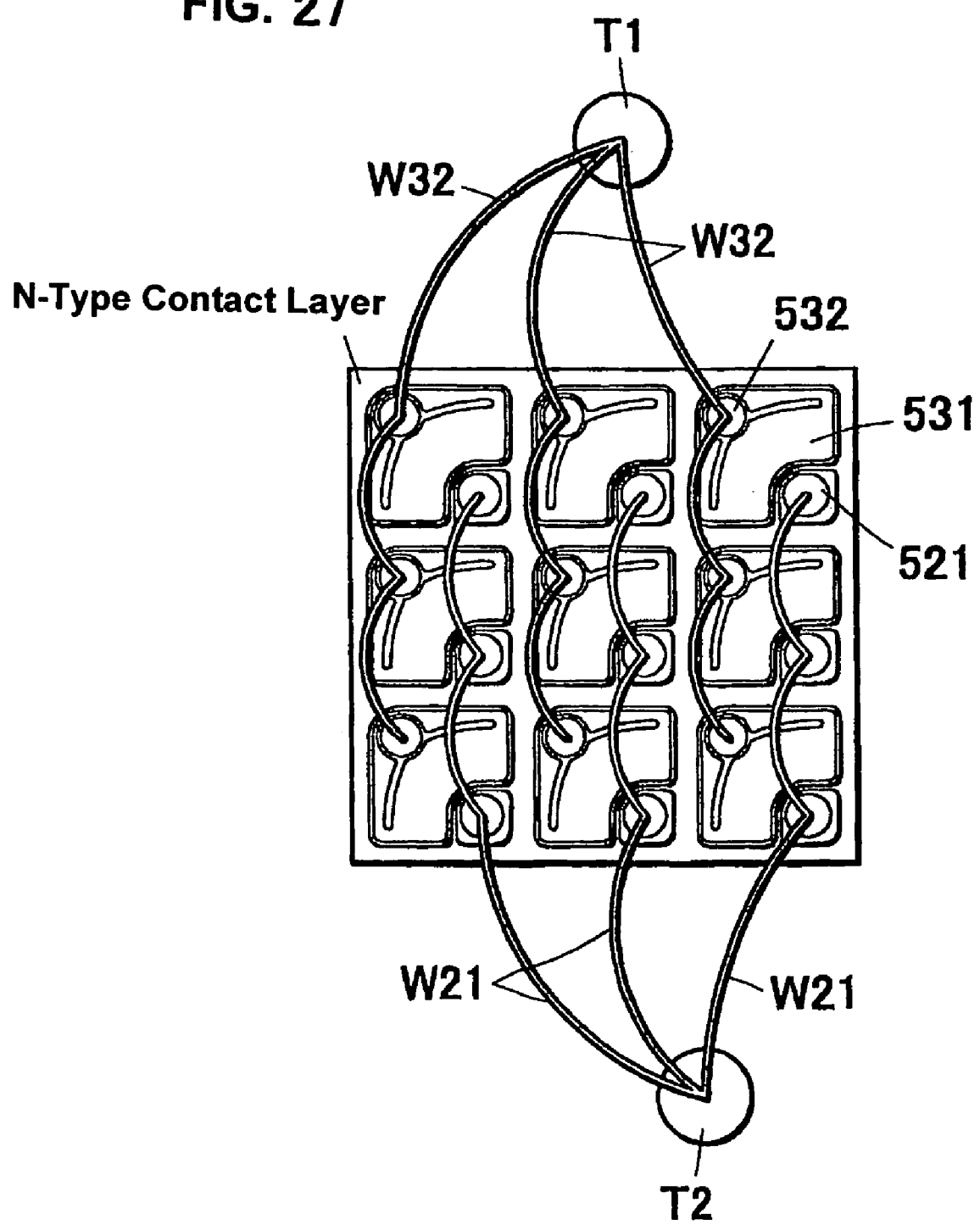
FIG. 27 is a plan view of a light-emitting device used in the measurement of light-extraction efficiency in Comparative Example (2) of Embodiment 6 of the present invention.

FIG. 27 shows a device of another comparative example in which the spaces between the layered portions are not etched until the sapphire substrate is exposed and the n-type contact layer remains. The light extraction efficiency of the device of this comparative example shown in FIG. 27 was 68% when the extraction efficiency of the light-emitting device having the single layered portion shown in FIG. 29B was assumed to be 100.

In the measurement, the extraction efficiencies of the device shown in FIG. 29A and the device shown in FIG. 29B were substantially the same.

As described above, the light-emitting devices having a plurality of layered portions of both the comparative examples exhibited lower extraction efficiencies than the extraction efficiency of the light-emitting device of Embodiment 6.

The nitride semiconductor light-emitting device of Embodiment 6 produces the same effects as the light-emitting device of Embodiment 5, and further has the following characteristic features.

Since a device including a desired number of layered portions can be cut out to a desired size from a wafer having layered portions 310 on an as-needed basis, devices with desired sizes can be produced using a single pattern.

In this instance, the n connecting pad electrode 321b and the pad connecting portion 361b in any position may be used as the bonding electrodes.

The nitride semiconductor light-emitting devices of the above-described embodiments may emit light through the substrate or through the semiconductor side. In either case, it is preferable that a reflection layer be provided on the side opposite to the light-emitting side. In the structures shown in FIGS. 7, 8, 16A and 16B, the n electrode 24, electrode 26, or electrode 265 can be used as a reflection layer, as described above. In the other structures, it is preferable that a reflection layer be additionally provided. The reflection layer may be formed of a metal having a high reflectance, or a dielectric multilayer film. If a dielectric multilayer film is used, the insulating layer 271 in FIG. 13, for example, is given reflectivity in addition to insulation performance.

Embodiment 7 (Second Aspect)

Figure 31:
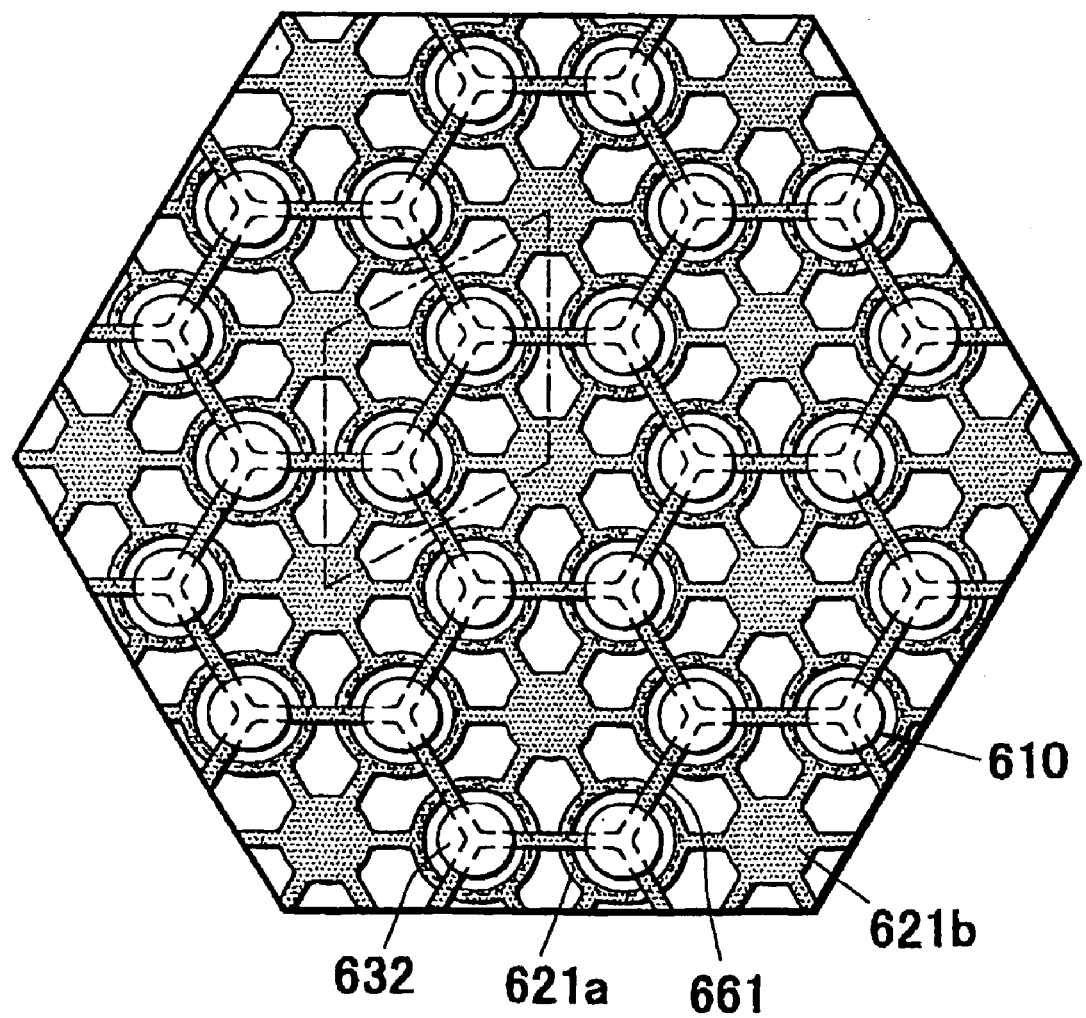
FIG. 31 is a plan view of a light-emitting device according to Embodiment 7 of the present invention.
Figure 32:
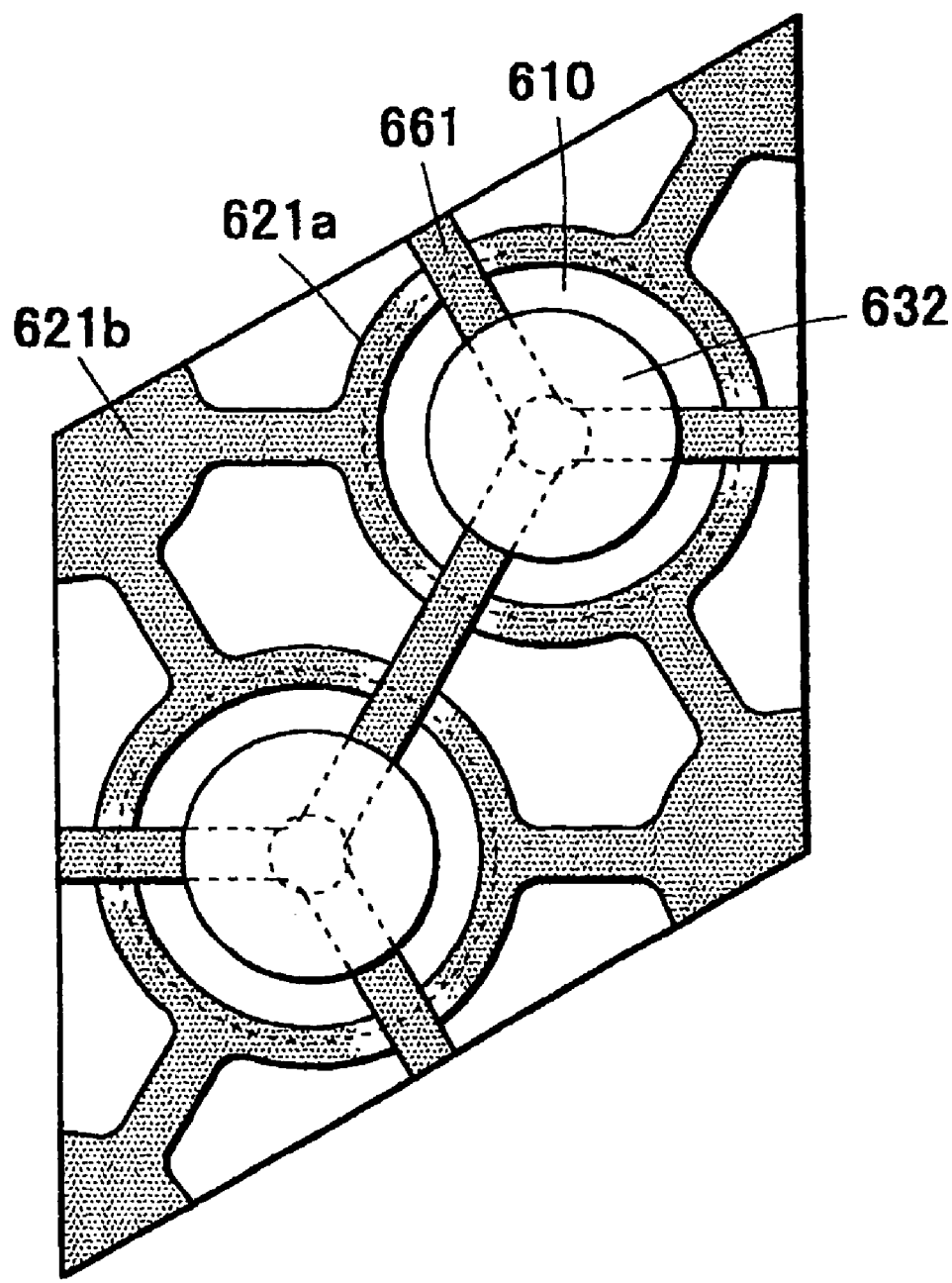
FIG. 32 is a fragmentary enlarged plan view of the light-emitting device according to Embodiment 7.

FIG. 31 is a plan view of the arrangement of a nitride semiconductor light-emitting device according to Embodiment 7. In the nitride semiconductor light-emitting device of embodiment 7, the layered portions 310 are formed in a circular shape, and arranged on a substrate such that their centers lie at vertices of hexagons to form a hexagonal grid. The layered structure of the layered portions 610 is the same as in other embodiments, and the peripheries are inclined inward.

The n ohmic electrode 621*a* of each layered portion 610 is formed on the entire circumference of the inclined periphery so as to come into ohmic contact with the n contact layer exposed at the surface of the inclined periphery. In addition, an n connecting pad electrode 621*b* is disposed in the center of each hexagon defined by six layered portions 610 of the hexagonal grid, and the n ohmic electrode 621*a* of each layered portion 610 is connected to three adjacent n connecting pad electrodes 321*b*.

Specifically, in the nitride semiconductor light-emitting device of Embodiment 7, the n electrode includes the n ohmic electrodes 621*a* and the n connecting pad electrodes 621*b*.

Also, the over-surface electrode is provided over substantially the entire upper surface (upper surface of the p contact layer) of each layered portion 610, and a circular p pad electrode 632 is formed in the center of the over-surface electrode. The p pad electrodes 632 of the layered portions 610 are connected to each other with p connecting electrodes 661.

The n electrode including the n ohmic electrodes 621*a* and the n connecting pad electrodes 621*b* is electrically insulated from the p electrode including the over-surface electrodes 631, the p pad electrodes 632, the p connecting electrodes 661, as in Embodiment 6.

In the above-described nitride semiconductor light-emitting device of Embodiment 7, two layered portions are assigned for each n connecting pad electrode 621*b*. This structure can increase the area of the luminescent region as a whole in comparison with the structure of Embodiment 6, in which one layered portion is assigned for each n connecting pad electrode.

The layered portion arrangement as in Embodiment 7 can be divided into portions having an outside shape of triangle, hexagon, rhombus, parallelogram, or the like. In this instance, the crystallographic axis of GaN crystals can be aligned with the direction of scribing lines. Thus, the yield in a step of dividing can be increased.

A process for forming the layered portion having an inclined periphery of the nitride semiconductor light-emitting devices of the above-described embodiments will now be described.

Figure 20:
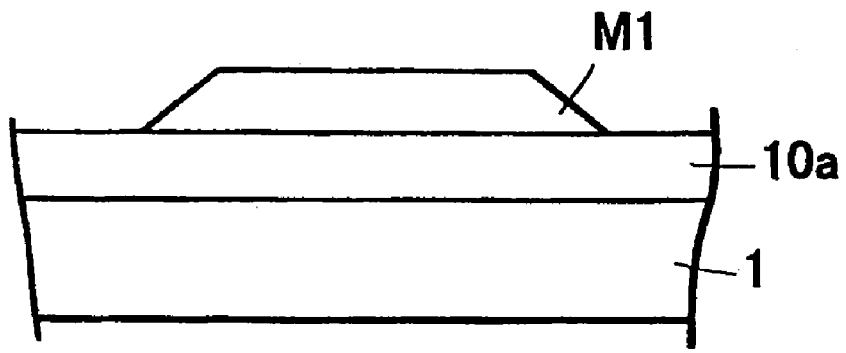
FIGS. 20A to 20C show a process for forming a layered portion having an inclined periphery of a nitride semiconductor light-emitting device according to the present invention.
Figure 20:
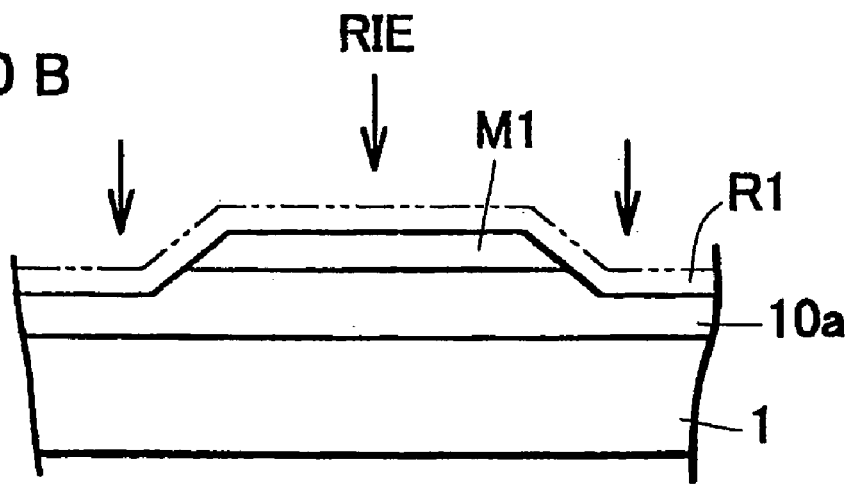
Figure 20:
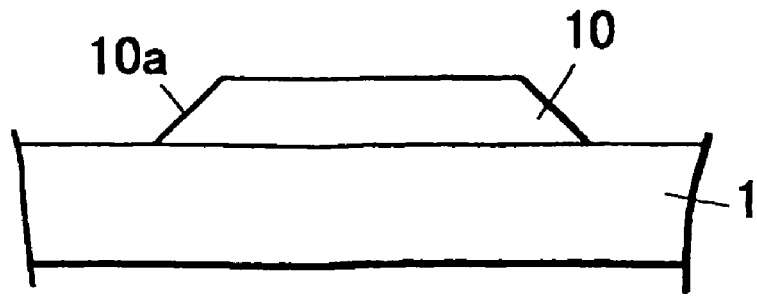

In the process, the buffer layer 11, the n-type contact layer 12, the n-type cladding layer 13, the luminescent layer 14, the p-type cladding layer 15, and the p-type contact layer 16 are deposited in that order on the sapphire substrate 1 to form a layered structure, and a mask M1 having a trapezoidal shape in sectional view is formed on the layered structure, as shown in FIG. 20A.

Then, the layered portion is etched from above the mask M1 by reactive ion etching. Here the mask is also gradually etched simultaneously with the etching of the layered portion.

The region designated by reference numeral R1 between the broken line and the solid line in FIG. 20B is removed.

The etching is continued until the surface of the substrate is exposed around the layered portion 10 (FIG. 20C).

Thus, the layered portion 10 having an inclined periphery 10*a* and a shape according to the shape of the mask M1 is formed.

In the process, the shape of the mask M1 is determined in consideration of the RIE rates of the mask material and the nitride semiconductor materials. Thus, the layered portion having a desired, inclined periphery can be formed.

For example, a mask M1 having a periphery protuberating outward leads to a layered portion having a convex surface protuberating outward.

By forming the inclined periphery to a convex protuberating outward, light can be concentrated to emit if it is emitted through the substrate.

The above-described embodiments have been described using devices which are etched around the layered portion to such a depth as to reach the surface of the substrate. However, the n-type semiconductor layer may remain with a thickness capable of preventing the transmission of light because, in the present invention, it is important to prevent light from being transmitted to the region around the layered portion.

(Third Aspect)

Embodiments of a nitride semiconductor light-emitting device according to a third aspect will now be described with reference to the drawings.

Embodiment 8 (Third Aspect)

A nitride semiconductor light-emitting device according to Embodiment 1 has nitride semiconductor layers defining the luminescent region which are partially embedded into a metal member 7, and the metal member 7 supports the entire light-emitting device.

In the nitride semiconductor light-emitting device of Embodiment 8, a luminescent layer 4 is disposed between a n-type nitride semiconductor layer 2 and a p-type semiconductor layer 3 to define a double heterostructure luminescent region. The p-type nitride semiconductor layer, the luminescent layer, and part of the n-type nitride semiconductor layer are formed in frustum shapes. In other words, the third aspect of the present invention leads to a device having a frustum layered composite including at least a p-type nitride semiconductor layer and a luminescent layer. A p-type ohmic electrode 36 is formed over substantially the entire surface of the p-type nitride semiconductor layer 3 of the layered composite 10, and an insulating layer 72(5) covering the surroundings of the p-type ohmic electrode 36, the inclined periphery 10*a* of the layered composite 10, and the n-type semiconductor layer 2 (8*b*) continuing to the periphery 10*a*.

The layered composite 10 having this structure is embedded into a metal member 7 to be supported. In this structure, the insulating layer 72 separates the periphery of the layered composite 10 from the metal member 7, and the surface having the p-type ohmic electrode 36 of the layered composite 10 opposes the metal member 7 with the p-type ohmic electrode 36 therebetween. In addition, a transparent electrode 21 is provided on one surface of the opposing two surfaces of the p-type nitride semiconductor layer 2, opposite to the layered composite 10, and an n pad electrode 29 is provided on part of the transparent electrode 21.

In the nitride semiconductor light-emitting device of Embodiment 8 having the above-described structure, light emitted from the luminescent layer 4 of the layered composite 10 comes out through the transparent electrode 21 on the opposite side of the metal member 7.

A process for manufacturing the nitride semiconductor light-emitting device of Embodiment 8 will now be described.

Figure 35:
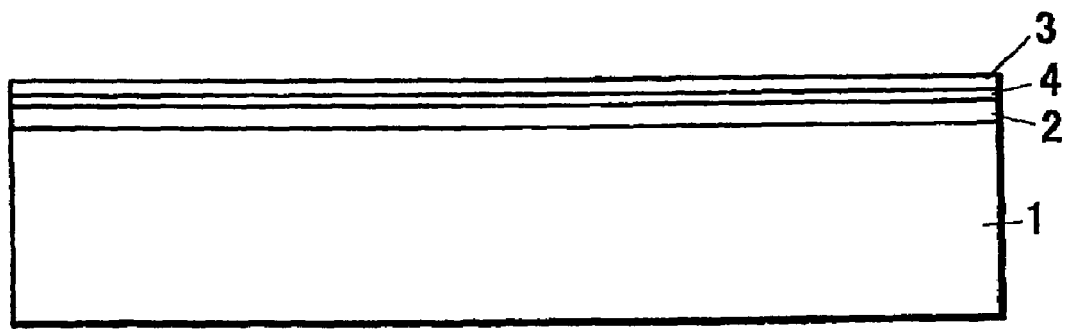
FIG. 35 is a sectional view of a step after forming a semiconductor layers on a sapphire substrate in a method for manufacturing a nitride semiconductor light-emitting device according to Embodiment 9 of the present invention.

In the process, first, the n-type nitride semiconductor layer 2, the luminescent layer 4, and the p-type nitride semiconductor layer 3 are deposited, in that order, on the sapphire substrate 1 with, for example, a buffer layer (not shown) between the sapphire substrate 1 and the n-type semiconductor layer 2, as shown in FIG. 35.

Figure 36:
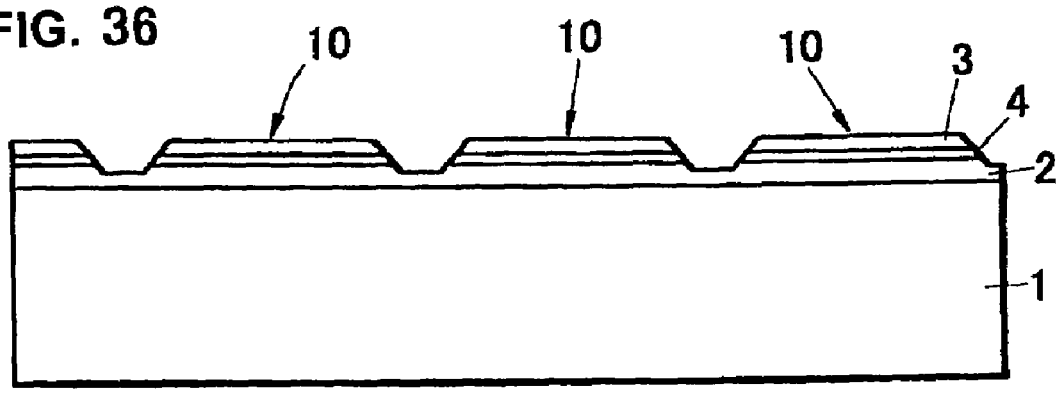
FIG. 36 is a sectional view of a step after etching the semiconductor layers on a sapphire substrate in the method according to Embodiment 9.
Figure 37:
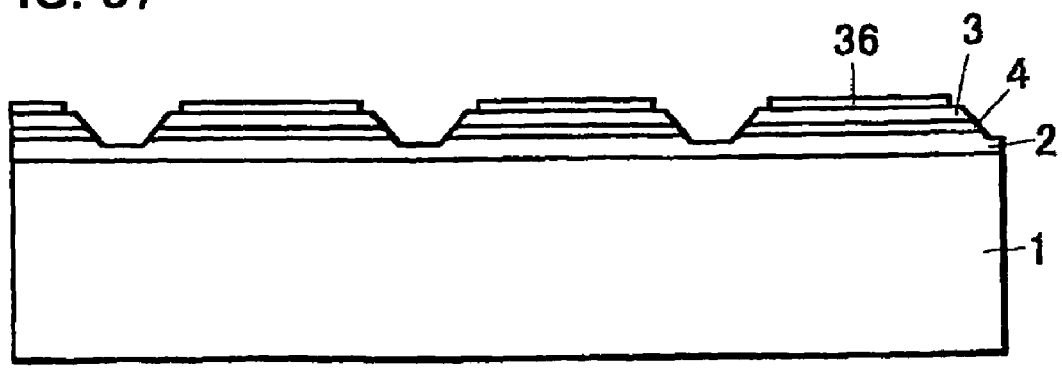
FIG. 37 is a sectional view of a step after forming (p) electrodes on layered composites in the method according to Embodiment 9.

Then, the frustum layered composites 10 are formed by etching the layers until the n-type nitride semiconductor layer is exposed between the devices (FIG. 36).

The etching for the frustum layered composites 10 can be performed using a mask formed in a predetermined frustum, and the layered composites are formed in a frustum shape according to the shape of the mask.

Figure 44:
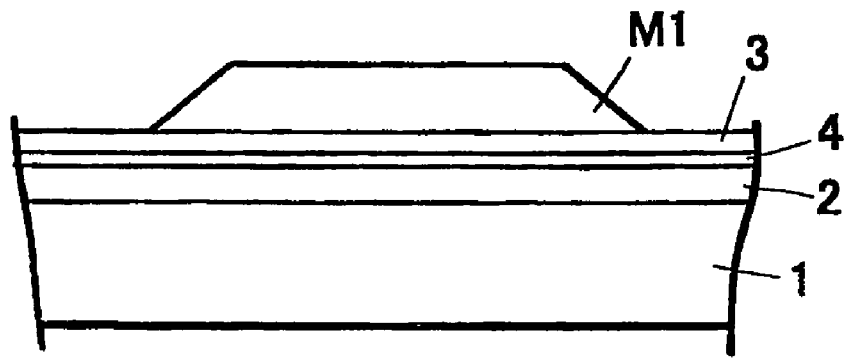
FIGS. 44A to 44C are sectional views of steps for forming a frustum layered composite according to Embodiment 9.
Figure 44:
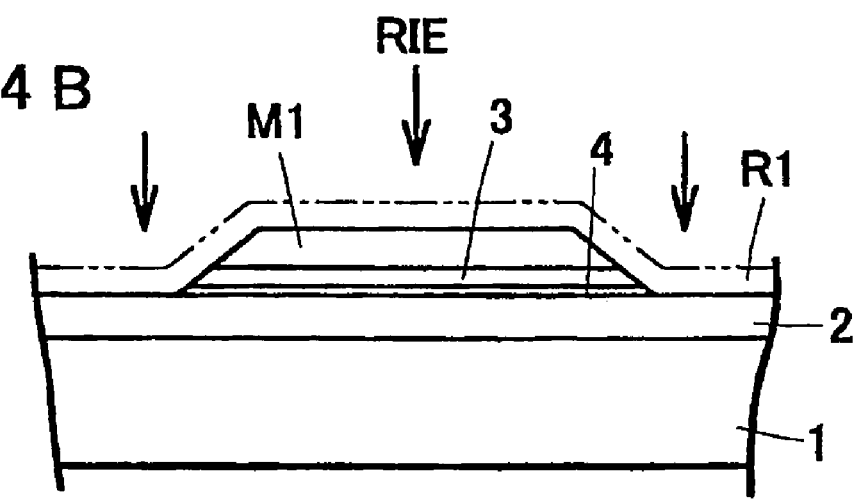
Figure 44:
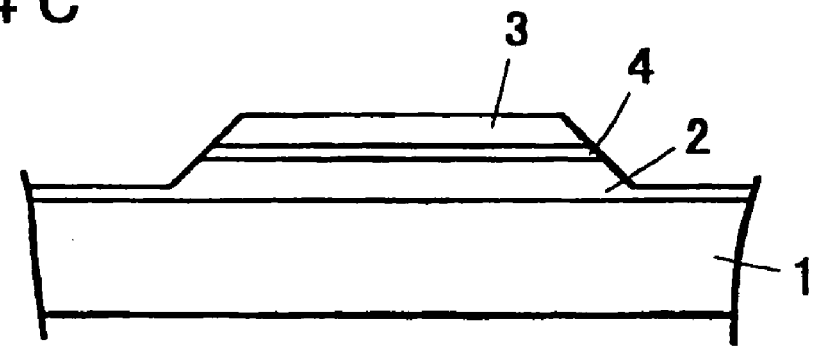

More specifically, first, a mask M1 having a trapezoidal shape in sectional view is formed on the p-type nitride semiconductor layer 3, as shown in FIG. 44A. The mask M1 is made of a material capable of being etched at a constant rate by reactive ion etching.

Then, the semiconductor layers (p-type nitride semiconductor layer 3, luminescent layer 4, and n-type nitride semiconductor layer 2) on the sapphire substrate 1 are etched from above the mask M1. The mask M1 is gradually removed together with the semiconductor layers in this etching step. The region designated by reference numeral R1 between the broken line and the solid line in FIG. 44B is removed.

The etching is continued until the surface of the n-type nitride semiconductor layer 2 is exposed around the layered portions 10 (FIG. 44C).

Thus, the frustum layered portions 10 are formed according to the shape of the mask M1.

In the process, the shape of the mask M1 is determined in consideration of the RIE rates of the mask material and the nitride semiconductor materials. Thus, the layered portions 10 having a desired frustum shape can be provided.

The layered composites 10 may be formed by other dry etching than reactive ion etching, such as reactive ion beam etching or ion milling.

For the formation of the frustum layered portions 10, isotropic etching, such as wet etching, may be adopted to take an advantage of an undercut (side-etching) phenomenon. The undercut facilitates the formation of frustum, but the processing precision is inferior to the processing by the above-mentioned dry etching.

The inclination angle of the periphery 10a of the layered composite 10 (angle formed with the main surface of the sapphire substrate 1) is preferably set in the range of 30° to 80°, and more preferably at 45°, from the viewpoint of increasing the efficiency in extracting light emitted through the n-type nitride semiconductor layer.

The frustum may be in a frustum of a cone, a pyramid (tetragonal pyramid, hexagonal pyramid, or the like), or other shape.

After forming the frustum layered portions 10 as above, the p-type ohmic electrode 36 is formed over substantially the entire surface of the upper base (surface of the p-type nitride semiconductor layer 3) of each layered portion 10.

The upper base herein refers to a surface with a smaller width of the opposing parallel surfaces of the frustum; the lower base of the layered composite 2, the other surface with a larger width.

Although the p-type ohmic electrode 36 may be made of Ni/Au, Ni/Pt, or Pd/Pt, the p-type ohmic electrode 36 is preferably constituted of, for example, Rh/Au or Rh/Pt so that the Rh layer comes into contact with the p-type nitride semiconductor layer 3. By providing the Rh layer as a first layer in contact with the p-type nitride semiconductor layer 3, the p-type ohmic electrode 36 is prevented from separating from the p-type nitride semiconductor layer 3 after forming the metal member 7.

The combinations of the constituents using "/" mean that the metal antecedent to the "/" is the first layer in contact with the p-type nitride semiconductor layer 3, and that the metal following the "/" is a second layer on the first layer.

Figure 38:
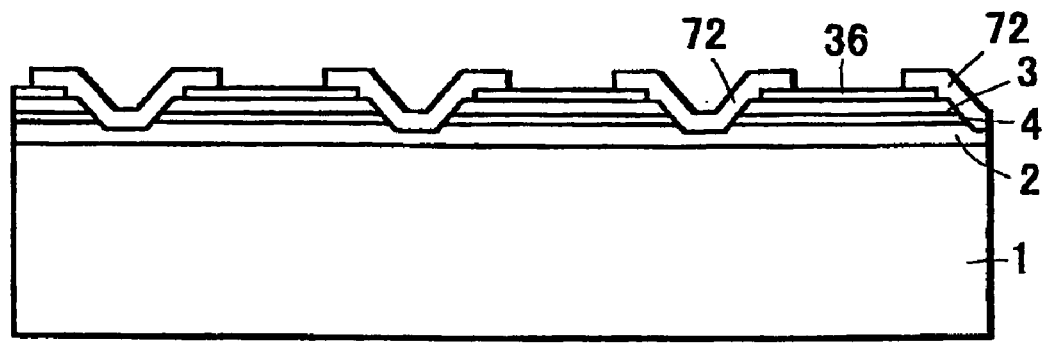
FIG. 38 is a sectional view of a step after forming an insulating layer 5 in the method according to Embodiment 9.

After the formation of the p-type ohmic electrode 36 on the p-type nitride semiconductor layer of each layered composite 10, the insulating layer 72(5) is formed over the entire substrate except the central area (other than the surroundings) of the p-type ohmic electrode 36, as shown in FIG. 38.

While the insulating layers 72, 73, and 5 are suitably formed of an inorganic insulating film, such as $SiO_2$, $TiO_2$, $Al_2O_3$, $Si_3N_4$, or $ZrO_2$, an organic insulating film may be used.

Figure 39:
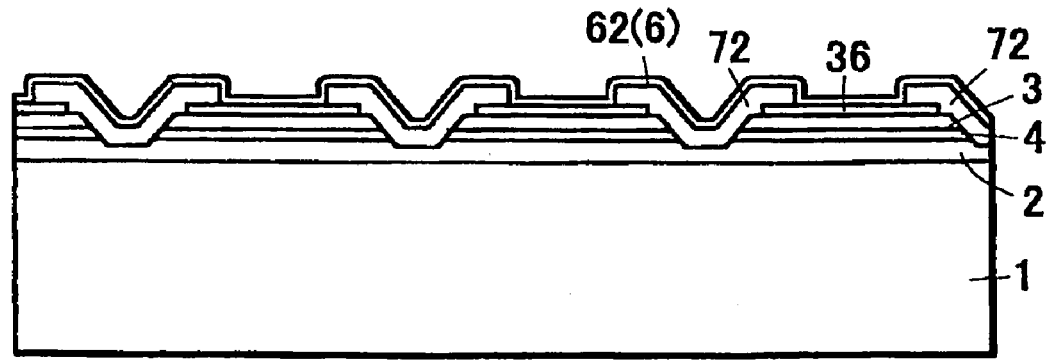
FIG. 39 is a sectional view of a step after forming a reflection layer 6 in the method according to Embodiment 9.

Then, wiring electrodes 62 are formed between the layered portions 10 as required (FIG. 39).

Subsequently, a reflection later 62(6) is formed. The reflection layer 6 is made of a light-reflective material, such as Ag, Pt, Rh, or Al. For a light-emitting device including a plurality of the layered portions, the reflection layer 6 may double as the wiring electrode. In particular, since the reflection layer is provided so as to oppose the inclined peripheries of the frustum layered composites, the efficiency in use of light can be dramatically increased.

The insulating layer 5 (72, 73) may double as the reflection layer.

Materials of the insulating layer serving as the reflection layer include $SiO_2$, $TiO_2$, $Al_2O_3$, $Ta_2O_5$, $ZrO_2$, $Nb_2O_5$, and $Y_2O_3$. Preferably, the insulating layer 5 has a multilayer structure in which two materials having different refractive indices selected from these materials are alternately deposited. For example, 10 to 20 layers of a combination of $TiO_2/SiO_2$ are deposited on top of one another to define a multilayer reflection layer.

Figure 40:
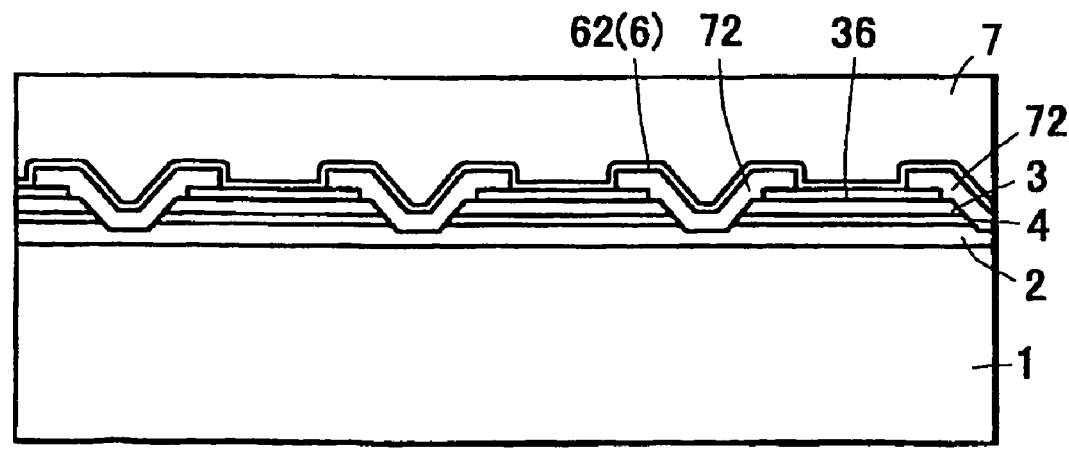
FIG. 40 is a sectional view of a step after forming a metal member 7 in the method according to Embodiment 9.

Then, the metal member 7 is formed over the entire surface by, for example, plating (FIG. 40). In the present invention, the metal member 7 is principally intended to support the light-emitting device after the sapphire substrate 1 is removed in a subsequent step. The thickness of the metal member 7 must be large (preferably 50 μm or more, more preferably in the range of 100 to 200 μm).

In the present invention, in order to achieve the primary function of the metal member 7, it may be formed of various metals, such as Ti, Ag, Al, Ni, Pt, Au, Rh, Cu, and W.

In Embodiment 8, the metal member 7 needs to have high adhesion to the reflection layer 6. If there is no reflection layer 6, the metal member 7 is required to have adhesion to the insulating layer 5 (73) and the p-type ohmic electrode 36, particularly to the insulating layer 5 (73). For such a case, materials having superior adhesion to the insulating layer 5 (73) made of the above-described materials include Ti, W, Al, and Ni.

If the metal member 7 is formed of a reflective material, the reflection layer 6 may be omitted. Such metals include Ag, Al, Pt, and Rh.

In the present invention, the metal member 7 may function to reflect light in addition to its primary function. In this instance, the metal member 7 may be defined by a plurality of layers having respective functions. For example, the metal member 7 includes a first metal film as an underlayer, having a high reflectance for emitted light and superior adhesion to the insulating layer 5, p-type ohmic electrode 36, and the like; and a second metal film capable of having a large thickness on the first metal film.

Since the metal member 7 needs to have a relatively large thickness, it is preferably formed by electroless plating having high deposition speed or electroplating.

Specifically, electroplating, such as of Ni, Cu, Al, or Au, or electroless plating, such as of Ni or Cu, may be applied.

In particular, electroless Ni plating is suitable because it can give a higher strength than the strength of Au, Cu, and Ag to reduce warpage of wafers, and because it does not require any electrical contact. In addition, Ni is superior in uniformity of the plating layer, deposition speed, solder wettability, bump strength, and corrosion resistance.

Figure 41:
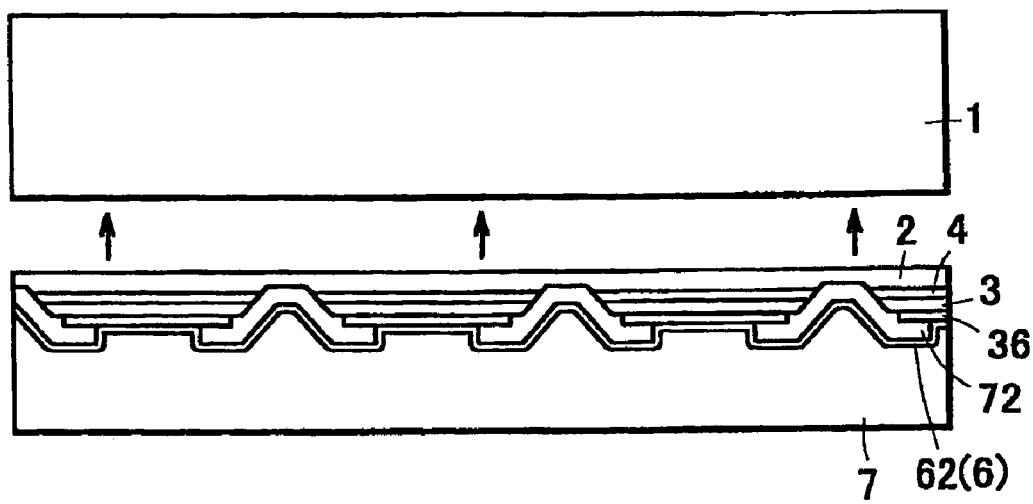
FIG. 41 is a sectional view of a step after removing a substrate 1 used for depositing the layered composite 10 in the method according to Embodiment 9.

Then, the sapphire substrate 1 is removed by exposing the substrate 1 to a laser beam, as shown in FIG. 41. Since the relatively thick metal member 7 has been provided up to this stage, the substrate 1 may be removed by various techniques, such as grinding and etching, in addition to laser beam exposure.

Figure 42:
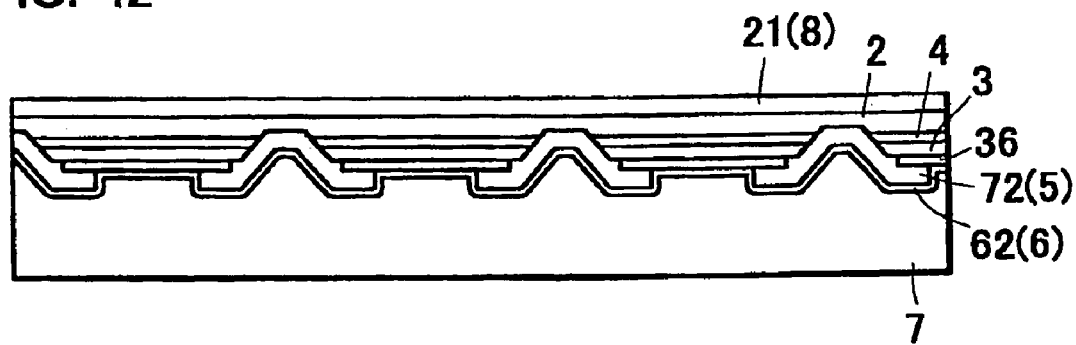
FIG. 42 is a sectional view of a step after forming a transparent electrode on n-type nitride semiconductor layers (second conductivity type layers) 2 subsequent to the removal of the substrate 1 for depositing the layered composite 10, in the method according to Embodiment 9.
Figure 43:
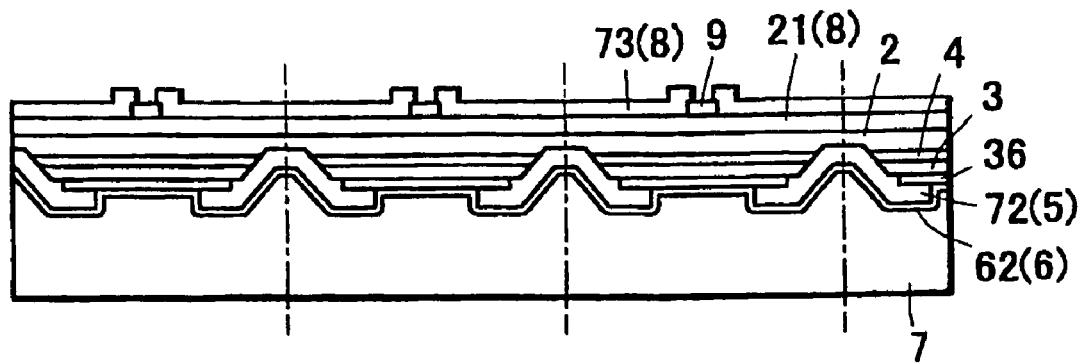
FIG. 43 is a sectional view of a step after forming n pad electrodes and insulating layers 4 subsequent to the formation of the transparent electrode, in the method according to Embodiment 9.

The surface of the n-type nitride semiconductor layer 2 exposed by removal of the substrate is covered with a n-type electrode 21 (8) (FIG. 42). The n-type electrode 21 (8) may be formed of W/Al, V/Al, W/Pt/Au, ZnO, ITO, Mo, or the like. ZnO and ITO are suitable for increasing the light extraction efficiency, and ITO is also advantageous because of its availability.

For an ITO transparent electrode 21 (8), heat treatment is preferably applied to reduce the resistance. Preferred heat treatment temperature is 100 to 500° C., and more preferably 200 to 400° C.

Then, n pad electrode 29 is provided to each layered composite 10, and an insulating layer 72 (5) is formed to cover the peripheries of the n pad electrodes 29 and the transparent electrode 21 (8).

Subsequently, the wafer is divided between the layered portions into light-emitting devices.

In the present invention, the division into devices is performed away from the inclined peripheries 10a of the layered composites 10 so that the inclined periphery 10a is away from the periphery of the resulting device after division.

Since the nitride semiconductor light-emitting device according to Embodiment 8 of the present invention is cut out along positions separate from the inclined periphery 10a of the layered composite 10, the interface of the PN junction at the inclined periphery of the layered composite 10 is not damaged.

Also, since the cutting position for dividing into devices is away from the inclined periphery 10a of the layered composite 10, short-circuiting at the interface of the PN junction can be prevented, which is caused by chips produced by cutting the metal member 7.

In the nitride semiconductor light-emitting device according to Embodiment 8 of the present invention, the electrodes are disposed so as to be separated by the layered composite 10. It is therefore unnecessary to remove the luminescent layer to form one of the electrodes, unlike a device having the electrodes on one side. Thus, since the luminescent region can be secured without reducing the area of the luminescent layer, the luminous efficiency can be increased.

Also, in the nitride semiconductor light-emitting device according to Embodiment 8 of the present invention, the electrodes are disposed with the layered composite 10 therebetween. It is therefore easy to apply current to the entire luminescent layer uniformly, and thus the entire luminescent layer can uniformly and efficiently emit light.

In particular, if the light-emitting device includes a plurality of layered portions, it can exhibit superior uniformity in the light-emitting surface over a relatively large area.

Furthermore, since in the nitride semiconductor light-emitting device according to Embodiment 8 of the present invention, the transparent electrode 21 (8) is provided over substantially the entire surface of the n-type nitride semiconductor layer, current can be uniformly injected to the entire luminescent layer, and thus the entire luminescent layer can uniformly emit light.

However, the invention is not limited to this, and an n-type electrode in a network (grid) may be provided over substantially the entire surface of the n-type nitride semiconductor layer so that light is emitted through the spaces between the grids, or an n-type electrode may be provided to part of the n-type nitride semiconductor layer.

Since the n-type semiconductor layer has a lower resistance than the p-type nitride semiconductor layer, current is easily diffused in the n-type nitride semiconductor layer. Accordingly, even if a grid n-type electrode is used, the grid (the area of regions where the electrode is not formed) can be increased, so that the electrode does not block emitted light much. Also, even if an n-type electrode is provided to part of the n-type nitride semiconductor layer, current can be injected to a luminescent layer having a relatively large area.

Modification (Third Aspect, Modification of the Eighth Embodiment)

In the above-described Embodiment 8, the n-type nitride semiconductor layer 2 is etched partway in the thickness direction, so that the layered composite includes at least part of the n-type semiconductor layer. However, the invention is not limited to this. Only the p-type nitride semiconductor layer 3 and luminescent layer 4 may be etched to define a layered portion 810-1, as shown in FIG. 45. Alternatively, after etching the p-type nitride semiconductor layer 3 and the luminescent layer 4, the n-type nitride semiconductor layer 2 is continuously etched until the sapphire substrate is exposed so that the layered portion 810-2 include the p-type nitride semiconductor layer 3, the luminescent layer 4, and the n-type nitride semiconductor layer 2, as shown in FIG. 46.

Embodiment 9 (Third Aspect)

Figure 47:
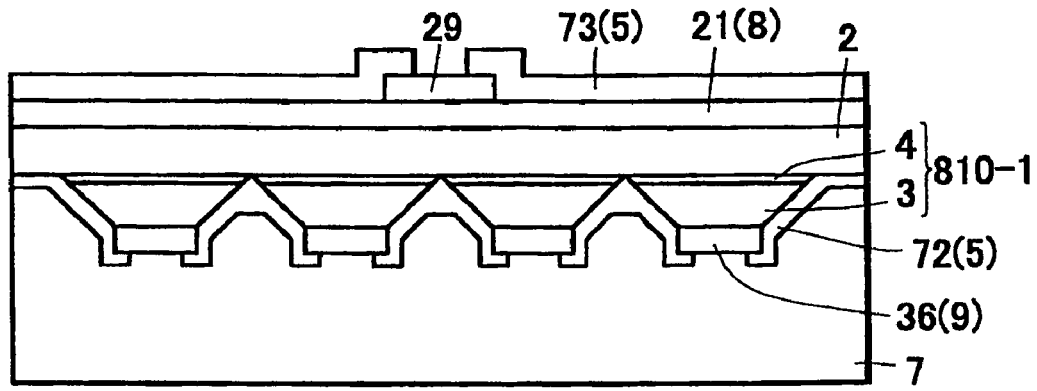
FIG. 47 is a sectional view of a nitride semiconductor light-emitting device according to Embodiment 10.

A nitride semiconductor light-emitting device according to Embodiment 9 of the present invention has an arrangement in which four layered composites are arrayed in a line, as shown in FIG. 47.

Figure 50:
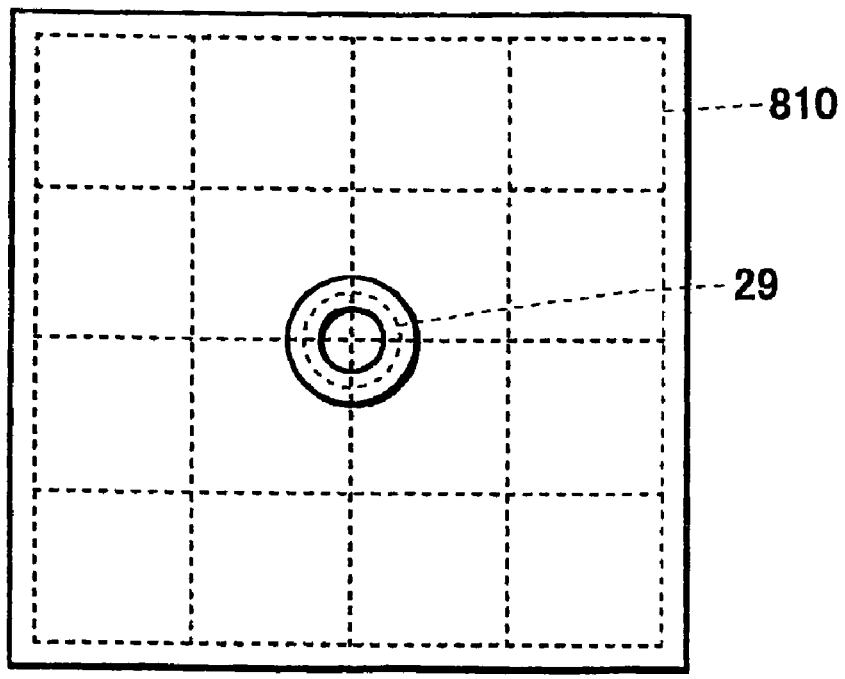
FIG. 50 is a plan view of a nitride semiconductor light-emitting device according to Embodiment 10.

Specifically, in the nitride semiconductor light-emitting device of Embodiment 9, 16 layered portions 810-3 (each composed of a p-type nitride semiconductor layer and a luminescent layer) in frustum of tetragonal pyramid are arrayed in a 4 by 4 matrix on one surface of an n-type nitride semiconductor layer 2, as shown in FIG. 50. Thus, the light-emitting device has a relatively large area.

The other surface of the n-type nitride semiconductor layer 2 is entirely covered with a transparent electrode 21 (8) shared by all the layered composites 810. The transparent electrode 21 (8) is used as the n-type ohmic electrode, and an n pad electrode 23 is formed in the center of the transparent electrode.

The nitride semiconductor light-emitting device of Embodiment 9 is cut out between the layered composites away from the peripheries 10a of the layered composites 10 (810) such that 16 layered composites 810 are arrayed in a light-emitting device.

Since the nitride semiconductor light-emitting device according to Embodiment 9 of the present invention is cut out along positions separate from the inclined peripheries 10a of the layered composites 10, the interfaces of the PN junctions at the inclined peripheries 10a of the layered composites 10 are not damaged, and short-circuiting at the interfaces of the PN junctions can be prevented, which is caused by chips produced by cutting the metal member 7.

Also, the nitride semiconductor light-emitting device of Embodiment 9 can increase the luminous efficiency for the same reason in the nitride semiconductor light-emitting device of Embodiment 8, and thus the entire luminescent layer can efficiently emit light.

Figure 48:
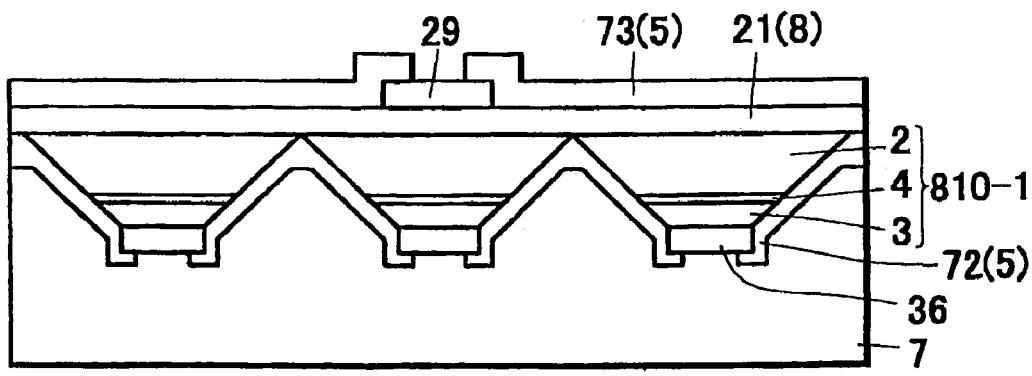
FIG. 48 is a sectional view of a nitride semiconductor light-emitting device according to modification 1 of Embodiment 10.

In the nitride semiconductor light-emitting device of Embodiment 9, the layered composite 810 is defined by the p-type nitride semiconductor layer 3 and the luminescent layer 4 without the n-type nitride semiconductor layer 2. However, the invention is not limited to this, and the n-type nitride semiconductor layer 2, the p-type nitride semiconductor layer 3, and the luminescent layer 4 may define a layered composite 810-4, as shown in FIG. 48.

Figure 49:
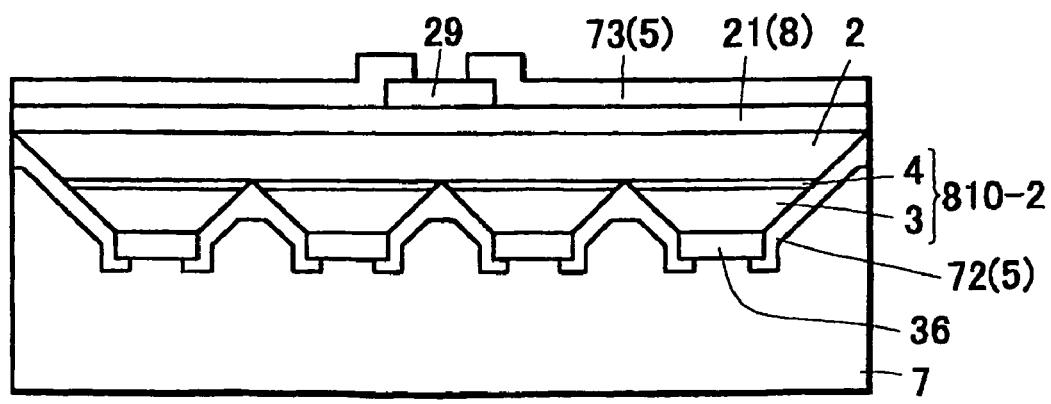
FIG. 49 is a sectional view of a nitride semiconductor light-emitting device according to modification 2 of Embodiment 10.

In the nitride semiconductor light-emitting device of Embodiment 9, the n-type nitride semiconductor layer 2 may be formed separately for each device on a wafer instead of being formed separately for each layered composite in one device (FIG. 49). Then, the wafer is divided into devices in the spaces between the n-type nitride semiconductor layers 2.

Figure 51:
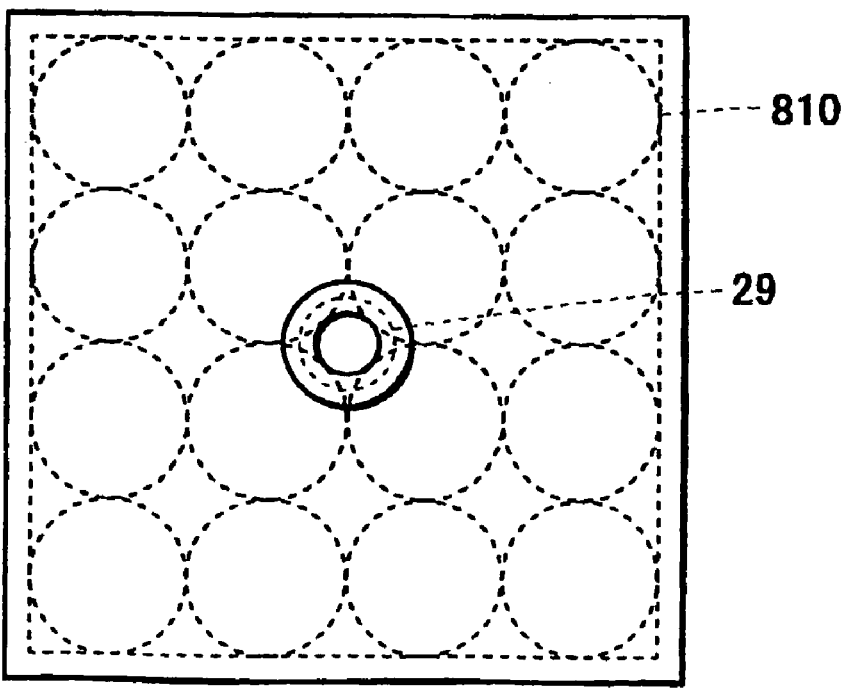
FIG. 51 is a plan view of a nitride semiconductor light-emitting device according to modification 3 of Embodiment 10.

The layered composites 810 of the nitride semiconductor light-emitting device of Embodiment 9 are formed in frustum of a tetragonal pyramid. However, it is not limited to this, and corn frustum layered composites 810-4 may be used (FIG. 51).

(Other Constituents and Structures in the Present Invention)

(Light-emitting Device 10000)

The constituents in the above-described embodiments (light-emitting device 10000) will now be described in detail. The constituents and structures may be applied in combination to the embodiments.

(Device-Structured Composite 10100)

A device-structured composite 10100 used in the light-emitting device 10000 of the present invention may be defined by a layered structure including a first conductivity type layer 2, an active layer (luminescent layer 4), and a second conductivity type layer 3 which are deposited in that order on a substrate 1, as shown in FIGS. 59A and 59B. Alternatively, the first conductive layer 2 and the second conductivity type layer 3 may be horizontally joined to each other. A combination of these structures may also be used. For example, the cross section of the joined surface may form a polygonal line (continuous line), an inverse V shape, a V shape, or any other complex shape.

Specifically, the light-emitting device 10000 includes a layered structure 10100 as the device-structured composite 10100. The device-structured composite 10100 includes the first conductivity type layer 2, the luminescent layer (active layer) 3, and a second conductivity type layer 3 which are deposited in that order on the substrate 1, as shown in FIGS. 59A and 59B. In this instance, a luminescent structured portion 5110 includes the first and second conductivity type layers separated by the luminescent layer, as shown in the figure. Alternatively, the first and second conductivity type layers may be horizontally joined to each other, as described above, or the luminescent structured portion may have complex joined surfaces in the vertical and horizontal directions. The light-emitting device may have a MIS structure, a p-n junction structure, a homojunction structure, a heterojunction structure (double heterojunction structure), or a PIN structure, or may be a unipolar device. However, a preferred structure is such that the active layer lies between an n-type layer and a p-type layer, like, for example, a p-n junction structure in which the first and second conductivity type layers have different conductivity types from each other.

The semiconductive materials used in the layered structure defining the structured device body 10000 include InAlGaP, InP, and AlGaAs, mixtures of these materials, and GaN nitride semiconductors. Exemplary GaN nitride semiconductors include GaN, AlN, InN, and their mixed crystals, group III-V nitride semiconductors ($In_\alpha Al_\beta Ga_{1-\alpha-\beta}N$, $0 \leq \alpha$, $0 \leq \beta$, $\alpha+\beta \leq 1$). In addition, other mixed crystals may be used in which B is used as the entire or a part of the group III element, or in which part of the N being a group V element is replaced with P, As, or Sb. The following description uses nitride semiconductors, but other materials may be used.

The luminescent layer may comprise an InGaN semiconductor, and wide-bandgap luminescent layers may emit green or blue light in visible regions, and violet light and shorter-wavelength light in the ultraviolet region.

In the embodiments, the first conductivity type layer 2 and the second conductivity type layer 3 are defined as an n-type layer and a p-type layer, respectively, and they may be reversed. The semiconductor layered structure 10100 may be deposited by MOVPE (metallorganic vapor phase epitaxy), HVPE (hydride vapor phase epitaxy), MBE (molecular beam epitaxy), or MOCVD (metallorganic chemical vapor deposition). Preferably, MOCVD or MBE is applied.

The substrate used for depositing the semiconductor layered structure 10100 of the present invention may be made of a known non-nitride material different from nitride semiconductors, capable of growing nitride semiconductors. Such non-nitride substrates include: insulative substrates, such as C-plane, R-plane, or A-plane sapphire or spinel ($MgAl_2O_4$); SiC (including 6H, 4H, 3C); ZnS; ZnO; GaAs; Si; and oxide substrates lattice-matching with nitride semiconductors. Preferably, sapphire or spinel is used. Alternatively, nitride semiconductor substrates may be used, such as GaN and AlN. For other semiconductors, conventionally known substrates based on the same constituents or non-nitride substrates, such as Si, may be used.

(Semiconductor Layered Structure 10100)

The semiconductor layered structure 10100 of the light-emitting device 10000 is deposited on the substrate 1 with an underlayer 500 or the like therebetween, as shown in, for example, FIGS. 57A to 57D, 39, 59A, and 59B. The underlayer 500 may be included in the structured device body 10100 or operational portion, but is generally provided to serve as a non-operational portion only for growing the structured device body. If, in particular, a non-nitride semiconductor substrate is used, a low-temperature deposited buffer layer is used as the underlayer for crystal-nucleation or nuclear growth. Preferably, $Al_xGa_{1-x}N$ ($0 \leq X \leq 1$) is deposited at a low temperature (200 to 900° C.) and, subsequently, grown at a high temperature to a thickness (single crystal, high-temperature deposited layer) of about 50 Å to 0.1 μm. A layer formed by a deposition known as ELO (Epitaxial Lateral Overgrowth) may be used as the underlayer 500 or in the device layered structure 10100, the ELO in which growth portions, such as an island-shaped portions (protrusions, openings in the mask), are deposited prior to the other portions or selectively on a substrate or an underlayer so that the portions grow in the horizontal direction to join to each other and thus form a layer. Thus, the resulting structured device body can have crystallinity, and particularly crystal defects can be reduced.

N-type dopants used in the nitride semiconductors include group IV elements, such as Si, Ge, Sn, S, O, Ti, and Zr; and group VI elements. Among these preferred are Si, Ge, and Sn. More preferably, Si is used. P-type dopants include, but not limited to, Be, Zn, Mn, Cr, Mg, and Ca, and preferably Mg is used. By implanting dopants as an accepter or a donor, nitride semiconductor layers having respective conductivity types are provided to define respective conductivity type layer described later. Nitride semiconductors can be used as the n-type layer even if it is not doped. For other materials, such as AlGaAs, a suitable dopant is used. The first conductivity type layer and the second conductivity type layer in the present invention may partially include an undoped layer or a semi-insulative layer, or a portion partially parasitic in the conductivity type layers may be formed in an opposite conductivity-type embedding layer.

First Conductivity Type Layer 2)

Preferably, the first conductivity type layer 2 is doped with an appropriate conductivity type dopant and given a structure capable of supplying and diffusing carriers into the surfaces of electrode-forming areas and the active layer, as shown in the structured device body of the embodiments. It is particularly preferable that a current-diffusing conductor 8 (contact layer) supplying carriers from the electrode portion 5200 to the luminescent structured portion 5110 to diffuse the carriers in planes is doped at a higher concentration. In addition to such charge-supply, in-plane diffusion layers (contact layer and its adjacent layers), an interlayer for transferring or supplying charges to the luminescent layer in the layering direction, or a cladding layer for confining second conductivity type carriers in the luminescent layer may be provided, preferably. In a nitride semiconductor device, the interlayer disposed between the luminescent layer 4 and the contact layer of the in-plane diffusion layers (regions) preferably comprises a lightly doped layer (undoped layer) which is undoped or doped at a lower concentration than the in-plane diffusion layers (regions), and/or a multilayer film. This is because the lightly doped layer can recover crystallinity degraded by the heavily doped layers (in-plane diffusion layers) so that the crystallinity of the cladding layer and luminescent layer provided over the in-plane diffusion layers, and because the arrangement of adjoining the heavily doped layer and the lightly doped layer can promote in-plane diffusion and increases the pressure resistance. The multilayer film preferably has a periodic structure composed of at least two types of layers alternately deposited. Specifically, the periodic structure includes a nitride semiconductor layer containing In and a layer having a different composition from that of the nitride semiconductor layer, preferably $In_xGa_{1-x}N/In_yGa_{1-y}N$ ($0 \leq x < y < 1$) In particular, use of a In-containing nitride semiconductor layer, preferably use of plurality of it as a well layer, increases the crystallinity of the luminescent layer. Alternatives to the multilayer film having a periodic structure including layers having different compositions may be a structure including layers whose compositions are gradually varied, whose dopant concentrations are varied, or whose thicknesses are varied. Preferably, a structure constituted of layers with thicknesses of 20 nm or less, more preferably 10 nm or less, deposited on top of one another is used from the viewpoint of increase of the crystallinity.

(Luminescent Layer [Active Layer] 13)

The structured device body 10100 of the present invention preferably includes the luminescent layer emitting light between the first and second conductivity type layers. More preferably, the luminescent layer comprises an In-containing nitride semiconductor from the viewpoint of obtaining an appropriate luminous efficiency in the range of UV to visible light (red light). In particular, the use of an InGaN layer allows the In ratio in the mixed crystal to be varied so as to provide light having a desired wavelength. Alternatively, GaN, AlGaN, and other nitride semiconductors having a higher bandgap than the InGaN may be used for a luminescent layer for emitting UV light.

Still more preferably, the luminescent layer is of an active layer having a quantum well structure, which may be a single-quantum well structure with a single well layer, or more preferably a multi-quantum well structure including a plurality of well layers deposited on top of one another, separated by barrier layers. The well layer preferably comprises InGaN, as in the above described luminescent layer. The barrier layers preferably have larger bandgap energy than the well layer. For example, InGaN or AlGaN is used. The thicknesses of the well layer and the barrier layer are preferably 30 nm or less, and more preferably 20 nm or less. Still more preferably, the well layer is 10 nm or less. Thus, the resulting luminescent layer can exhibit a high quantum efficiency. The well layer and the barrier layer may be doped according to the conductivity type. The number of the barrier layer between a pair of the well layers may be one or more.

(Second Conductivity Type Layer 3)

The second conductivity type layer 3 preferably includes a cladding layer for confining carriers in the luminescent layer, and a contact layer on which an electrode is formed. Preferably, these two layers are separate from each other, and the contact layer is more distant from the luminescent layer than the cladding layer and is heavily doped at a high concentration. In the nitride semiconductor, the cladding layer preferably comprises a nitride semiconductor containing Al, and more preferably an AlGaN layer. More preferably, the cladding layer is provided close to the luminescent layer, and still more preferably adjoining the luminescent layer. Thus, the luminous efficiency of the luminescent layer can be enhanced. Preferably, a layer is provided between the contact layer and the cladding layer at a lower concentration than these two layers, so that the resulting device can exhibit high pressure resistance. The contact layer may be doped at a high concentration, thereby enhancing the crystallinity advantageously. Since the contact layer is provided in the luminescent portion 5110 inside the electrode-forming surface, as shown in FIG. 58, it can serve to diffuse carriers. In the present invention, however, an upper electrode 2200 extending on a part of the electrode-forming surface and a lower electrode 2100 having a larger area, or a wider section, than that of the upper electrode are provided to allow them to serve as a current diffusion layer and a diffusion conductor, thus helping the diffusion of p-type carriers, which transfers through a nitride semiconductor at a low speed. Also, the contact layer is preferably formed to a smaller thickness than the thicknesses of the other layers (cladding layer, interlayer) and doped at a higher concentration than the other layers to be a high carrier-concentration layer. Thus, carriers can be well injected from the electrode.

(Current-Diffusing Conductors 8, 9)

In the layered structure 1000100 of the present invention, the current-diffusion conductor 8 may be provided inside the structured device body (in the first conductivity type layer 8) or on (the electrode 2100 on) the structured device body. Specifically, as shown in FIG. 58, a first electrode 1000 is provided for the first conductivity type layer 2 on the exposed electrode-forming surface 5200, and serves as a diffusing conductor 8 for diffusing current in the lateral direction in the first conductivity type layer 2; an electrode 2100 for ohmic contact, electrically coupled with the connecting electrodes (wiring electrodes and wires) is provided for the second conductivity type layer 3, and serves as a diffusion conductor for widely diffuse current in the plane through the partially provided wiring electrode. A diffusion layer may be provided in the second conductivity type layer 3, or an external diffusing conductor (electrode) may be provided on the first conductivity type layer.

(In-Plane Structure of Light-Emitting Device)

The light-emitting device of the present invention includes the structured portion 5700 including the luminescent structured portion 5110 and the electrode portion 5200. The structured portion 5700 of the device is formed on the current-diffusing conductor 8 (first conductivity type layer 2). A single structured portion 5700 may have a luminescent structured portion 5110 (FIGS. 1 to 10, 34, 45, and 46), or have a plurality of the luminescent structured portions 5110 in a cluster. In other wards, a single device structure 5700 includes at least one pair of the luminescent structured portion 5110 and the electrode portion 5200. A plurality of the structured portions 5700 of the device may be integrated to define an integrated light-emitting device 10000.

For wiring the electrodes, each electrode preferably has an ohmic contact portion where an ohmic contact is established to supply current in the structure portion of the device. Preferably the electrodes (wiring electrode and pads) are formed corresponding to the ohmic contact portions. Alternatively, the wiring electrode may be provided so that separated ohmic contact portions electrically conduct to one another. The wiring electrode 1120 or 766 may be provided to a device-mounting base, as described later.

The electrodes of the structured device body are provided on the electrode-forming surfaces of the conductivity type layers, depending on the shape or form of the structured device body. Accordingly, the second conductivity type layer and the first conductivity type layer partially exposed by removing part of the luminescent layer are used as the electrode-forming surfaces, so that the second electrode and the first electrode can be respectively provided above and below the luminescent layer, over the substrate. Alternatively, both electrodes may be formed on the same side. In such a case, the electrode-forming surfaces are disposed in a different manner.

(First Electrode 1000)

The first electrode 1000 is formed on at least part of the exposed area 2s of the first conductivity type layer 2 being the electrode-forming region 5200. In the form according to the second aspect, the first electrode is disposed separately from the luminescent structured portion 5110 in the plane, and serves to inject current into the first conductivity type layer 2 for establishing an ohmic contact. The exposed area 2a of the first conductivity type layer 2 may be provided in the outer region of the structured portion 10100 of the device so as to surround the luminescent structured portion 5110, as shown in the figure. Alternatively, as shown in FIG. 58, the substrate 1 may be exposed at the outer region (exposed region 4s) of the device and the periphery 6110a of the first conductivity type layer 2 may be inclined to serve as a light-reflection portion or a light-extraction portion. In this instance, by setting the angles of the electrode-forming surface at the inclined periphery with respect to the normal of the surface of the substrate to be larger than the angle of the periphery 5110a of the luminescent structured portion 5110, light propagating in the lateral direction in the first conductivity type layer 2 can efficiently be extracted advantageously. The exposed area 2s may be provided to the luminescent structured portion 5110 in the operational portion 57 of the device in such a manner as to be exposed at the first electrode 1000 (5110a), thus functioning as a light-extraction groove. In addition, a protrusion may be provided as a nonluminescent structured portion into which current is not injected (for example, electrode portion 5200 or non-operational portion 5800 of the device) in the area exposed at the electrode 1000. The protrusion can contribute to reflection or light extraction.

The first electrode 1000 functions to diffuse and inject current into the luminescent structured portion 5110. By adjusting the in-plane diffusion in the in-plane diffusing layers (8 and 9) of the first conductivity type layer 2, the second conductivity type layer 3, and the second electrode 2000 (lower electrode layer 2100), more specifically, by appropriately adjusting sheet resistances to control the interval between the first electrode and the second electrode, a desired width is given to the luminescent structured portion 5110 and a desired state in in-plane diffusion can be achieved.

The first electrode 1000 includes a pad portion 1100 and a connecting electrode portion 1200. These portions may be formed in the same electrode structure, or may have different structures such that the electrode 1000 is defined by an electrode for establishing an ohmic contact and a pad electrode is formed only in the pad portion 1100.

(Second Electrode 2000)

The lower electrode 2100 is formed over substantially the entire surface of the exposed area 2s of the second conductivity type layer 3 in the luminescent structured portion 5110, as described above, thus functioning as a diffusion layer for diffusing current in the plane in the luminescent structure portion 5110. If the second conductivity type layer 3 has a current diffusion layer inside, the in-plane diffusing electrode 2100 is not necessary. However, both the current diffusion layer in the structured portion and the current diffusion electrode may be provided because the device structure often makes it difficult to diffuse current. In use of nitride semiconductors, in-plane diffusion in the p-type layer often becomes insufficient. It is therefore preferable that second electrode 2000 include a pad portion 2200p for external connection, an upper electrode 2200 extending from the pad electrode to diffuse current to the luminescent structured portion 5110, a wiring electrode 2200a (2200b), and a lower electrode 2100 having a larger area than that of the wiring electrode 2200a (2200b) to expand the second electrode 2000 in the plane.

The lower electrode 2100 is preferably light transmissive, as described above. If light is extracted through the substrate 1, as shown in FIGS. 16B, 33B, 54A, and 55, a reflection layer may be provided on the light-transmissive electrode or a light-transmissive insulating layer on the light-transmissive electrode, or an electrode structure or a reflective electrode may be provided which includes a reflective electrode layer overlying a light-transmissive electrode layer. In either case where light is extracted through the substrate 1 or the second conductivity type layer, it is preferable that the lower electrode layer 2100 of the second electrode 2000 is provided with openings to be light transmissive, or that the lower electrode layer proper 2100a is light transmissive, as well.

The first and second electrodes 1000 and 2000, particularly the lower electrode 2100 of the p-type nitride semiconductor layer, are formed of a metal, an alloy or an composite containing at least one selected from the group consisting of nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (CO), iron (Fe), manganese (Mn), molybdenum (MO), chromium (Cr), tungsten (W), lanthanum (La), copper (Cu), silver (Ag), and yttrium (Y). Compounds containing at least one of these metals may be used, such as conductive oxides and nitrides. Among these, preferred are conductive metal oxides (oxide semiconductors), such as indium oxide doped with tin (Indium Tin Oxide, ITO) of 50 Å to 10 μm in thickness, ZnO, $In_2O_3$, and $SnO_2$ because of their light transmittancy. Such an oxide semiconductor functions intermediately between the conductivity type layers 2 and 3 and their respective electrodes 1000 and 2000, and the conductivity of the conductivity type layers 2 and 3 may be set to be the same as that of the metal oxide. If oxide semiconductor layers having different conductivity types are used as the electrodes, an interlayer (opposite conductivity type layer, oxide semiconductor, metal layer) may be disposed between the electrode and the device-structured composite 10100. Since the oxide semiconductor or electrode material can serve as the diffusing conductor 2100 (9), the diffusion conductor 8 on the first conductivity type layer 2 side may be constituted of such a semiconductor layer. If the lower electrode 2100 is of a metal layer, the lower electrode can be formed to such a small thickness as to ensure transmittance; if the lower electrode layer 2100 having an openings 2100*b*, a reflective metal, such as Al, Ag, or Rh, may be used for the lower electrode 2100.

Figure 60A:
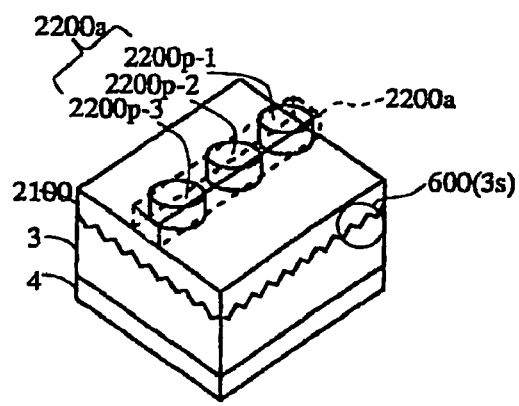
FIGS. 60A to 60E are schematic perspective views for describing the device structure and the electrode structure of the light-emitting device according to the present invention.
Figure 60B:
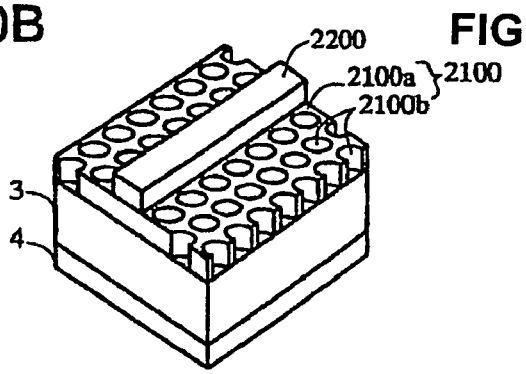
Figure 60C:
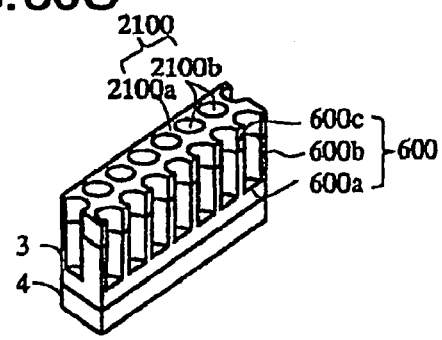
Figure 60D:
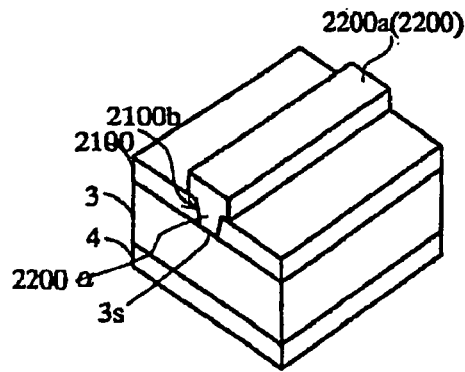

FIGS. 60A to 60E show exemplary forms of the second electrode 2000 including the lower electrode 2100 and the upper electrode 2200 (wiring portion 2200*a*). In the second electrode, pad portions 2200*p* may be arranged in a line 2200*a* (designated by dotted lines) to serve as the connecting electrode portion 2200*a* (FIG. 58); the lower electrode 2100 may be defined by the lower electrode proper 2100*a* having openings 2100*b* formed corresponding to openings 600 of the structured portion 10100 of the device (FIG. 60B); the lower electrode 2100 may partially have an opening 2100*b*, and an electrode 2200α serving as the wiring portion 2200*a* (pad portion 2200*p*) is formed on the surface of the lower electrode 2100, across the opening 2100*b* (surface of the second conductivity type layer 3), as shown in FIG. 60D. A compound electrode, such as an oxide electrode, can enhance the adhesion in the second electrode. The second electrode 2200α filling the opening 2100*b* may be such that the second electrode 2000 is defined by electrodes 2200α (upper electrode pad portions 2200*p*-1, 2200*p*-2) disposed on the electrode 2100, across the opening 2100*b* of the lower electrode together with recesses 600 formed in the second conductivity type layer 3.

Since the electrode 2100 of the second electrode is formed in the luminescent structured portion 5110, it is necessary to be transmissive or reflective so that light can be extracted or reflected effectively. It is therefore advantageous for either light-extraction direction that the electrode has a portion (electrode proper 2100*a*) with a high light-transmissive property (light transmittance) (formed of a material having a low light absorption), or that the light transmittance (or absorption) of the electrode, the area ratio of the openings 2100*b* determining the transmittance (total area of the openings/area of the electrode proper [5300]), and/or the proportion and distribution of the openings are adjusted.

Figure 60E:
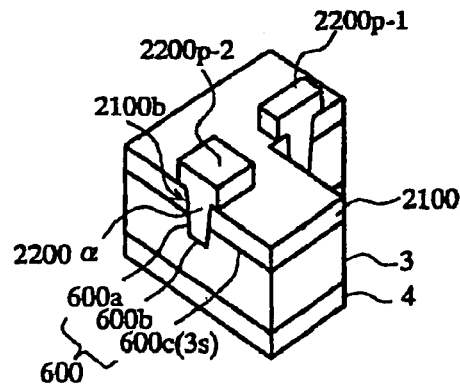

The surface 2*s* of the electrode from which light is extracted may be formed into an irregular portion 600, as shown in FIG. 60A; recesses 600*a* may be formed in the second conductivity type layer 3, corresponding to the openings 2000*b* in the electrode 2300 so that irregularities 600 are defined by the interface of different types of material: the upper surfaces 600*c* (interface with the electrode material) of protrusions and the lower surface 600*a* (interface with the protective film or insulating material) of recesses, as shown in FIGS. 60C and 60E. These structures contribute to favorable light extraction or reflection. Also, by setting the angle of the sidewall 600*b* large, reflection at the sidewall is increased to enhance the light-extraction efficiency. The irregularities 600 may be provided at an end, a side surface, an exposed surface, or an interface (between layers, between a layer and the substrate, between a layer and a metal, between a layer and a film, such as an insulating layer) of the structured portion 10100 of the device. For example, as shown in FIG. 57, in order to increase the light-extraction efficiency by diffusing light propagating in the direction designated by the arrow and controlling the direction of the light, the irregularities 600 are formed in the substrate 1, and the device-structured composite 10100 is deposited to the irregularities so that an irregular interface is formed between the substrate 1 and the semiconductor of the unit. The irregular interface 600 may be formed at the surface of the underlayer 500 exposed by removing the substrate 1 in a removal region 700. By forming the irregular interface 600, the light-extraction efficiency and power of the light-emitting device are enhanced advantageously.

The irregularities 600 and the openings 2100*b* (electrode proper 2000*a*) of the lower electrode 2100 of the periodic structure are formed in a pattern of protrusions (upper surfaces) and openings 2000*b* or a pattern of recesses (bottom surfaces) and electrode proper 2100*a* in a dot manner, a grid, a honeycomb, a branch pattern, a rectangular shape, a polygonal shape, a circular shape, or any other shape. The size of the irregularities is set at λ/(4n) or more (n represents the refractive index of the material forming the irregularities; λ represents the emission wavelength of the luminescent layer) so as to reflect, diffuse, or extract light. More specifically, the intervals of the openings, protrusions or recesses, the length of sides (rectangular or polygonal shape), or the diameter (dot manner, circular shape) is set at 1 to 10 μm, and preferably 2 to 5 μm. The shape in sectional view is not particularly limited, and the side surface of the recesses may be substantially vertical or inclined (in a mesa manner or reversed mesa manner). The reflection layer in the present invention is formed at the end surface, exposed surface, or interface with the substrate of a device to which reflection functions are given, so that desired light extraction (for example, at the substrate 1 side) is achieved. Specifically, the reflection layer may be provided, as in the irregularities 600, on the exposed surfaces 1*s* (5200) and 2*s* (5300) of the first and second conductivity type layers, the openings 200*b* of the electrode, and the periphery 5110*a* of the semiconductor layers (first and second conductivity type layers, luminescent layer 5110), and further on a surface of the substrate. The periphery may be inclined to reflect light in a desired direction. A metal layer (for example, an electrode) may be given reflectivity, and further, the reflection layer may be formed on the surfaces 600*a* to 600*c* of the irregularities 600. The reflection layer may comprise a metal film, oxide film (insulating film), multilayer reflection film (DBR), or the like. For visible light, particularly from a luminescent layer formed of $In_xGa_{1-x}N$ ($0 \leq x \leq 1$), Al or Ag is used as a high reflection layer. A suitable material is selected according to the position and material of the layer-forming region (end of the device), emission wavelength, or and the like.

The first electrode 1000 and the second electrode 2000 or the first electrode 1000, the second electrode 2000 and the upper electrode 2200 (pad portion 2200*p*, connecting electrode) may be formed of the same material in the same structure at one time. For example, these electrodes each comprise a multilayer film, such as Ti/Au or Ti/Al, including a Ti layer (first layer) for establishing an ohmic contact with the first conductivity type layer and enhancing adhesion and a pad layer (second layer) of gold, Al, or a platinum metal in that order from the exposed area 2s side. A high-melting-point metal layer (W, Mo, a platinum metal) may be provided as a barrier layer between a first layer for ohmic contact (W, Mo, or Ti is suitable for establishing an ohmic contact with the first conductivity type layer) and a second layer or pad layer. Preferred structures include, for example, W/Pt/Au and Ti/Rh (second layer a)/Pt (second layer b)/Au, and these are particularly suitable for the first electrode (for ohmic contact). It is particularly preferable that Rh, which has high reflectivity and barrier properties, is used as the second layer from the viewpoint of enhancing the light extraction efficiency. The electrode 2300 for establishing an ohmic contact with the second conductivity type layer 3 preferably comprises Ni/Au or Co/Au, in that order from the exposed area 2s side, or a conductive oxide, such as ITO, or platinum metals, such as Rh/In or Pt/Pd.

Among these, preferred material for the lower electrode 2100 (electrode proper 2100a) is Ni/Au (light-transmissive electrode material) or Rh/Ir (reflective electrode material).

(Fourth Aspect)

According to a fourth aspect of the present invention, a light-emitting apparatus is provided which includes the light-emitting device according to the first to third embodiments. In particular, the light-emitting apparatus uses a light-transforming member for a filler or a lens to transform at least part of the light emitted from the light-emitting device.

Embodiment 10

Figure 54A:
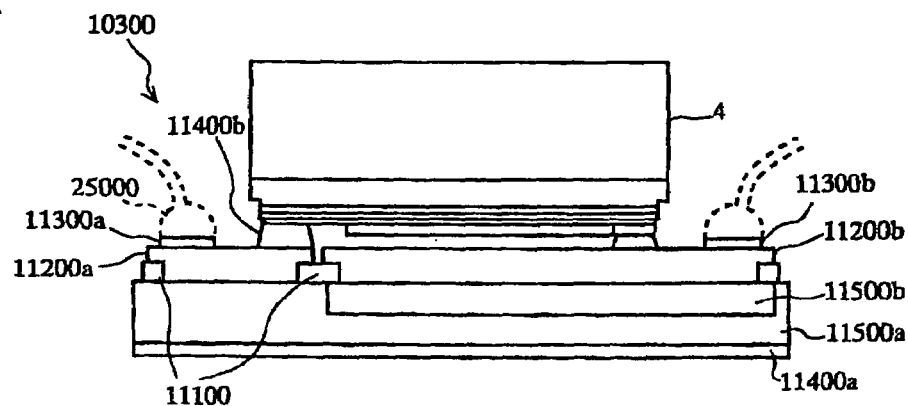
FIG. 54A is a schematic sectional view of a light-emitting apparatus according to the fourth aspect (Embodiment 10)
Figure 54B:
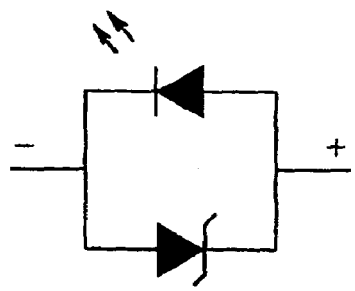
FIG. 54B is an equivalent circuit diagram of the apparatus.

Embodiment 10 describes a device composite 10300 in which any one of the light-emitting devices 10000 of Embodiments 1 to 9 according to the first to third aspects of the present invention is mounted and bonded onto a multilayer board 10400 with the electrode surfaces of the device therebetween. FIG. 54A shows a schematic sectional view of the device composite. In another form, the light-emitting devices 10000 may define the device composite 10300, and are mounted and bonded such that, as shown in FIG. 54A, the first electrodes 21 (pad portions 29) (the electrode and pad portion of the first conductivity type layer 2) separately provided in the device, as described above, are connected to each other with an electrode 11200 of the board 10400 and the separately provided second electrodes 31 (pad portions 32) (the electrode and pad portion of the second conductivity type layer 3) are also connected to each other on the board 10400 side. The electrodes 11200 of the board 10400 are isolated by an insulating film 11100 or the like corresponding to the electrodes 21 (29) and 31 (32) on the light-emitting device side, and additional electrodes 11300 are provided for external connection. The board may include a device portion 11500. In the present embodiment, the device portion includes a p-type layer (first conductivity type layer) 11500a and n-type layer (second conductivity type layer) 11500b as a current-shielding and static-shielding device (device-structured portion 11500). While, in the present embodiment, a single device portion 11500 is provided in the board 10400, two or more device portions may be provided and connected with electrodes of external device 10000 or mounting base 20100. The shielding device may be incorporated in the light-emitting apparatus 20000 (mounted portion 22200) on the board 10400 and connected to the light-emitting device with wire.

The electrodes 21 and 31 of the light-emitting device 10000 and the electrode 11200 of the board 10400 are connected to each other with a junction layer 11400. Alternatively, part of the electrode of the device 10000 or part of the electrode 11200 of the board 10400 may be included in the junction layer. For example, the junction layer may be alternative to the pad portions 11 and 22p.

The board 10400 may be of a normal submount, having no device-structure portion 11500. The board 10400 may be connected to the outside with connecting electrodes 11300 by wiring, or an electrode for the device-structured portion of the board or an electrode layer electrically connecting the interior to the exterior may be formed on the mounting side to be used as the electrodes 11300 and the junction layer 11400.

(Support 900)

A support 900 may be prepared by removing the substrate 1 used for depositing the device layered structure 10100 of the light-emitting device structure 10000. For example, as shown in FIG. 59B, the removal portion 700 to be removed may be defined by the substrate 400, the substrate 400 and a part or the entirety of an interlayer 500 between the substrate and the layered structure 10100, or part of the first conductivity type layer 1 in addition to these layers. In other words, any unnecessary region can be removed except the device layered structure 10100. Specifically, the removal portion 700 is separated from the device layered structure 10100 bonded and mounted on a multilayer board, such as a submount, as shown in FIG. 16B or bonded to the support 1700 as shown in FIGS. 59A and 59B, by grinding, deliquescence or fusion of part of the layered portion on the substrate 1 through a chemical process (with an etchant), or decomposition by laser exposure (laser ablation). A stress or strain may be placed between the substrate 1 and the device layered structure 10100 to break layers by applying mechanical grinding or external force. These methods may be combined to remove the removal portion 700.

Preferably, the removal portion, such as the substrate 1, is removed by transfer in which the device layered structure is bonded to the support 900 with a junction layer 800 therebetween. In this instance, the support 700 is made of a suitable material according to purpose. In order to enhance the heat radiation of the device, AlN, BN, SiC, GaAs, Si, or C (diamond) is preferably used as a heat-radiating support. Other materials for the support include semiconductor substrate constituted of semiconductors, such as Si, SiC, GaAs, GaP, InP, ZnSe, ZnS and ZnO, elemental metal substrates, and complex substrates constituted of at least two metals not dissolving with each other or having low solubility limits. Such a metal material is, for example, composed of at least one metal selected from high-conductivity metals, such as Ag, Cu, Au and Pt, and at least one metal selected from high-hardness metals, such as W, Mo, Cr, and Ni. Preferably, the metal support is a Cu—W or Cu—Mo complex. The material and the bonding method of the support 900 are selected in view of the adsorption and loss by the support of light emitted from the light-emitting decide, the adhesion to the device-structured composite 10100 (the difference in thermal expansion coefficient between the device-structured composite 10100 and the support 900 or the mounting material 20300), or other factors. If light is extracted through the support 900, a light-transmissive material is selected, and is bonded with a light-transmissive adhesion layer 800, such as of silver paste, or by a method using no adhesion layer so that light loss is reduced. If light is extracted from the removal portion 700 side, a reflection layer of Al, Ag or the like is preferably provided to the adhesion layer 800, the support 900, or part of the layered structure 10100 to enhance the extraction efficiency. It goes without saying that if the order of deposited semiconductor layers is reversed by transfer, the first conductivity type layer 2 and the second conductivity type layer 3 in the device structure are interchanged, as designated by the double-headed arrow shown in FIG. 59B.

(Junction Layer 800, Junction Layer 11400, Adhesion Member 20400)

For adhesion between the support 900 and the device-structured composite 10100; adhesion between the device-structured composite 10100 (10000) and the multilayer board 10300; and adhesion or junction between the light-emitting device 10000, the support 900, or the multilayer board 10300 and the mounting base 20100 (housing 20200), a junction layer 800 (11400) or an adhesion member 20400 may be used. For forming them, a mixed or complex composition (organic) or a solder, such as Ag paste, carbon paste, or ITO paste is used. In view of the heat radiation from the light-emitting device 10000, heat-resistant material, such as Au, Sn, Pd, and In, is effective for large-area, high-current-driven, highly exothermic devices. These metals may be formed in a single layer, a composite, or an alloy. Preferred combinations of a first and a second eutectic-forming layer include Au—Sn, Sn—Pd, and In—Pd. More preferably, the first eutectic-forming layer is formed of Sn and the second eutectic-forming layer is formed of Au. A metal bump or a metal-metal junction, such as a Au—Au junction, may be used.

Such a junction layer may be formed on an underlayer, such as an adhesive metallizing layer, provided over the base (substrate 400, surface of the device-structured composite 10100, support 900, mounting base 20100, or multilayer board 10100), or on a reflection layer for reflecting light from the light-emitting device, thus forming an adhesion layer (junction layer) of a eutectic, a multilayer eutectic, an alloy, or the like. An antioxidant surface protection layer may be provided on the surface of the junction layer. In addition, an adhesive metallizing layer (adhesive layer), a surface protection layer, and an adhesion layer (junction layer) may be provided on the mounting side where an adhesion is established, and these layers on both sides may be bonded and joined.

Figure 56:
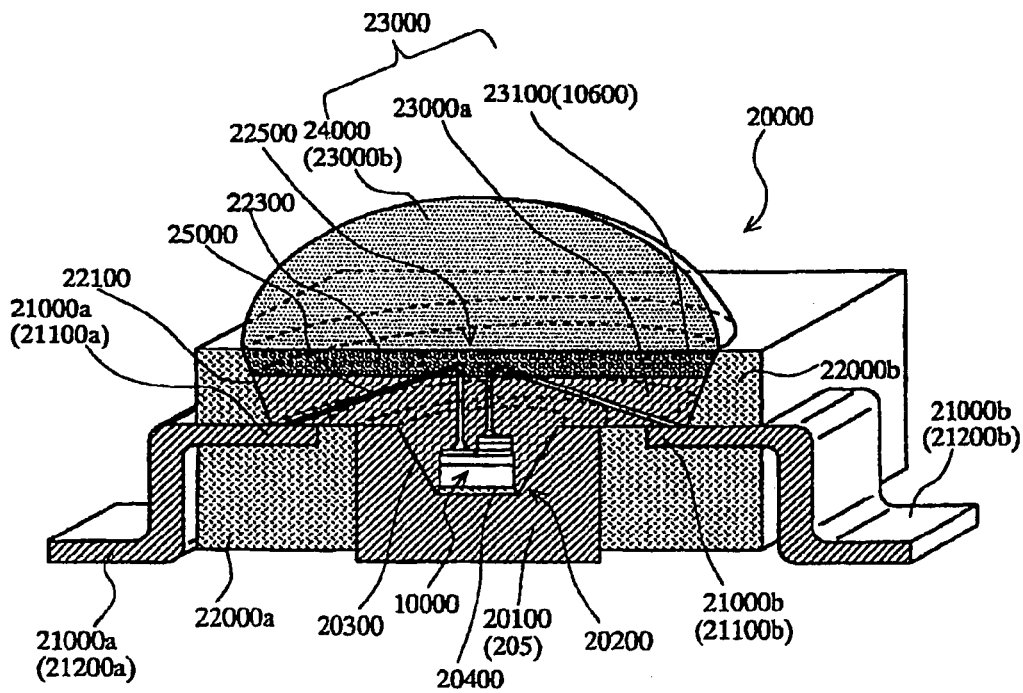
FIG. 56 is a schematic sectional view of a light-emitting apparatus according to the fourth aspect (Embodiment 11).
Figure 57A:
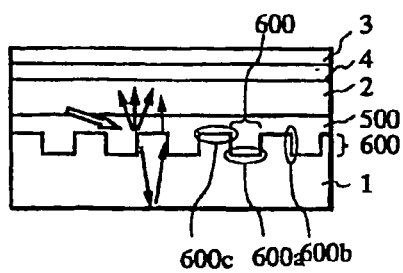
FIGS. 57A to 57D are schematic sectional views of irregular interfaces 600 of a light-emitting device according to the present invention.
Figure 57B:
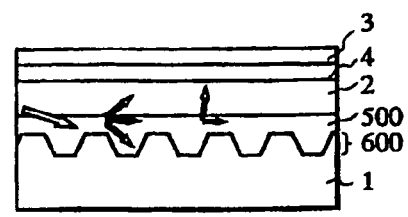
Figure 57C:
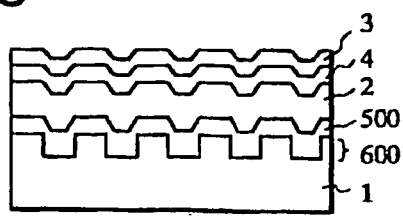
Figure 57D:
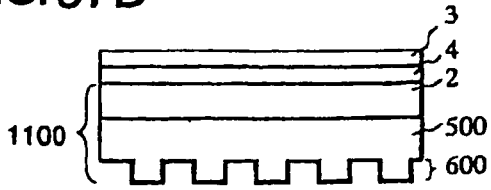

For example, the junction layer 20400 is disposed between the substrate (sapphire) 10 of the light-emitting device 10000 and the mounting region 20200 (whose surface is coated with, for example, Ag), as shown in FIG. 56. The junction layer 20400 is formed by depositing Al (0.2 μm, reflection layer)/W (0.2 μm)/Pt (0.2 μm), seven pairs of Au (0.3 μm)/Sn (0.2 μm), and a Au (10 nm) layer, in that order, from the substrate side, by depositing a Au layer on the mounting region 20200, and by heating and compressing the layers to bond the light-emitting device with the adhesion layer 20400. As for the junction layer 800 for bonding the device-structured composite 10100 to the support 1700, for example, a Ni—Pt—Au—Sn—Au multilayer film is deposited on the p electrode of the second conductivity type layer (p type layer) at respective thicknesses of 0.2, 0.3, 0.3, 3.0, and 0.1 μm, and a Ti adhesion layer, a Pt barrier layer, and a Au second eutectic-forming layer are deposited in that order at respective thicknesses of 0.2, 0.3, and 1.2 μm on the surface of a 200 μm thick metal substrate 1700 made of a complex of 30% of Cu and 70% of W. These layers are heat-compressed.

(Device Composite 10300)

For installing the light-emitting device into the light-emitting apparatus 20000, the light-emitting device 10000 may be mounted on the multilayer board 10400, such as a heat sink or a submount, to prepare a device composite 10300 which is a mounting composite including the device, as shown in FIGS. 16B, 33B, 54A, and 55. In this instance, the material of the board 10400 on which the light-emitting device 10000 is mounted is selected, as well as the above-described support, according to purpose. For example, it is selected in view of heat radiation properties or the light-extraction structure. The device composite 10300 is bonded to the mounting region 20200 of the light-emitting apparatus 20000, at the surface opposing the surface joining to the light-emitting device 10000.

If the multilayer board 10400 in the present invention is bonded opposing the electrodes of the light-emitting device 10000, electrode structures 11200a and 11200b or 766 are provided to the board 10400 corresponding to the electrodes 21 (29) and 31 (32) of the light-emitting device 10000. If the board 10400 is bonded opposing the opposite side (substrate 400) to the electrodes of the light-emitting device 10000, an adhesion layer or the like for bonding is provided instead of the electrodes, but another type of electrode may be provided for connecting the board to the light-emitting device 10000 by wiring. The electrodes 11200 of the board 10400 may be provided only on the surface bonding to the light-emitting device 10000, as shown in the figures. Alternatively, the electrodes may be provided, as a mounting-surface electrodes 11400, on the mounting surface opposing the bonding surface of the board 10400 such as to extend from the bonding surface to the mounting surface, to lie on the bonding surface, or to be communicated or electrically coupled from the bonding surface of the light-emitting device to the mounting surface through a through hole or via hole.

Although the figures shows an example in which a single light-emitting device 10100 is mounted on a single multilayer board 10400, a plurality of light emitting devices 10100 may be integrated and connected to the board 10400 in parallel, series or their combination with wiring electrodes of the board 10400 to define the composite 10300 including the mounted device. A single light-emitting device 10100 may be mounted on a plurality of multilayer boards 10400, another type of board comprising a differently functioning device, or their combination. Either a plurality of light-emitting devices 10100 or layered boards (devices) 10300 may be arranged in the vertical direction to define a device composite 10300.

Figure 55:
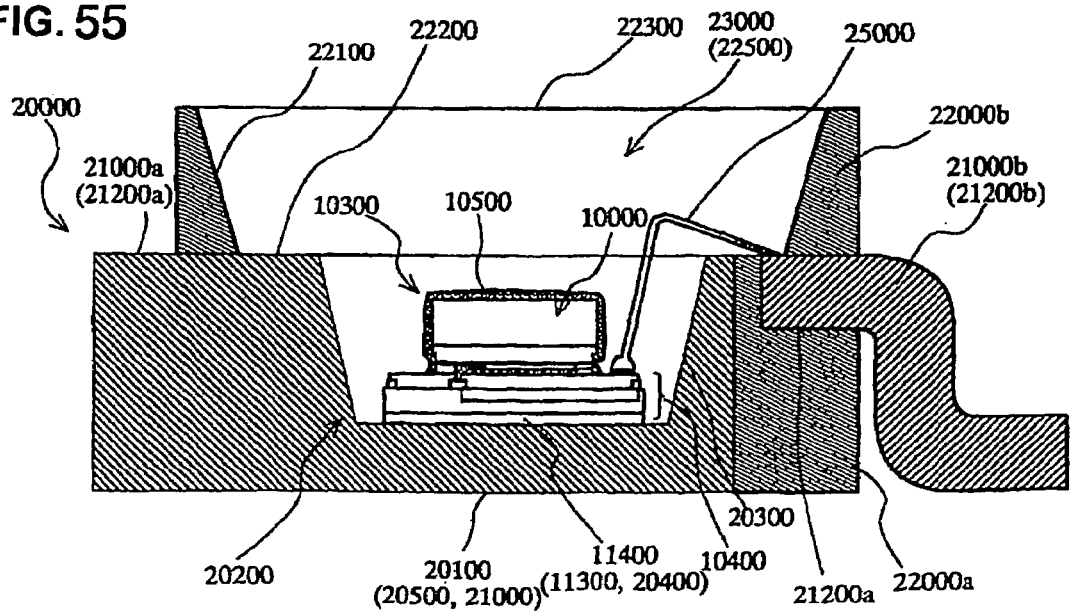
FIG. 55 is a schematic sectional view of a light-emitting apparatus according to the fourth aspect (Embodiment 11).

The light-emitting device 10000 may be covered, as shown in FIG. 55, with a coating 10500 formed of a light-transmissive inorganic compound, such as $SiO_2$, $Al_2O_3$, or $MSiO_3$ (M represents, for example, Zn, Ca, Mg, Ba, Sr, Zr, Y, Sn, or Pb). The coating 10500 may contain a phosphor (light-transforming member 10600). The light-transmissive material helps phosphor molecules combine to each other, so that the phosphor deposits to form a layer and adheres on the LED 10000 or the support 10400. The coating serves as an insulating protection layer coating the device structure 10000. Alternatively, a reflection layer (reflective metal layer, such as Al or Ag layer) may be provided as the coating. A DBR may be used as the reflection layer.

(Light-transforming Member 10600, Light-transforming Layer 23100)

A light-transforming member 10600 and a light-transforming layer 23100 in the light-emitting apparatus 20000 absorb part of the light from the light-emitting device 10000 and emit light having a different wavelength. A material containing a phosphor may be used as the light-transforming member or layer. The light-emitting transforming member 10600 and the light-transforming layer 23100 may be formed as the coating 10500 by coating the entirety or a part of the light-emitting device 100000, or by coating part of the multilayer board 10400 together with the light-emitting device. In the above-described first to third aspect, the light-transmissive member or layer may be formed not only in the light-transmissive protection layer coating the structured composite or the like, but also in an optical path running from the light-emitting device, for example, in a light-transmissive member (lens 24000 or filler). Binders of the phosphor include: oxides and hydroxide containing at least one element selected from the group consisting of Si, Al, Ga, Ti, Ge, P, B, Zr, Y, Sn, Pb, and alkaline-earth metals; and organic metal compounds (preferably containing oxygen) containing at least one element selected from the group consisting of Si, Al, Ga, Ti, Ge, P, B, Zr, Y, Sn, Pb, and alkaline-earth metals. The organic metal compounds include compounds having an alkyl group or an aryl group, such as metal alkoxides, metal diketonates, metal diketonate complexes, and metal carboxylates.

The light-transforming member or layer may be formed as part of a sealing member 23000 (24000) of the light-emitting apparatus 20000, or formed as an additional layer 23100 on a sealing member 23000a or between the sealing member 23000a and a sealing member 23000b, separate from the light-emitting device 10000, as shown in FIG. 56. The light-transforming member may be dispersed in the sealing member 23000, or the light-transforming layer 23100 may serve as the sealing member 23000. Also, the light-transforming member or layer may be formed in a layer sedimented in a apparatus base 22000, the mounting base 20100, or the housing recess 20200.

The phosphor used in the light-transforming member of the present invention transforms visible or ultraviolet light emitted from the light-emitting device into light having a different wavelength, and is excited by the light from the semiconductor luminescent layer of the device-structured composite 10100 to emit light. The phosphor may be excited by ultraviolet light or visible light to emit light having a predetermined color.

Exemplary phosphors include cadmium zinc sulfide activated by copper and yttrium aluminum garnet phosphors (hereinafter referred to as YAG phosphors) activated by cerium. For long-time use at a high luminance, $(Re_{1-x}Sm_x)_3(Al_{1-y}Ga_y)_5O_{12}$:Ce ($0 \leq x<1$, $0 \leq y \leq 1$, Re is at least one element selected from the group consisting of Y, Gd, and La) is particularly preferable. This phosphor is resistant to heat, light and water because of the garnet structure, and its excitation spectrum can have a peak at about 470 nm. Also, the peak luminescence can be observed at about 530 nm, and the luminescence spectrum can be so broad as to extend to 720 nm. In the present invention, the phosphor may be a mixture of at least two types of phosphor. For example, at least two $(Re_{1-x}Sm_x)_3(Al_{1-y}Ga_y)_5O_{12}$:Ce phosphors having different proportions of Al, Ga, Y, La, Gd, and Sm are compounded to increase the number of RGB wavelength components. For some semiconductor-light-emitting devices exhibiting variation in emission wavelength, at least two types of phosphor may be compounded to obtain desired white-mixed light. Specifically, by compounding phosphors having different chromaticities, with their amount adjusted according to the emission wavelength of the light-emitting device, light can be emitted at a desired point in a chromaticity diagram defined by the chromaticities of the phosphors and light-emitting device. At least two types of phosphor may be contained in a single coating 10500, light-transforming layer 22100, or light transforming member 10600, or a single phosphor or at least two types of phosphor may be contained in each layer of a double-layer coating. Thus, colors of light emitted from different types of phosphor are mixed to produce white light. In this instance, in order to sufficiently mix colors of light from phosphors and to reduce nonuniform browning, it is preferable that the average grain sizes and shaped of the phosphors are similar. An aluminum garnet phosphor, which is represented by YAG phosphors, may be combined with a phosphor capable of emitting red light, particularly a nitride phosphor. The YAG phosphor and the nitride phosphor may be mixed in a single-layer coating, or may be separately contained in respective layers of a multilayer coating. The phosphors will now be described in detail.

The aluminum garnet phosphor used in the present invention contains Al; at least one element selected from the group consisting of Y, Lu, Sc, La, Gd, Tb, Eu, and Sm; and one of Ga and In, and is activated by at least one element selected from the rare earth elements. This phosphor is excited by visible light or ultraviolet light emitted from an LED chip 10100 to emit light. Such phosphors include $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, and $Y_{2.90}Ce_{0.05}Pr_{0.05}Al_5O_{12}$ in addition to the above-cited YAG phosphors. Among these used in the present embodiment are at least two yttrium aluminum oxide phosphors having different compositions, containing Y, and activated by Ce or Pr.

By emitting on a display light generated by mixing blue light emitted from a light-emitting device including a luminescent layer made of a nitride compound semiconductor with green and red light emitted from a phosphor having a yellow body color for absorbing the blue light, or with yellow light tinged with green and red, a desired white luminescent color can appear on a display. In order to produce such a color mixture in the light-emitting apparatus, the powder or bulk of the phosphor may be contained in a resin, such as epoxy, acrylic, or silicone resin, or in a light-transmissive inorganic material, such as silicon oxide or aluminum oxide. The material containing the phosphor is formed to such a thickness as to transmit light from the LED chip in various shapes, such as dots or a film, according to how the phosphor is used. By adjusting the ratio of the phosphor to the light-transmissive inorganic material, the amount of phosphor application, or the phosphor content, and appropriately selecting emission wavelength, a desired color of light, including white can be produced.

Also, by arranging at least two types of phosphor separately for incident light from the light-emitting device, the resulting light-emitting apparatus can efficiently emit light. For example, a light-emitting device including a reflection member is provided thereon with a color-transforming member containing a phosphor absorbing long-wavelength light and emitting long-wavelength light and another color-transforming member containing a phosphor absorbing longer-wavelength light and emitting longer-wavelength light are layered one on top of the other, so that reflected light can be used effectively. Also, the peak luminescence λp is observed at about 510 nm, and the luminescence spectrum is so broad as to extend to about 700 nm. YAG phosphors capable of emitting red light, which are included in yttrium aluminum oxide phosphors activated by cerium, are also resistant to heat, light and water because of the garnet structure, and exhibits excitation and absorption spectra with a peak wavelength in the range of about 420 to 470 nm. Also, the peak luminescence λp is observed at about 600 nm, and the luminescence spectrum is so broad as to extend to about 750 nm.

By substituting Ga for part of the Al in an YAG phosphor having the garnet structure, the emission spectrum is shifted to the shorter wavelength side; by substituting Gd and/or La for part of the Y in the composition, the emission spectrum is shifted to the longer wavelength side. Thus, emission color can be continuously adjusted by changing the composition. For example, the intensity in the long wavelength region can be continuously changed depending on the Gd content. Thus, the YAG phosphor provides ideal conditions for transforming blue light emitted from nitride semiconductors into white light.

(Nitride Phosphor)

In the present invention, nitride phosphors may be used which contain N; at least one element selected from the group consisting of Be, Mg, Ca, Sr, Ba, and Zn; and at least one element selected from the group consisting of C, Si, Ge, Sn, Ti, Zr, and Hf, and which are activated by at least one element selected from the rare earth elements. The nitride phosphor used in the present invention absorbs visible light and ultraviolet light emitted from the LED chip 10100 and light emitted from the YAG phosphor to be excited, thus emitting light. Exemplarily nitride phosphors include Ca—Ge—N:Eu, Z; Sr—Ge—N:Eu, Z; Sr—Ca—Ge—N:Eu, Z; Ca—Ge—O—N:Eu, Z; Sr—Ge—O—N:Eu, Z; Sr—Ca—Ge—O—N:Eu, Z; Ba—Si—N:Eu, Z; Sr—Ba—Si—N:Eu, Z; Ba—Si—O—N:Eu, Z; Sr—Ba—Si—O—N:Eu, Z; Ca—Si—C—N:Eu, Z; Sr—Si—C—N:Eu, Z; Sr—Ca—Si—C—N:Eu, Z; Ca—Si—C—O—N:Eu, Z; Sr—Si—C—O—N:Eu, Z; Sr—Ca—Si—C—O—N:Eu, Z; Mg—Si—N:Eu, Z; Mg—Ca—Sr—Si—N:Eu, Z; Sr—Mg—Si—N:Eu, Z; Mg—Si—O—N:Eu, Z; Mg—Ca—Sr—Si—O—N:Eu, Z; Sr—Mg—Si—O—N:Eu, Z; Ca—Zn—Si—C—N:Eu, Z; Sr—Zn—Si—C—N:Eu, Z; Sr—Ca—Zn—Si—C—N:Eu, Z; Ca—Zn—Si—C—O—N:Eu, Z; Sr—Zn—Si—C—O—N:Eu, Z; Sr—Ca—Zn—Si—C—O—N:Eu, Z; Mg—Zn—Si—N:Eu, Z; Mg—Ca—Zn—Sr—Si—N:Eu, Z; Sr—Zn—Mg—Si—N:Eu, Z; Mg—Zn—Si—O—N:Eu, Z; Mg—Ca—Zn—Sr—Si—O—N:Eu, Z; Sr—Mg—Zn—Si—O—N:Eu, Z; Ca—Zn—Si—Sn—C—N:Eu, Z; Sr—Zn—Si—Sn—C—N:Eu, Z; Sr—Ca—Zn—Si—Sn—C—N:Eu, Z; Ca—Zn—Si—Sn—C—O—N:Eu, Z; Sr—Zn—Si—Sn—C—O—N:Eu, Z; Sr—Ca—Zn—Si—Sn—C—O—N:Eu, Z; Mg—Zn—Si—Sn—N:Eu, Z; Mg—Ca—Zn—Sr—Si—Sn—N:Eu, Z; Sr—Zn—Mg—Si—Sn—N:Eu, Z; Mg—Zn—Si—Sn—O—N:Eu, Z; Mg—Ca—Zn—Sr—Si—Sn—O—N:Eu, Z; and Sr—Mg—Zn—Si—Sn—O—N:Eu, Z. Z represents a rare earth element, and preferably contains at least one selected from the group consisting of Y, La, Ce, Pr, Nd, Gd, Tb, Dy, Ho, Er, and Lu. In addition, Sc, Sm, Tm, or Yb may be contained. These rare earth elements are present in an element, oxide, imide, or amide form in a mixture of materials. While most rare earth elements have trivalent electron configurations, Yb and Sm have divalent configurations, and Ce, Pr and Tb have tetravalent configurations. If an oxide of a rare earth metal is used, the oxygen affects the emission characteristics of the phosphor. Specifically, the presence of oxygen may undesirably degrade the luminance of emitted light, but reduces afterglow advantageously. In use of Mn, the grain size can be increased by the flux effect of Mn and O, and accordingly the emission luminance is enhanced. In the present invention, preferably, silicon nitride phosphors containing Mn are used, which include Sr—Ca—Si—N:Eu, Ca—Si—N:Eu, Sr—Si—N:Eu, Sr—Ca—Si—O—N:Eu, Ca—Si—O—N:Eu, and Sr—Si—O—N:Eu. Such phosphors are expressed by the general formula $L_XSi_YN_{(2/3X+4/3Y)}$:Eu or $L_XSi_YO_ZN_{(2/3X+4/3Y-2/3Z)}$:Eu (L represents Sr, Ca, or Sr and Ca). X and Y are arbitrarily selected, but preferably X=2 and Y=5 or X=1 and Y=7. Specifically, preferred phosphors include $(Sr_xCa_{1-x})_2Si_5N_8$:Eu, $Sr_2Si_5N_8$:Eu, $Ca_2Si_5N_8$:Eu, $Sr_xCa_{1-x}Si_7N_{10}$Eu, $SrSi_7N_{10}$:Eu, and $CaSi_7N_{10}$:Eu which contain Mn. These phosphors may further contain at least one selected from the group consisting of Mg, Sr, Ca, Zn, B, Al, Cu, Mn, Cr, and Ni. However, the present invention is not limited to the form of the present embodiment and examples.

L represents Sr, Ca, Sr, or Ca. The Sr content and the Ca content may be varied if necessary.

Use of Si in the phosphor composition can provide a highly crystalline, inexpensive phosphor. Europium Eu being a rare earth element is used in the center of emission. Europium is mainly divalent or trivalent. Examples of such a phosphor composition include, but not limited to, $Sr_2Si_5N_8$:Eu, Pr; $Ba_2Si_5N_8$:Eu, Pr; $Mg_2Si_5N_8$:Eu, Pr; $Zn_2Si_5N_8$:Eu, Pr; $SrSi_7N_{10}$:Eu, Pr; $BaSi_7N_{10}$:Eu, Ce; $MgSi_7N10$:Eu, Ce; $ZnSi_7N_{10}$:Eu, Ce; $Sr_2Ge_5N_8$:Eu, Ce; $Ba_2Ge_5N_8$:Eu, Pr; $Mg_2Ge5N8$:Eu, Pr; $Zn_2Ge5N8$:Eu, Pr; $SrGe_7N_{10}$:Eu, Ce; $BaGe_7N_{10}$:Eu, Pr; $MgGe_7N_{10}$:Eu, Pr; $ZnGe_7N_{10}$:Eu, Ce; $Sr_{1.8}Ca_{0.2}Si_5N_8$:Eu, Pr; $Ba_{1.8}Ca_{0.2}Si_5N_8$:Eu, Ce; $Mg_{1.8}Ca_{0.2}Si_5N_8$:Eu, Pr; $Zn_{1.8}Ca_{0.2}Si_5N_8$:Eu, Ce; $Sr_{0.8}Ca_{0.2}Si_7N_{10}$:Eu, La; $Ba_{0.8}Ca_{0.2}Si_7N_{10}$:Eu, La; $Mg_{0.8}Ca_{0.2}Si_7N_{10}$:Eu, Nd; $Zn_{0.8}Ca_{0.2}Si_7N_{10}$:Eu, Nd; $Sr_{0.8}Ca_{0.2}Ge_7N_{10}$:Eu, Tb; $Ba_{0.8}Ca_{0.2}Ge_7N_{10}$:Eu, Tb; $Mg_{0.8}Ca_{0.2}Ge_7N_{10}$: Eu, Pr; $Zn_{0.8}Ca_{0.2}Ge_7N_{10}$: Eu, Pr; $Sr_{0.8}Ca_{0.2}Si_6GeN_{10}$:Eu, Pr; $Ba_{0.8}Ca_{0.2}SiGeN_{10}$:Eu, Pr; $Mg_{0.8}Ca_{0.2}Si_6GeN_{10}$:Eu, Y; $Zn_{0.8}Ca_{0.2}Si_6GeN_{10}$:Eu, Y; $Sr_2Si_5N_8$:Pr; $Ba_2Si_5N_8$:Pr; $Sr_2Si_5N_8$:Tb; and $BaGe_7N_{10}$:Ce.

The nitride phosphor absorbs part of the blue light emitted from the LED chip 10000 and emits light in a region from yellow to red. By using the nitride phosphor together with the YAG phosphor in the above-described light-emitting apparatus 20000, blue light emitted from the LED chip 10000 is mixed with yellow to red light from the nitride phosphor. Thus, the light-emitting apparatus emits warm white light. In addition to the nitride phosphor, an yttrium aluminum oxide phosphor activated cerium is preferably added. By adding the yttrium aluminum oxide phosphor, a desired color can be prepared. The yttrium aluminum oxide phosphor activated cerium absorbs part of the blue light emitted from the LED chip 10100 and emits light in a yellow region. Then, the blue light emitted from the LED chip 10000 and the yellow light of the yttrium aluminum oxide phosphor are mixed to produce bluish white light. Hence, by mixing the yttrium aluminum oxide phosphor and a phosphor emitting red light into the light-transmissive coating 10500 so that light emitted from the LED chip is combined with blue light, the light-emitting apparatus can emit mixed white light. Particularly preferably, white light of the light-emitting apparatus has a chromaticity lying on the locus of blackbody radiation in the chromaticity diagram. In order to provide a light-emitting apparatus producing a desired color temperature, the amount of yttrium aluminum oxide phosphor and the amount of phosphor emitting red light may be appropriately adjusted. The special color rendering index R9 of the resulting light-emitting apparatus emitting mixed white light is improved. Known white light-emitting apparatuses including a combination of a known blue light-emitting device and a yttrium aluminum oxide phosphor activated by cerium has a special color rendering index R9 of about 0 at a color temperature Tcp of about 4600 K, and hence it does not ensure sufficient red components. Accordingly, to increase the special color rendering index R9 has been a challenge. In the present invention, a phosphor emitting red light is used in combination with the yttrium aluminum oxide phosphor, and thus the special color rendering index R9 can be increased to about 40 at a color temperature Tcp of about 4600 K.

(Light-Emitting Apparatus 20000)

FIG. 55 shows a light-emitting apparatus including the light-emitting device 10000 and composite 10300 mounted on the mounting base 20100 according to Embodiment 11 of the present invention. In the light-emitting apparatus 20000, a lead 21000 is fixed by an apparatus base 22000 so that one side of the lead serves as a mount lead or mounting base 20100. The light-emitting device 10000 (device composite 10400) is placed in the housing recess of the mounting base 20100, with a junction layer 11400 (adhesion layer 20400) between the device 10000 and the bottom surface of the housing recess. The sidewalls of the recess (and opening 22500) may be used as a reflector 20300, and the mounting base 20100 may have a function as a heat radiator and be connected to an external radiator. The opening 22500 of the apparatus base 20200 is formed in the light-extracting region 22300. The mounting base 20100 may have terraces 222000 for mounting other devices, such as a shielding device, in its outer regions. The recess 20200 and the opening of the apparatus base 22000 are closed with a light-transmissive sealing member 23000. In addition, a reflector 20300 is provided outside the recess. The lead electrode 21000 includes an internal lead 21100 in the base 22000 and an external lead 21200 extending to the outside of the base 22000, and connects to the outside. The light-emitting device 10000 (device composite 10300) is electrically connected to the leads 21000 with a wire 25000 and an electrical junction 20400.

Embodiment 11 is involved in the light-emitting apparatus 20000 in which the light-emitting device 10000 is mounted in the mounting base 21000 isolated from the lead 21000, using the adhesion member 20400, as shown in FIG. 55. The housing recess 20100 of the light-emitting device 10000 is provided with the reflector 20300, and may be connected to an external heat radiator to serves as a heat radiator 20500. The light-emitting device 10000 is electrically connected to the internal lead 21100 with a wire 25000, and the lead 21000 is extended to the outside to establish electrical connection. By separating the mounting base 20100 from the lead 21000, the light-emitting apparatus comes to ease of thermal design. The recess 20200, the reflector 22100 of the base 22000 (22000*a* and 22000*b*), and the terrace 22200 are sealed with the light-transmissive sealing member 23000 as sown in FIG. 56. By providing an optical lens to the sealing member 23000, or by forming the sealing member 23000 into a lens 24000, light emission having a desired directivity can be obtained.

The internal surfaces 22100 and 22200 of the recess of the package 22000 may be embossed to increase the adhesion area, or subjected to plasma treatment to enhance the adhesion to the molding member 23000. The sidewall of the recess of the package 22000 is preferably diverged in the open side tapered (tapered). Since such a shape allows light emitted from the light-emitting device to reflect from the sidewall of the recess to the front side of the package, the light-extraction efficiency can be increased. The package 22000 may be integrally formed together with the external electrode 21200, or a plurality of portions of the package 22000 may be assembled. The package 22000 is easily formed by, for example, insert molding. Exemplary materials of the package include resins, such as polycarbonate resin, polyphenylene sulfide (PPS), liquid crystal polymer (LCP), ABS resin, epoxy resin, phenol resin, acrylic resin, and PBT resin, ceramics, and metals. In use at high power of a light-emitting apparatus emitting light including ultraviolet light, it is expected that the ultraviolet light degrades the resin to discolor the resin color into yellow. Thus, the emission efficiency is reduced, and the mechanical strength of the resin is degraded to shorten the lifetime. It is therefore preferable that the package is made of a metal. A metal package is not degraded in contrast to the resin package even if the LED chip emitting light including ultraviolet light is used at high power.

Various types of colorant may be used to color the package 22000 dark. For example, $Cr_2O_8$, $MnO$, $Fe_2O_3$, and carbon black are suitable.

A thermosetting resin may be used for bonding the LED chip 10000 and the package 22000. Examples of such a resin include epoxy resin, acrylic resin, and imide resin. The external electrode 21200 is preferably formed by plating the surface of a copper or phosphor bronze plate with a metal, such as palladium or gold, or a solder. If the external electrode 21200 is disposed on an apparatus base 22000 made of glass epoxy resin or ceramic, a copper foil or a tungsten film may be used as the external electrode 21200.

The conductive wire 25000 has a diameter in the range of 10 to 70 μm. Examples of the conductive wire 25000 include gold, copper, platinum, and aluminum wires and their alloy wires. The conductive wire 25000 can easily establish connection between the electrode of the LED chip 10000 and the internal lead and mount lead, using a wire bonding apparatus.

In order to protect the LED chip 10000, the conductive wire 25000, and the coating 22100 or 10500 containing the phosphor, according to the applications of the light emitting apparatus, or in order to enhance the light-extraction efficiency, the molding member 23000 may be provided. The molding member 23000 is formed of a resin or glass. Preferred materials of the molding member 23000 include transparent weather-resistant resins and glass, such as epoxy resin, urea resin, silicone resin, and fluorocarbon resin. By mixing a diffusing agent into the molding member, the directivity of the LED chip 10000 can be reduced to increase the viewing angle. The molding member 23000 may be made of the same material as the binder of the coating layer or a different material.

If the LED chip 10000 is airtightly sealed together with nitrogen gas in a metal package, the molding member 23000 is not necessary. If an LED chip emitting ultraviolet light is used in the light-emitting device, an ultraviolet-resistant resin, such as fluorocarbon resin, may be used for the molding member.

For another form of the light-emitting apparatus 20000, a metal base 22000 is combined with a mounting base 20100 (recess 20200) or a mount lead provided on one side of the lead, and the light-emitting device 10000 (device composite 10300) is mounted in the mounting base or mount lead. The base 22000 is provided with an isolated lead 21000, and is airtightly sealed with a sealant or cap (made of, for example, a metal) having a window, with an inert gas, such as nitrogen, oxygen, or their mixture, filling the base. The light-emitting device 10000 may be directly placed in at least one recess 20200 in a metal substrate, and an optical member, such as a lens, may be provided over the corresponding recess.

A plurality of the light-emitting devices 10000 (device composites 10300) may be integrally mounted in a single housing 20200 (mounting base 20100), or a plurality of mounting bases (or a plurality housing 20200 in the base 2010), each having the light-emitting device 10000 (composite 10300) are provided in a single apparatus base 22000. Various modifications may be made according to required characteristics.

INDUSTRIAL APPLICABILITY

The semiconductor light-emitting device according to the present invention allows active and efficient light extraction in a desired direction. The light-emitting device exhibits high light-extraction efficiency and high power. The light-emitting apparatus including the light-emitting device also exhibits superior characteristics in, for example, power.

The invention claimed is:

1. A semiconductor light-emitting device comprising a structured portion including a first conductivity type layer; a second conductivity type layer; and a luminescent layer between the first and second conductivity type layers,
wherein an upper surface of the structured portion has a smaller width than a lower surface of the structured portion in sectional view, and the structured portion has inclined side surfaces, and
wherein the inclined side surfces of the structured portion are defined by first side surfaces and second side surfaces, a width of each of the first side surfaces increases from a lower surface side to an upper surface side, and a width of each of the second side surfaces increases from the upper surface side to the lower surface side.

2. The semiconductor light-emitting device according to claim 1, wherein the first side surfaces are formed in corners of the structured portion.

3. The semiconductor light-emitting device according to claim 1, wherein the luminescent layer is disposed inside the structured portion.

4. The semiconductor light-emitting device according to claim 1, wherein the lower surface has at least one of a square and a polygonal shape, and the first side surfaces are formed in corners of the structured portion.

5. The semiconductor light-emitting device according to claim 1, wherein the structured portion has a frustum shape.

6. The semiconductor light-emitting device according to claim 1, wherein the first side surfaces are curved to be convex outward.

7. The semiconductor light-emitting device according to claim 1, wherein the first side surfaces define rounded sides of the lower surface and the upper surface, and a curvature radius of the rounded sides of the upper surface is larger than that of the lower surface.

8. The light-emitting device according to claim 1, further including an electrode structure, wherein the light-emitting device has a plurality of the structured portions, and the electrode structure is provided so that the structured portions substantially simultaneously emit light.

9. The light-emitting device according to claim 1, further comprising a pair of a positive electrode and a negative electrode on a same surface side over the upper surface of the structured portion.

10. The light-emitting device according to claim 9, wherein one of the pair of electrodes covers part of the inclined side surfaces of the structured portion.

11. The light-emitting device according to claim 1, wherein the light-emitting device has a plurality of the structured portions separately disposed on a substrate, and further includes electrodes disposed so that the structured portions substantially simultaneously emit light.

12. The light-emitting device according to claim 9, wherein the upper surface of the structured portion defines a mounting surface which opposes a mounting base when the light-emitting device is disposed on the mounting base, and wherein one of the pair of electrodes is disposed on a substrate, and another electrode comprises an interconnect portion disposed on a mounting base side so as to be connected to upper surfaces of a plurality of structured portions.

13. The light-emitting device according to claim 1, further comprising a pair of electrodes disposed separately on the upper surface side of the structured portion and on the lower surface side, wherein the pair of electrodes are respectively disposed on a surface of the first conductivity type layer and a surface of the second conductivity type layer.

14. The light-emitting device according to claim 13, further comprising a light-transmissive insulating layer covering the inclined side surfaces of the structured portion; and a filling member around the inclined side surfaces with the light-transmissive insulating layer therebetween.

15. The light-emitting device according to claim 13, wherein the light-emitting device has a plurality of the structured portions, and the structured portions are separated from one another by a protruding filling member.

16. The light-emitting device according to claim 14, wherein the luminescent layer is disposed inside the structured portion, and the filling member protrudes below the luminescent layer toward the lower surface side of the structured portion.

17. A light-emitting apparatus comprising: a light-emitting device comprising a structured portion including a first conductivity type layer; a second conductivity type layer; and a luminescent layer between the first and second conductivity type layers,
wherein an upper surface of the structured portion has a smaller width than a lower surface of the structured portion in sectional view, and the structured portion has inclined side surfaces, and
wherein the inclined side surfaces of the structured portion are defined by first side surfaces second side surfaces, a width of each of the first side surfaces increases from a lower surface side an upper surface side, and to a width of each of the second side surfaces increases from the upper surface side to the lower surface side, and
a mounting portion on which the light-emitting device is placed, wherein the light emitting device is mounted on a support and then placed on the mounting portion.

18. The light-emitting apparatus according to claim 17, further comprising a light-transforming member for transforming part of light emitted from the light-emitting device into light having a different wavelength.

19. The light-emitting apparatus according to claim 18, wherein the light-transforming member comprises an aluminum garnet phosphor containing Al; at least one element selected from the group consisting of Y, Lu, Sc, La, Gd, Tb, Eu, and Sm; one of Ga and In, and at least one element selected from the rare earth elements.

20. The light-emitting apparatus according to claim 18, wherein the light-transforming member comprises a phosphor expressed by $(Re_{1-x}R_x)_3(Al_{1-y}Ga_y)_5O_{12}$ ($0<x<1$ and $0 \leq y \leq 1$, wherein Re represents at least one element selected from the group consisting of Y, Gd, La, Lu, Tb, and Sm; and R represents Ce or Ce and Pr).

21. The light-emitting apparatus according to claim 18, wherein the light-transforming member comprises a nitride phosphor containing N; at least one element selected from the group consisting of Be, Mg, Ca, Sr, Ba, and Zn; and at least one element selected from the group consisting of C, Si, Ge, Sn, Ti, Zr, and Hf, and is activated by at least one element selected from the rear earth elements.

22. The light-emitting apparatus according to claim 18, wherein the nitride phosphor is expressed by the general formula $L_XSi_YN_{(2/3X+4/3Y)}$:Eu or $L_XSi_YO_ZN_{(2/3X+4/3Y-2/3Z)}$:Eu (L represents Sr, Ca, or Sr and Ca).

* * * * *